United States Patent
Tran et al.

(10) Patent No.: US 7,035,151 B2
(45) Date of Patent: Apr. 25, 2006

(54) ARRAY ARCHITECTURE AND OPERATING METHODS FOR DIGITAL MULTILEVEL NONVOLATILE MEMORY INTEGRATED CIRCUIT SYSTEM

(75) Inventors: Hieu Van Tran, San Jose, CA (US); Sakhawat M. Khan, Sunnyvale, CA (US); George J. Korsh, Redwood City, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 10 days.

(21) Appl. No.: 10/868,614

(22) Filed: Jun. 14, 2004

(65) Prior Publication Data

US 2004/0233716 A1 Nov. 25, 2004

Related U.S. Application Data

(62) Division of application No. 09/929,542, filed on Aug. 13, 2001, now Pat. No. 6,751,118, which is a division of application No. 09/231,928, filed on Jan. 14, 1999, now Pat. No. 6,282,145.

(51) Int. Cl.
*G11C 8/00* (2006.01)
(52) U.S. Cl. .............. 365/200; 365/185.2; 365/185.22; 365/185.29; 365/210; 365/230.03
(58) Field of Classification Search ................ 365/200, 365/230.03, 210, 185.2, 185.22, 185.29
See application file for complete search history.

(56) References Cited

U.S. PATENT DOCUMENTS

| | | | | | |
|---|---|---|---|---|---|
| 5,083,294 | A | * | 1/1992 | Okajima | 365/200 |
| 5,450,360 | A | * | 9/1995 | Sato | 365/200 |
| 5,914,907 | A | * | 6/1999 | Kobayashi et al. | 365/230.03 |
| 5,930,169 | A | * | 7/1999 | Iwata et al. | 365/185.09 |

* cited by examiner

*Primary Examiner*—Son T. Dinh
(74) *Attorney, Agent, or Firm*—DLA Piper Rudnick Gray Cary US LLP

(57) ABSTRACT

Memory array architectures and operating methods suitable for super high density in the giga bits for multilevel nonvolatile memory integrated circuit system. The array architectures and operating methods include: (1) an Inhibit and Select Segmentation Scheme; (2) a Multilevel Memory Decoding Scheme that includes a Power Supply Decoded Decoding Scheme, a Feedthrough-to-Memory Decoding Scheme, a Feedthrough-to-Driver Decoding Scheme, and a Winner-Take-All Kelvin Memory Decoding Scheme; (3) a constant-total-current-program scheme; (4) includes fast-slow and 2-step ramp rate control programming; and a reference system method and apparatus, which includes a Positional Linear Reference System, a Positional Geometric Reference System, and a Geometric Compensation Reference System. The apparatus and method enable multilevel programming, reading, and margining.

18 Claims, 47 Drawing Sheets

BLOCK DIAGRAM OF SUPER HIGH DENSITY DIGITAL MULTILEVEL NON-VOLATILE MEMORY I.C. SYSTEM.

SOURCE SIDE INJECTION FLASH MEMORY CELL: CROSS SECTION ALONG THE BIT LINE

BLOCK DIAGRAM OF A NONVOLATILE MULTILEVEL MEMORY SYSTEM

BLOCK DIAGRAM OF AN ELECTRONIC CAMERA SYSTEM

BLOCK DIAGRAM OF AN ELECTRONIC AUDIO SYSTEM

BLOCK DIAGRAM OF SUPER HIGH DENSITY DIGITAL MULTILEVEL NON-VOLATILE MEMORY I.C. SYSTEM.

VOLTAGE MODE SENSING

BLOCK DIAGRAM OF SUPER HIGH DENSITY DIGITAL MULTILEVEL NON-VOLATILE MEMORY ARRAY ARCHITECTURE

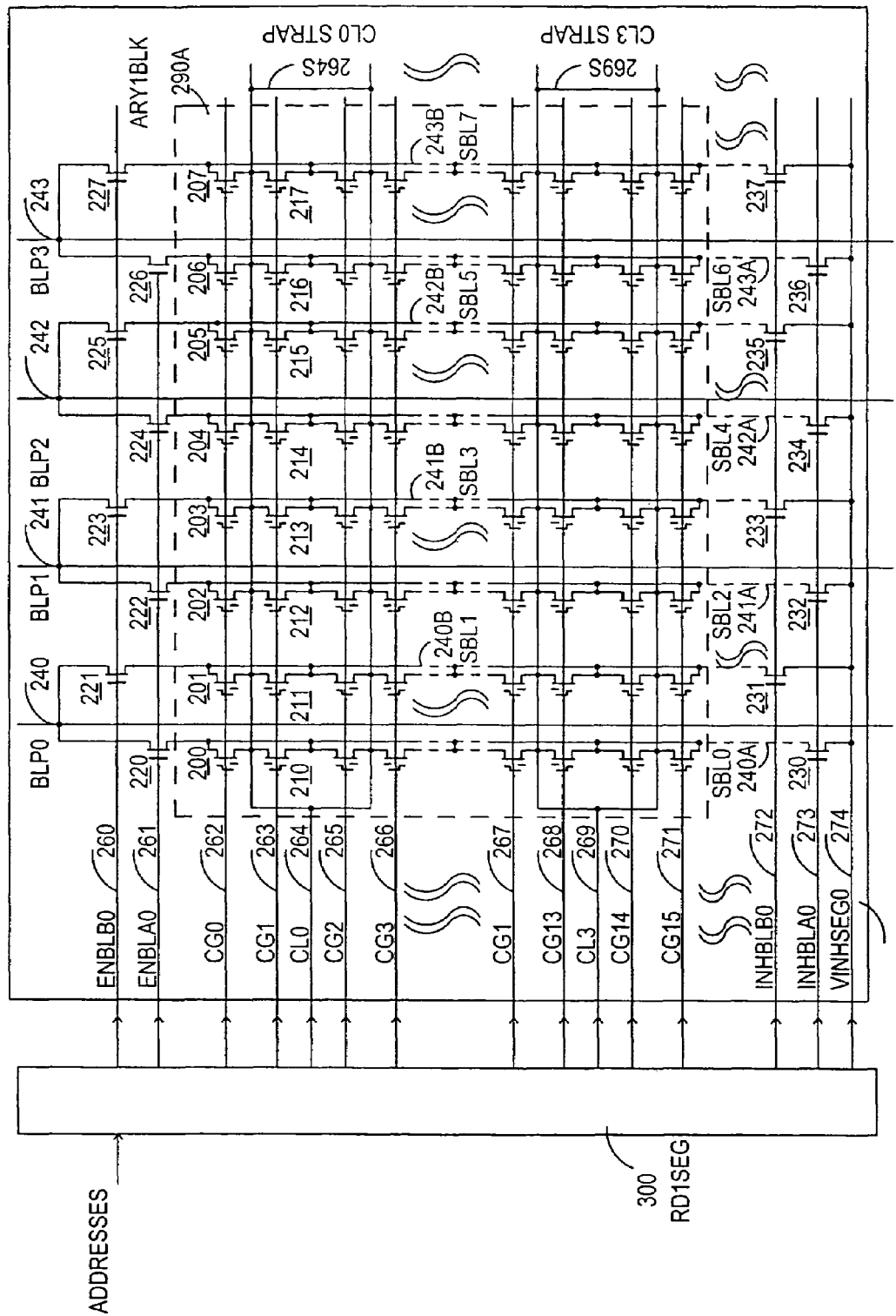
FIGURE 4A       INHIBIT AND SELECT SCHEME

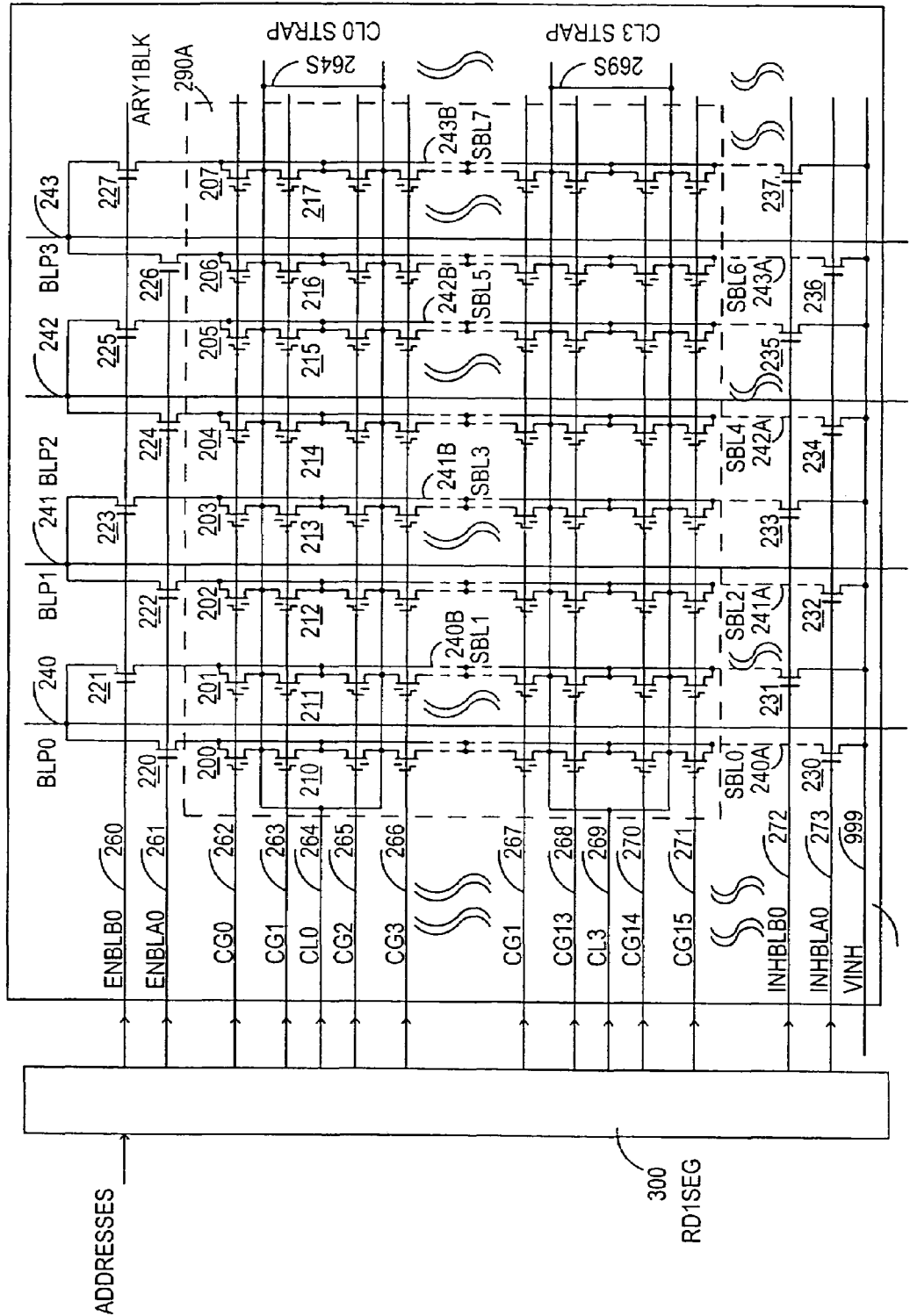
FIGURE 4C    INHIBIT AND SELECT SCHEME

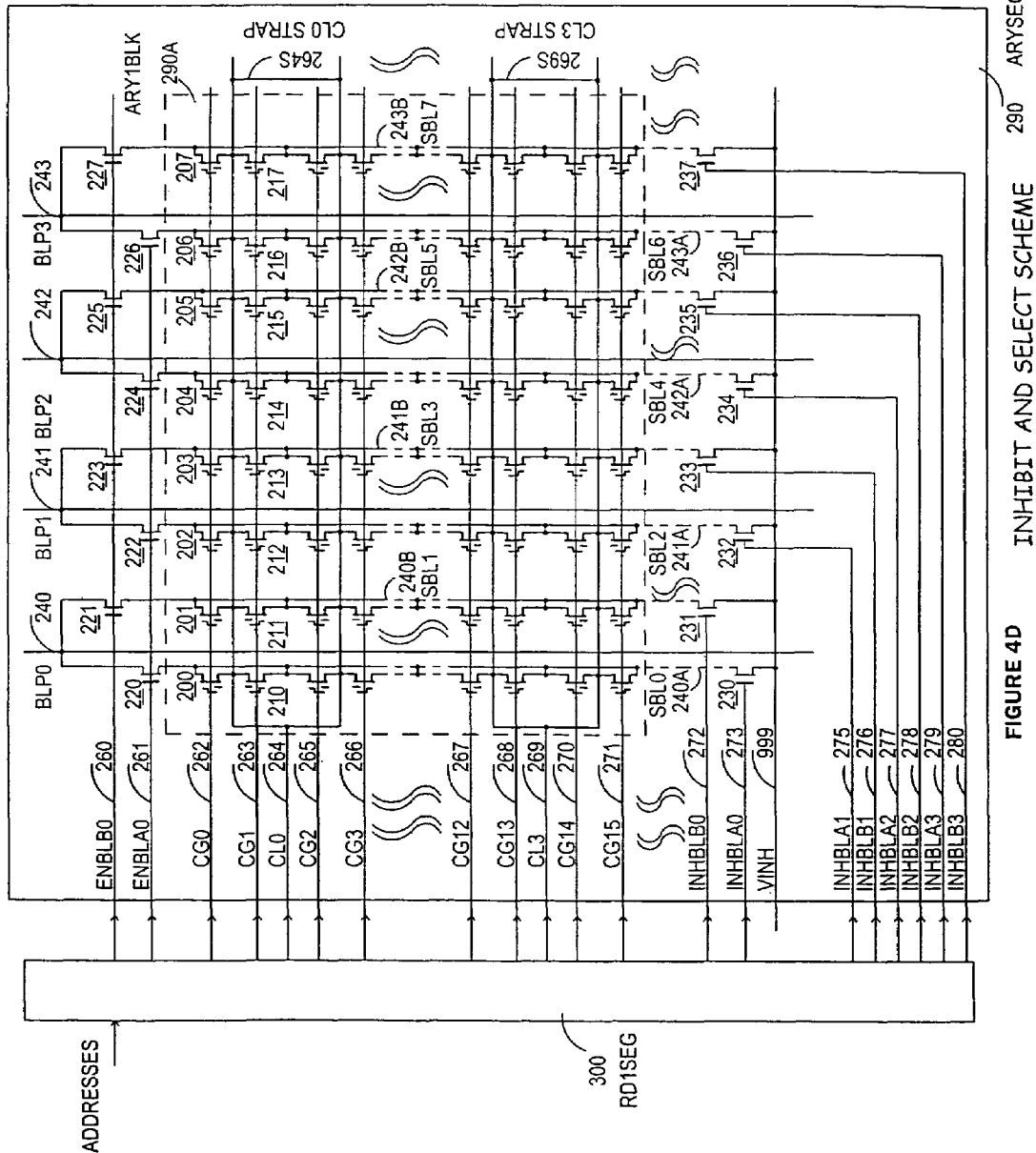
FIGURE 4D    INHIBIT AND SELECT SCHEME

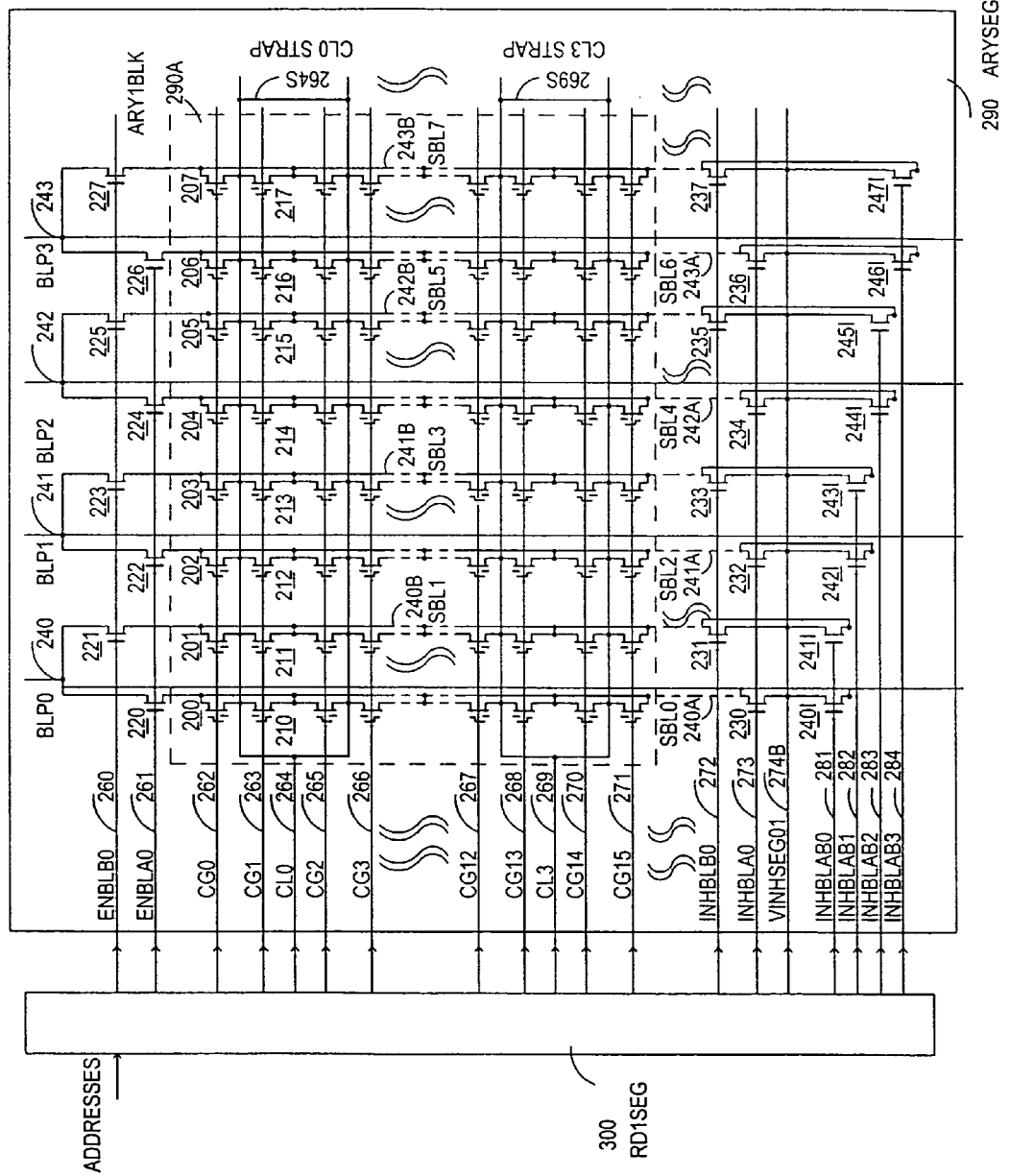
FIGURE 4E  INHIBIT AND SELECT SCHEME

CROSS SECTION OF INHIBIT AND SELECT SEGMENTATION INTERCONNECT

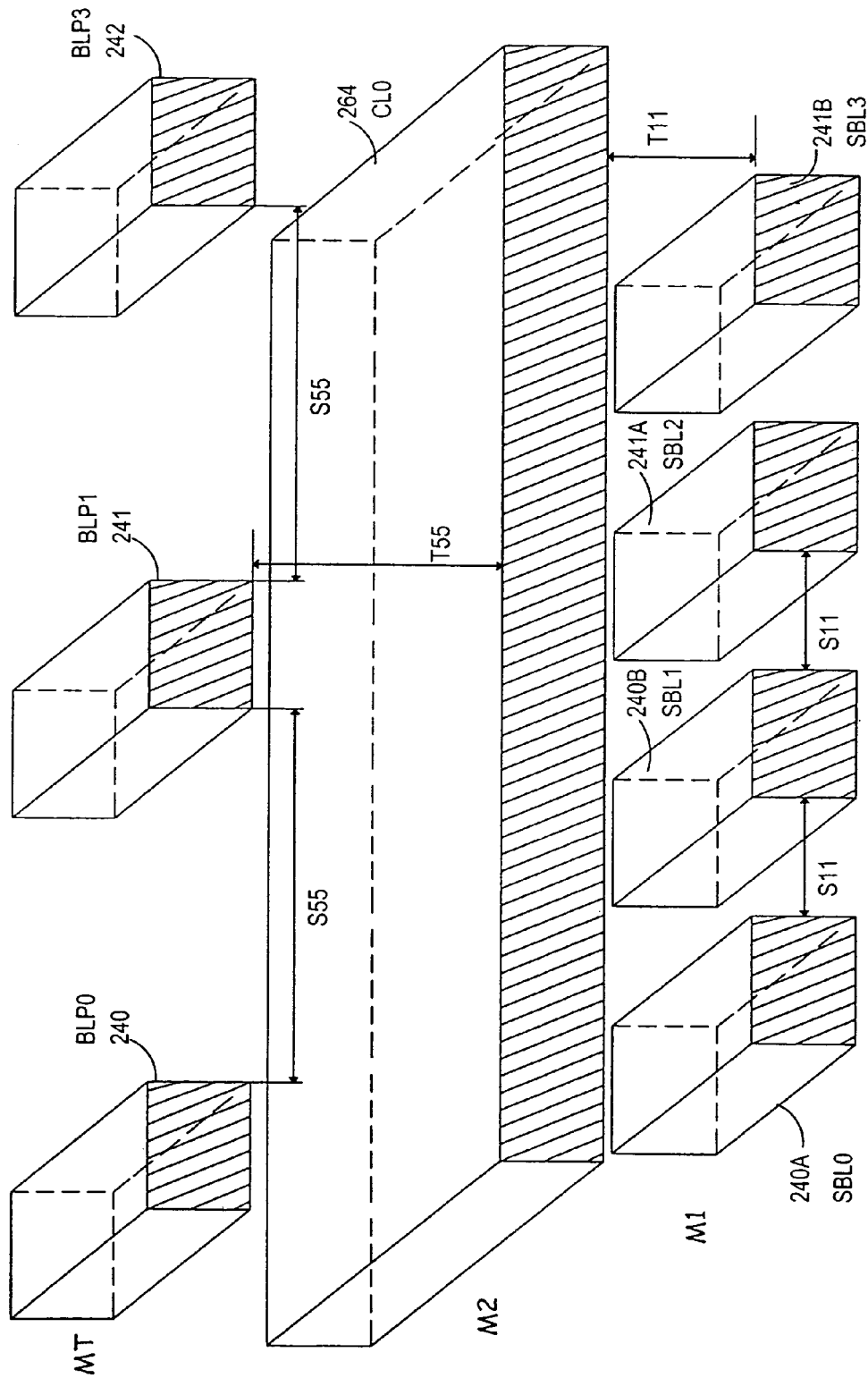

BLOCK DIAGRAM OF MULTILEVEL MEMORY DECODING

ONE SEGMENT DECODER

INHIBIT DECODER FOR MULTILEVEL MEMORY DECODING

FEEDTHROUGH-to-MEMORY and FEEDTHROUGH-to-DRIVER MULTILEVEL MEMORY DECODING

BLOCK DIAGRAM OF REFERENCE SYSTEM FOR SUPER HIGH DENSITY DIGITAL MULTILEVEL NON-VOLATILE MEMORY

BLOCK DIAGRAM OF REFERENCE SYSTEM FOR SUPER HIGH DENSITY DIGITAL MULTILEVEL NON-VOLATILE MEMORY

REFERENCE DETECTION

POSITIONAL REFERENCE SYSTEM: LINEAR

POSITIONAL REFERENCE SYSTEM: GEOMETRIC

REFERENCE SYSTEM: GEOMETRIC COMPENSATION

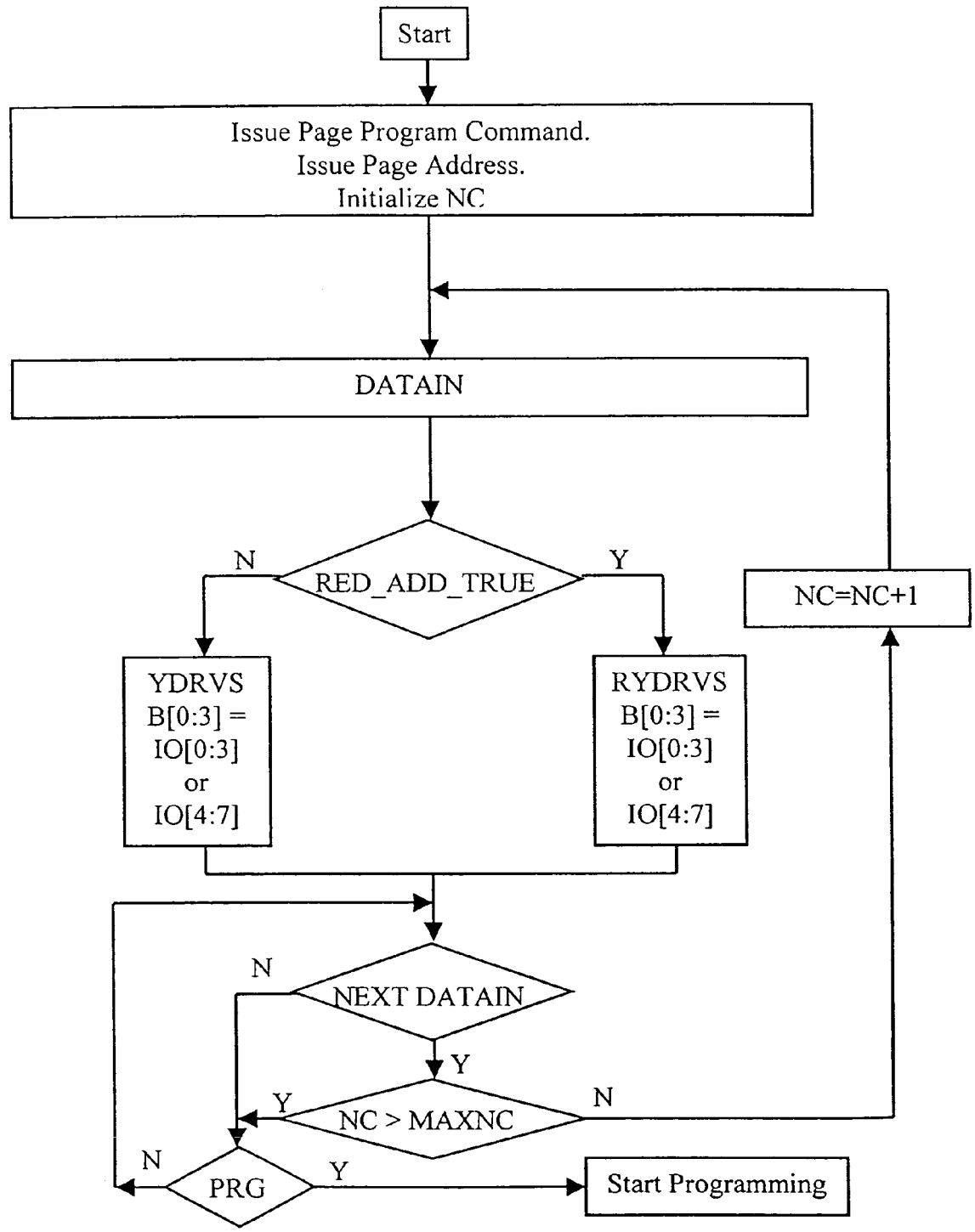
FIG._20

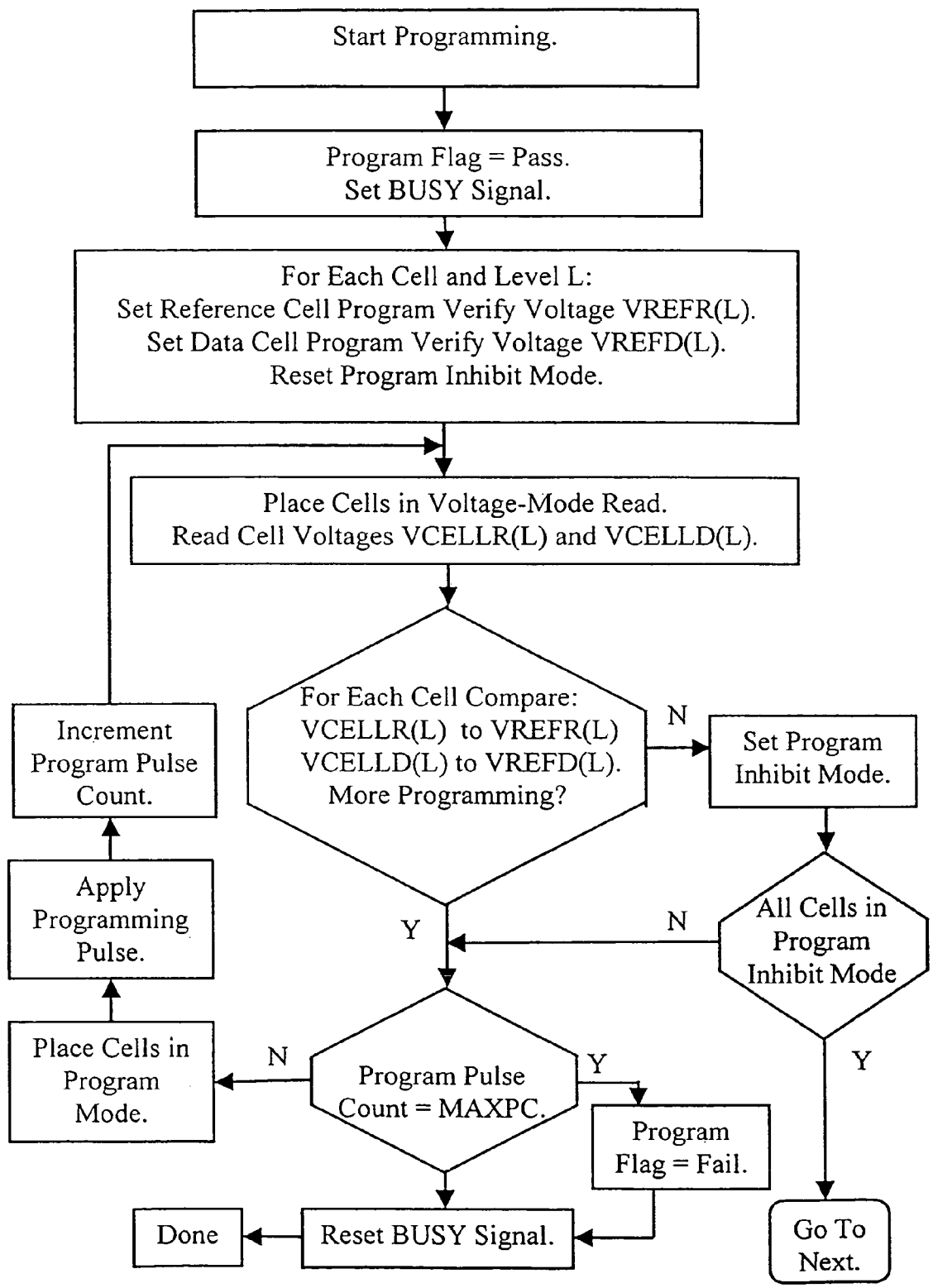
FIG._21

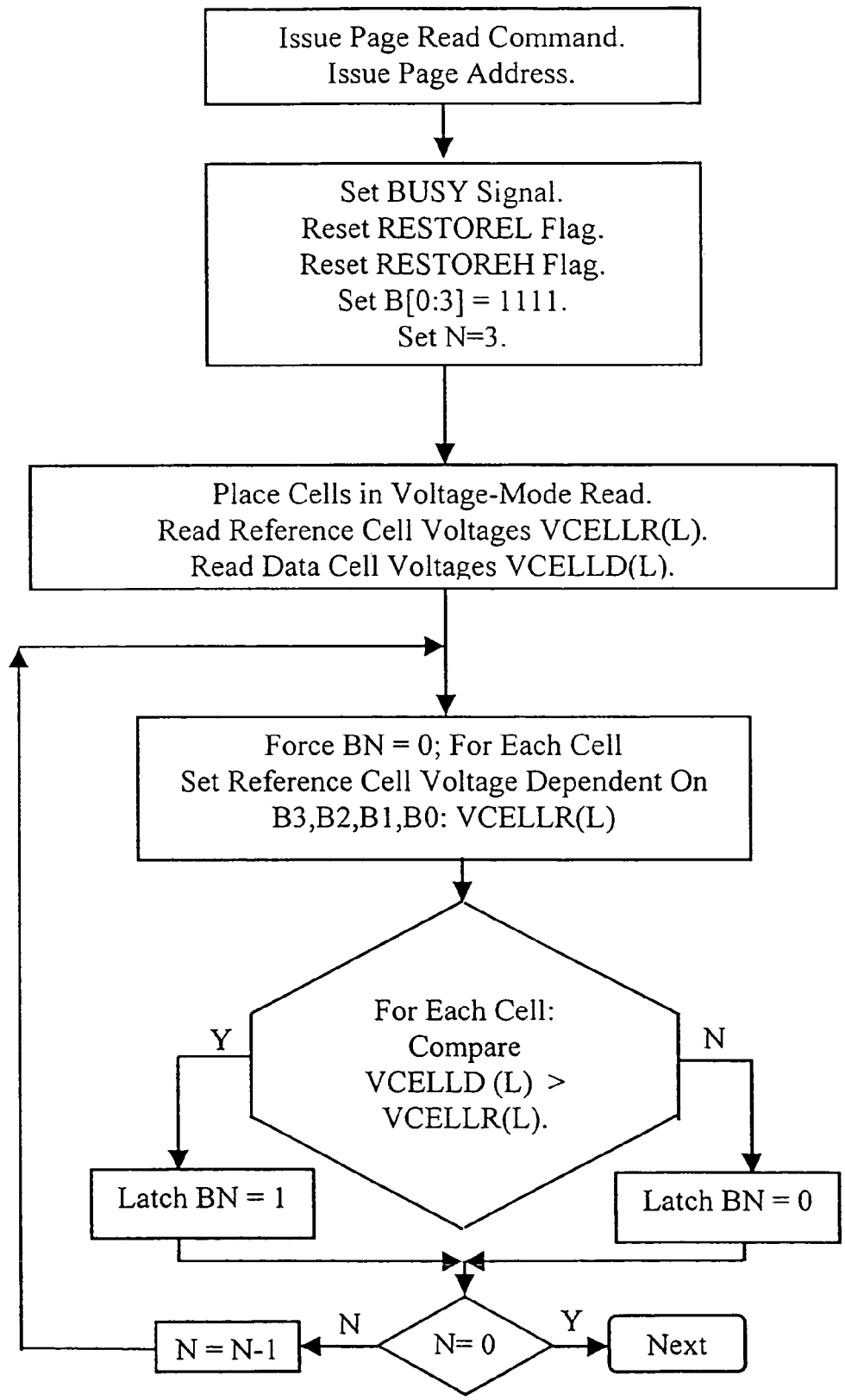
FIG._23

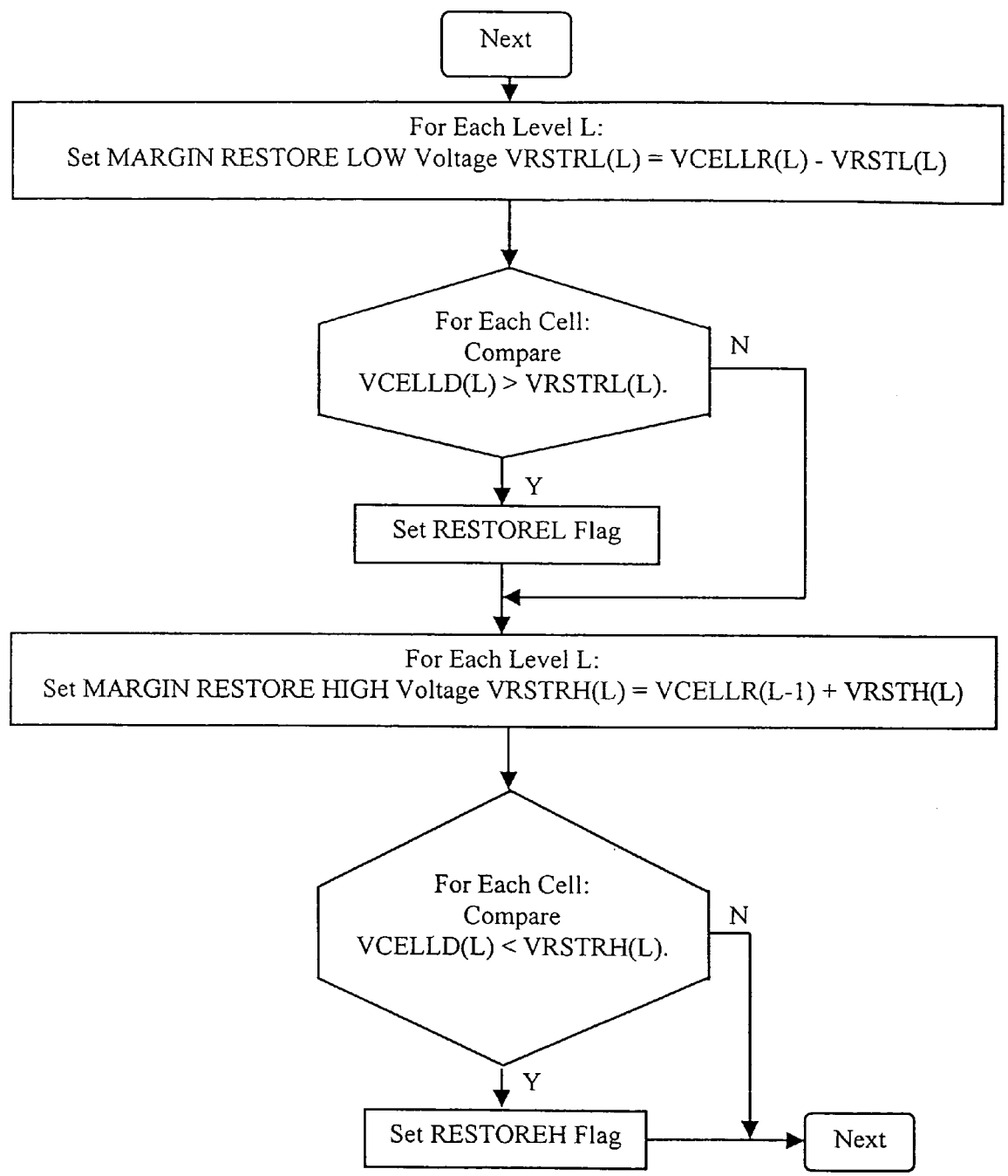
FIG._24

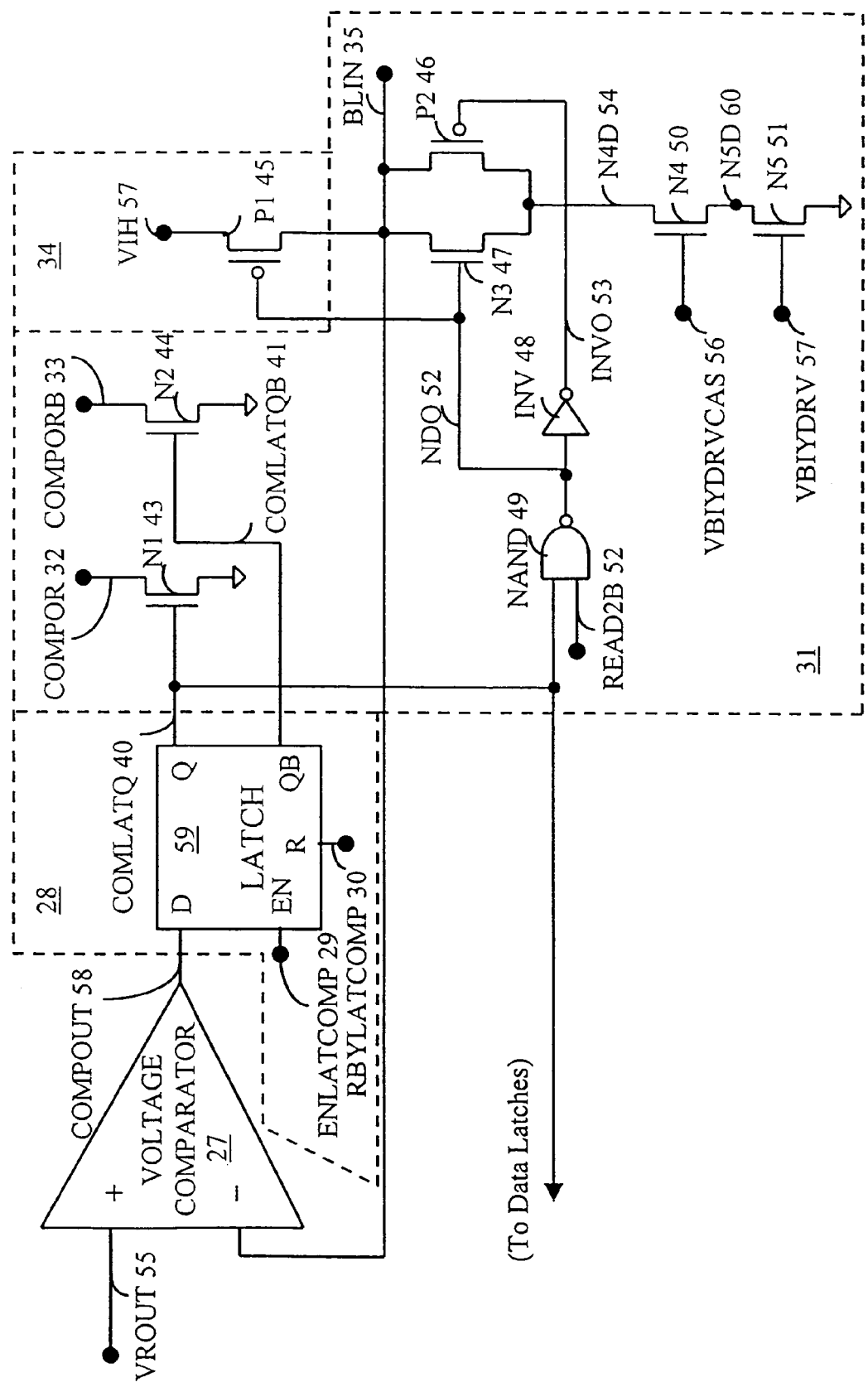
Fig._27

ARRAY ARCHITECTURE AND OPERATING METHODS FOR DIGITAL MULTILEVEL NONVOLATILE MEMORY INTEGRATED CIRCUIT SYSTEM

CROSS-REFERENCE TO RELATED APPLICATIONS

This application is a divisional application of U.S. patent application Ser. No. 09/929,542 filed on Aug. 13, 2001, which is a divisional of U.S. patent application Ser. No. 09/23 1,928 filed on Jan. 14, 1999 which issued on Aug. 28, 2001 as U.S. Pat. No. 6,282,145, the subject matter of each of these applications is incorporated herein by reference.

FIELD OF THE INVENTION

This invention relates in general to semiconductor memories and, in particular, to the design and operation of multilevel nonvolatile semiconductor memories.

BACKGROUND OF THE INVENTION

As the information technology progresses, the demand for high density giga bit and tera bit memory integrated circuits is insatiable in emerging applications such as data storage for photo quality digital film in multi-mega pixel digital camera, CD quality audio storage in audio silicon recorder, portable data storage for instrumentation and portable personal computers, voice, data, and video storage for wireless and wired phones and other personal communicating assistants.

The nonvolatile memory technology such as ROM (Read Only Memory), EEPROM (Electrical Erasable Programmable Read Only Memory), or FLASH is often a technology of choice for these application due to its nonvolatile nature, meaning it still retains the data even if the power supplied to it is removed. This is in contrast with the volatile memory technology such as DRAM (Dynamic Random Access Memory), which loses data if the power supplied to it is removed. This nonvolatile feature is very useful in saving the power from portable supplies such as batteries. Until battery technology advances drastically to ensure typical electronic systems to function for a typical operating lifetime, e.g., 10 years, the nonvolatile technology will fill the needs for most portable applications.

The FLASH technology, due to its smallest cell size, is the highest density nonvolatile memory system currently available. The advance of the memory density is made possible by rapidly advancing the process technology into the realm of nano meter scale and possibly into the atomic scale and electron scale into the next century. At the present sub-micro meter scale, the other method that makes the super high-density memory system possible is through the exploitation of the analog nature of a storage element.

The analog nature of a flash or nonvolatile storage element provides, by theory, an enormous capability to store information. For example, if one electron could represent one bit of information then, for one typical conventional digital memory cell, the amount of information is equal to the number of electrons stored, or approximately a few hundred thousands. Advances in device physics exploring the quantum mechanical nature of the electronic structure will multiply the analog information manifested in the quantum information of a single electron even further.

The storage information in a storage element is hereby defined as a discrete number of storage levels for binary digital signal processing with the number of storage levels equal to $2_N$ with N equal to the number of digital binary bits. The optimum practical number of discrete levels stored in a nonvolatile storage element depends on the innovative circuit design method and apparatus, the intrinsic and extrinsic behavior of the storage element, all within constraints of a definite performance target such as product speed and operating lifetime within a certain cost penalty.

At the current state of the art, all the multilevel systems are only suitable for medium density, i.e. less than a few tens of mega bits, and only suitable for a small number of storage levels per cell, i.e., less than four levels or two digital bits.

As can be seen, memories having high storage capacity and fast operating speed are highly desirable.

SUMMARY OF THE INVENTION

This invention describes the design method and apparatus for a super high density nonvolatile memory system capable of giga bits as applied to the array architecture, reference system, and decoding schemes to realize the optimum possible number of storage levels within specified performance constraints. Method and apparatus for multilevel program and sensing algorithm and system applied to flash memory is also described in this invention. Details of the invention and alternative embodiments will be made apparent by the following descriptions.

The invention provides array architectures and operating methods suitable for a super high density, in the giga bits, for multilevel nonvolatile "green" memory integrated circuit system. "Green" refers to a system working in an efficient and low power consumption manner. The invention solves the issues associated with super high density multilevel memory system, such as, precision voltage control in the array, severe capacitive loading from MOS transistor gates and parasitics, high leakage current due to memory cells and from cells to cells, excessive power consumption due to large number of gates and parasitics, and excessive memory cell disturbs due to large memory density.

An aspect of the invention provides an Inhibit and Select Segmentation Scheme that makes use of a truly-floating-bitline scheme to greatly reduce the capacitance from junctions and parasitic interconnects to a small value. The invention also provides a Multilevel Memory Decoding scheme which is capable of greater than 10-bit multilevel operation. The Multilevel Memory Decoding Scheme includes the Power Supply Decoded Decoding Scheme, the Feedthrough-to-Memory Decoding Scheme, and the Feedthrough-to-Driver Decoding Scheme. The Multilevel Memory Decoding scheme also includes a "winner-take-all" Kelvin Decoding Scheme, which provides precise bias levels for the memory at a minimum cost. The invention also provides a constant-total-current-program scheme. The invention also provides fast-slow and 2-step ramp rate control programming. The invention also presents reference system method and apparatus, which includes the Positional Linear Reference System, Positional Geometric Reference System, and the Geometric Compensation Reference System. The invention also describes apparatus and method of multilevel programming, reading, and margining.

Method and apparatus described herein are applicable to digital multilevel as well as analog multilevel system.

The foregoing, together with other aspects of this invention, will become more apparent when referring to the following specification, claims, and accompanying drawings.

BRIEF DESCRIPTION OF THE DRAWINGS

FIG. 4A is one embodiment of a nonvolatile multilevel array unit of inhibit and select segmentation.

FIG. 4C shows another alternate embodiment of the inhibit and select segmentation scheme.

FIG. 4D shows another alternate embodiment of the inhibit and select segmentation scheme.

FIG. 4E shows another alternate embodiment of the inhibit and select segmentation scheme.

FIG. 5B is a cross section of another embodiment of inhibit and select segmentation interconnection.

FIG. 20 shows an embodiment of flow diagram of the page programming cycle.

FIG. 21 shows an embodiment of flow diagram after page programming begins.

FIG. 23 shows an embodiment of flow diagram of the page read cycle.

FIG. 24 shows a continuation of flow diagram of the page read cycle in FIG. 23.

FIG. 27 shows details of a latch block, a program/read control block, and program/program inhibit block included in the single y-driver YDRVS 110S.

DESCRIPTION OF THE SPECIFIC EMBODIMENTS

Memory Cell Technology

To facilitate the understanding of the invention, a brief description of a memory cell technology is described below. In an embodiment the invention applies to Source Side Injection (SSI) flash memory cell technology, which will be referred to as SSI flash memory cell technology. The invention is equally applicable to other technologies such as drain-side channel hot electron (CHE) programming (ETOX), P-channel hot electron programming, other-hot electron programming schemes, Fowler-Nordheim (FN) tunneling, ferro-electric memory, and other types of memory technology.

Figure 1B:
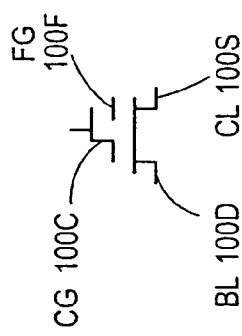
FIG. 1B is a transistor symbol corresponding to the source side injection flash memory cell shown in FIG. 1A.
Figure 1A:
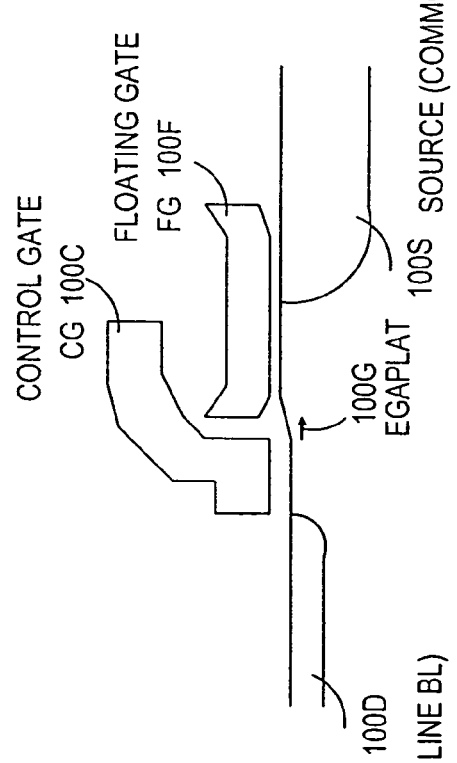
FIG. 1A is a cross section of a source side injection flash memory cell.

A cell structure of one typical SSI flash cell is symbolically shown in FIG. 1A. Its corresponding transistor symbol is shown in FIG. 1B. The cell is made of two polysilicon gates (abbreviated as poly), a floating gate poly FG 100F and a control gate poly CG 100C. The control gate CG 100C also acts as a select gate that individually select each memory cell. This has the advantage of avoiding the over erase problem which is typical of stacked gate CHE flash cell. The floating gate has a poly tip structure that points to the CG 100C, this is to enhance the electric field from the FG 100F to the CG 100C which allows a much lower voltage in FN erase without using a thin interpoly oxide. The thicker interpoly oxide leads to a higher reliability memory cell. The cell is also fabricated such that a major portion of the FG 100F overlaps the source junction 100S. This is to make a very high coupling ratio from the source 100S to FG 100F, which allows a lower erase voltage and is advantageous to the SSI programming which will be described shortly. A structural gap between the FG 100F and 100C CG is also advantageous for the efficient SSI programming.

The SSI flash memory cell enables low voltage and low power performance due to its intrinsic device physics resulting from its device structure. The SSI flash cell uses efficient FN tunneling for erase and efficient SSI for programming. The SSI flash cell programming requires a small current in hundreds of nano amps and a moderate voltage range of ~8 to 11 volts. This is in contrast to that of a typical drain-side channel hot electron memory cell programming which requires current in hundreds of microamp to milliamp range and a voltage in the range of 11 to 13 volts.

The SSI flash memory cell erases by utilizing Fowler-Nordheim tunneling from the floating gate poly to the control gate poly by applying a high erase voltage on the control gate CG 100C, e.g., 8–13 volts, and a low voltage on the source 100S, e.g., 0–0.5 volts. The high erase voltage together with high coupling from the source to the floating gate creates a localized high electric field from the FG 100F tip to the CG 100C and causes electrons to tunnel from the FG 100F to the CG 100C near the tip region. The resulting effect causes a net positive charge on the FG 100F.

The SSI flash memory cell programs by applying a high voltage on the source 100S (herein also known as common line CL), e.g., 4–13 V, a low voltage on the CG 100C, e.g., 0.7–2.5 V, and a low voltage on the drain 100D (herein also known as the bitline BL), e.g., 0–1V. The high voltage on the source 100S strongly couples to the FG to strongly turn on the channel under the FG (it will be equivalently referred to as the FG channel). This in turn couples the high voltage on the source 100S toward the gap region. The voltage on the CG 100C turns on the channel directly under the CG 100C (it will be equivalently referred to as the CG channel). This in turn couples the voltage on the drain 100D toward the gap region. Hence the electrons flow from the drain junction 100D through the CG channel, through the gap channel, through the FG channel, and finally arrive at the source junction.

Due to the gap structure between the CG 100C and the FG 100F, in the channel under the gap, there exists a strong lateral electric field EGAPLAT 100G. As the EGAPLAT 100G reaches a critical field, electrons flowing across the gap channel become hot electrons. A portion of these hot electrons gains enough energy to cross the interface between the silicon and silicon dioxide into the silicon dioxide. And as the vertical field Ev is very favorable for electrons to move from the channel to the FG 100F, many of these hot electrons are swept toward the FG 100F, thus, reducing the voltage on the FG 100F. The reduced voltage on FG 100F reduces electrons flowing into the FG 100F as programming proceeds.

Due to the coincidence of favorable Ev and high EGAPLAT 100G in the gap region, the SSI memory cell programming is more efficient over that of the drain-side CHE programming, which only favors one field over the other. Programming efficiency is measured by how many electrons flow into the floating gate as a portion of the current flowing in the channel. High programming efficiency allows reduced power consumption and parallel programming of multiple cells in a page mode operation.

Multilevel Memory Integrated Circuit System:

The challenges associated with putting together a billion transistors on a single chip without sacrificing performance or cost are tremendous. The challenges associated with designing consistent and reliable multilevel performance for a billion transistors on a single chip without sacrificing performance or cost is significantly more difficult. The approach taken here is based on the modularization concept. Basically everything begins with a manageable optimized basic unitary block. Putting appropriate optimized unitary blocks together makes the next bigger optimized block.

A super high density nonvolatile multilevel memory integrated circuit system herein described is used to achieve the performance targets of read speed, write speed, and an operating lifetime with low cost. Read speed refers to how fast data could be extracted from a multilevel memory integrated circuit system and made available for external use such as for the system microcontroller 2001 shown in FIG. 1C which is described later. Write speed refers to how fast external data could be written into a multilevel memory integrated circuit system. Operating-lifetime refers to how long a multilevel memory integrated circuit system could be used in the field reliably without losing data.

Speed is modularized based on the following concept, $T=CV/I$, where switching time T is proportional to capacitance C multiplied by the voltage swing V divided by the operating current I. Methods and apparatuses are provided by the invention to optimize C, V, and I to achieve the required specifications of speed, power, and optimal cost to produce a high performance high-density multilevel memory integrated circuit system. The invention described herein makes the capacitance independent of memory integrated circuit density, to the first order, and uses the necessary operating voltages and currents in an optimal manner.

Figure 1C:
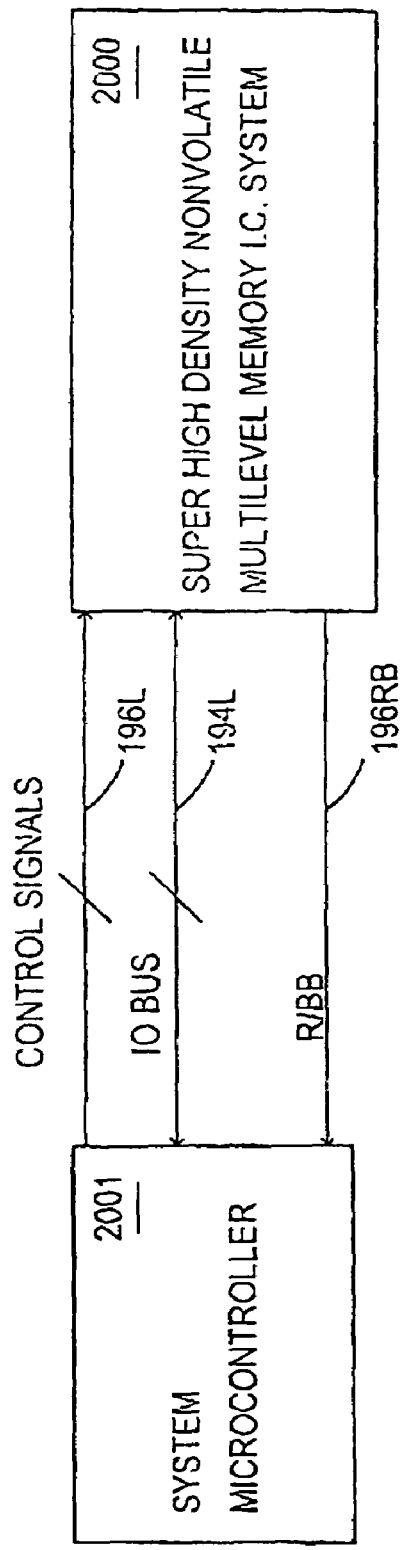
FIG. 1C is a block diagram of a nonvolatile multilevel memory system.

A nonvolatile multilevel memory system is shown in FIG. 1C. A super high density nonvolatile multilevel memory integrated circuit (IC) system 2000 is a digital multilevel nonvolatile flash memory integrated circuit capable of storing $2^N$ storage levels per one memory cell, with N=number of digital bits. A system microcontroller 2001 is a typical system controller used to control various system operations. Control signals CONTROL SIGNALS 196L, input/output bus IO BUS 194L, and ready busy signal R/BB 196RB are for communication between the system microcontroller 2001 and the super high density nonvolatile multilevel memory integrated circuit system 2000.

Figure 1D:
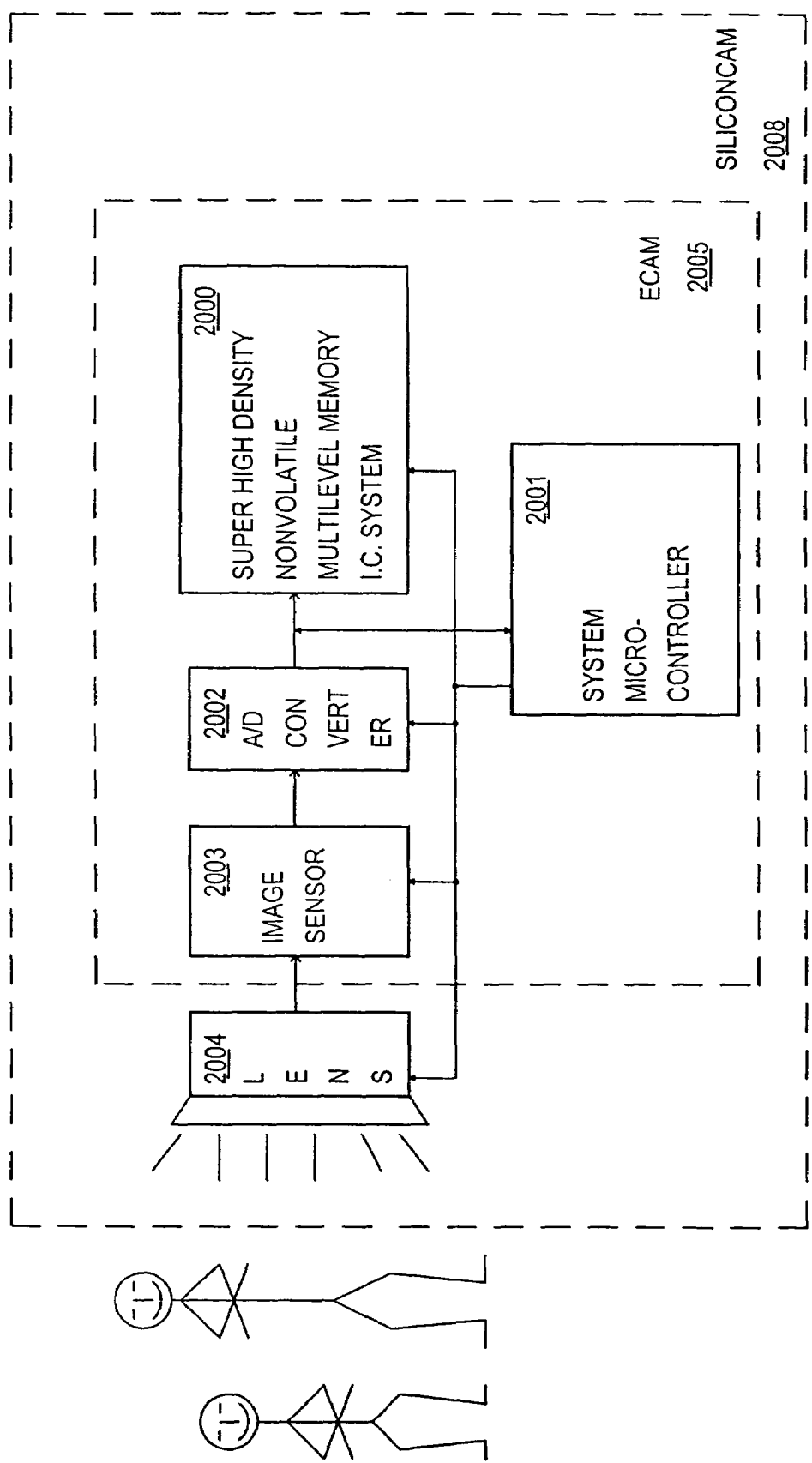
FIG. 1D is a block diagram of an electronic camera system utilizing a nonvolatile multilevel memory system.

An electronic camera system SILICONCAM 2008 utilizing super high density nonvolatile multilevel memory IC system 2000 is shown in FIG. 1D. The system SILICONCAM 2008 includes an integrated circuit system ECAM 2005 and an optical lens block LENS 2004. The integrated circuit system ECAM 2005 includes an image sensor IMAGE SENSOR 2003, an analog to digital converter block A/D CONVERTER 2002, a system microcontroller 2001, and multilevel memory IC system 2000. The optical lens block LENS 2004 is used to focus light into the IMAGE SENSOR 2003, which converts light into an analog electrical signal. The IMAGE SENSOR 2003 is a charge coupled device (CCD) or a CMOS sensor. The block A/D CONVERTER 2002 is used to digitize the analog electrical signal into digital data. The microcontroller 2001 is used to control various general functions such as system power up and down, exposure time and auto focus. The microcontroller 2001 is also used to process image algorithms such as noise reduction, white balance, image sharpening, and image compression. The digital data is stored in the multilevel memory IC system 2000. The digital data can be down loaded to another storage media through wired or wireless means. Future advances in process and device technology can allow the optical block LENS 2004 to be integrated in a single chip with the ECAM 2005.

Figure 1E:
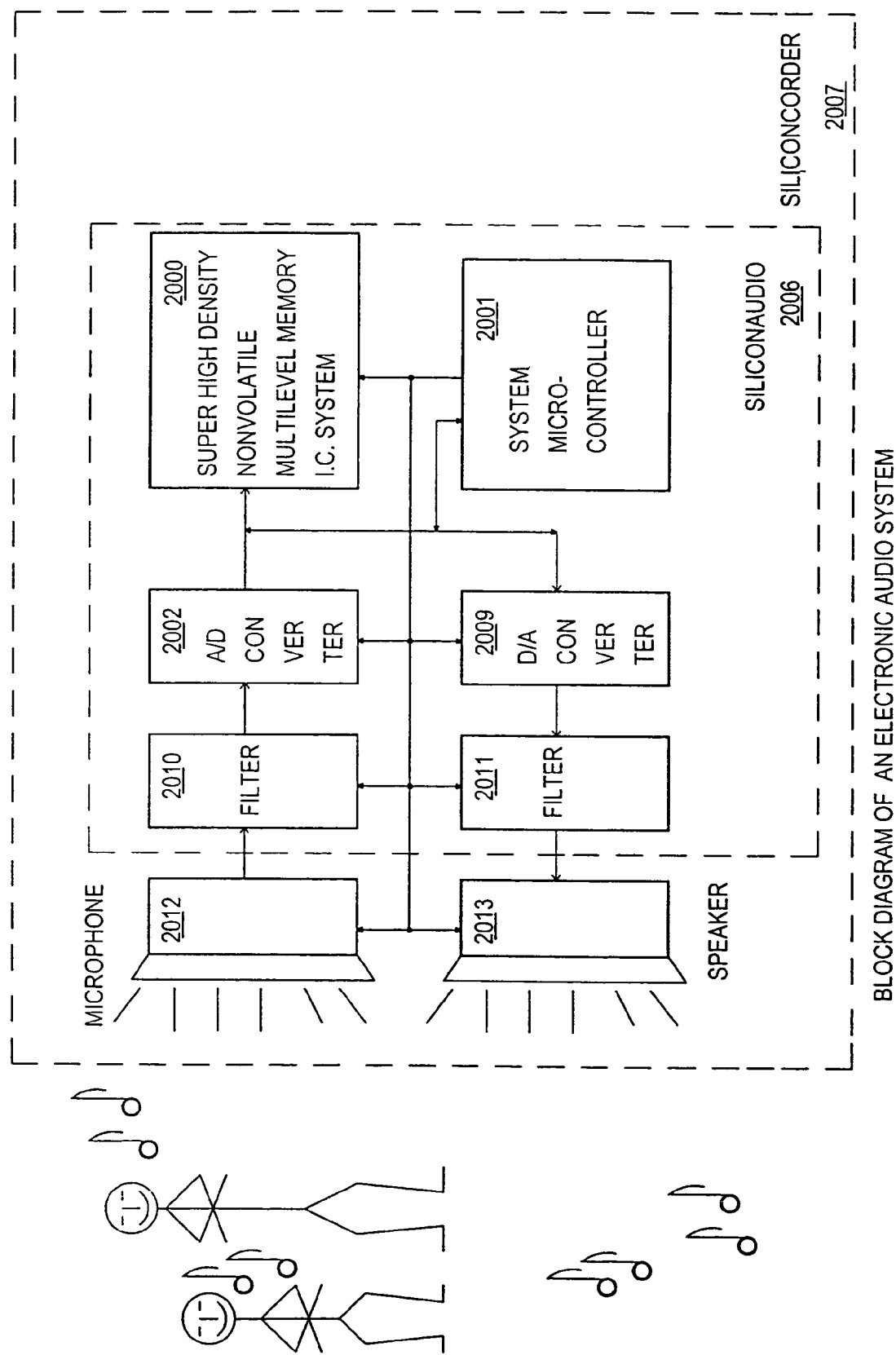
FIG. 1E is a block diagram of an electronic audio system utilizing a nonvolatile multilevel memory system.

An electronic audio system SILICONCORDER 2007 utilizing super high density nonvolatile multilevel memory IC system 2000 is shown in FIG. 1E. The SILICONCORDER 2007 includes an integrated circuit system SILI- CONAUDIO 2006, a MICROPHONE 2012, and a SPEAKER 2013. The system SILICONAUDIO 2006 includes an anti-alias FILTER 2010, an A/D CONVERTER 2002, a smoothing FILTER 2011, a D/A CONVERTER 2009, a system microcontroller 2001, and multilevel memory IC system 2000. The FILTER 2010 and FILTER 2011 can be combined into one filter block if the signals are multiplexed appropriately. The microcontroller 2001 is used to control various functions such as system power up and down, play, record, message management, audio data compression, and voice recognition. In recording a sound wave, the MICROPHONE 2012 converts the sound wave into an analog electrical signal, which is filtered by the FILTER 2010 to reduce non-audio signals. The filtered analog signal is then digitized by the A/D CONVERTER 2002 into digital data. The digital data is then stored in compressed or uncompressed form in the multilevel memory IC system 2000. In playing back the stored audio signal, the microcontroller 2001 first uncompresses the digital data if the data is in compressed form. The D/A CONVERTER 2009 then converts the digital data into an analog signal which is filtered by a smoothing filter FILTER 2011. The filtered output analog signal then goes to the SPEAKER 2013 to be converted into a sound wave. The signal filtering can be done by digital filtering by the microcontroller 2001. External digital data can be loaded into the multilevel memory IC system 2000 through wired or wireless means. Future advances in process and device technology-can allow the MICROPHONE 2012 and the SPEAKER 2013 to be integrated in a single chip with the SILICONAUDIO 2006.

Figure 2A:
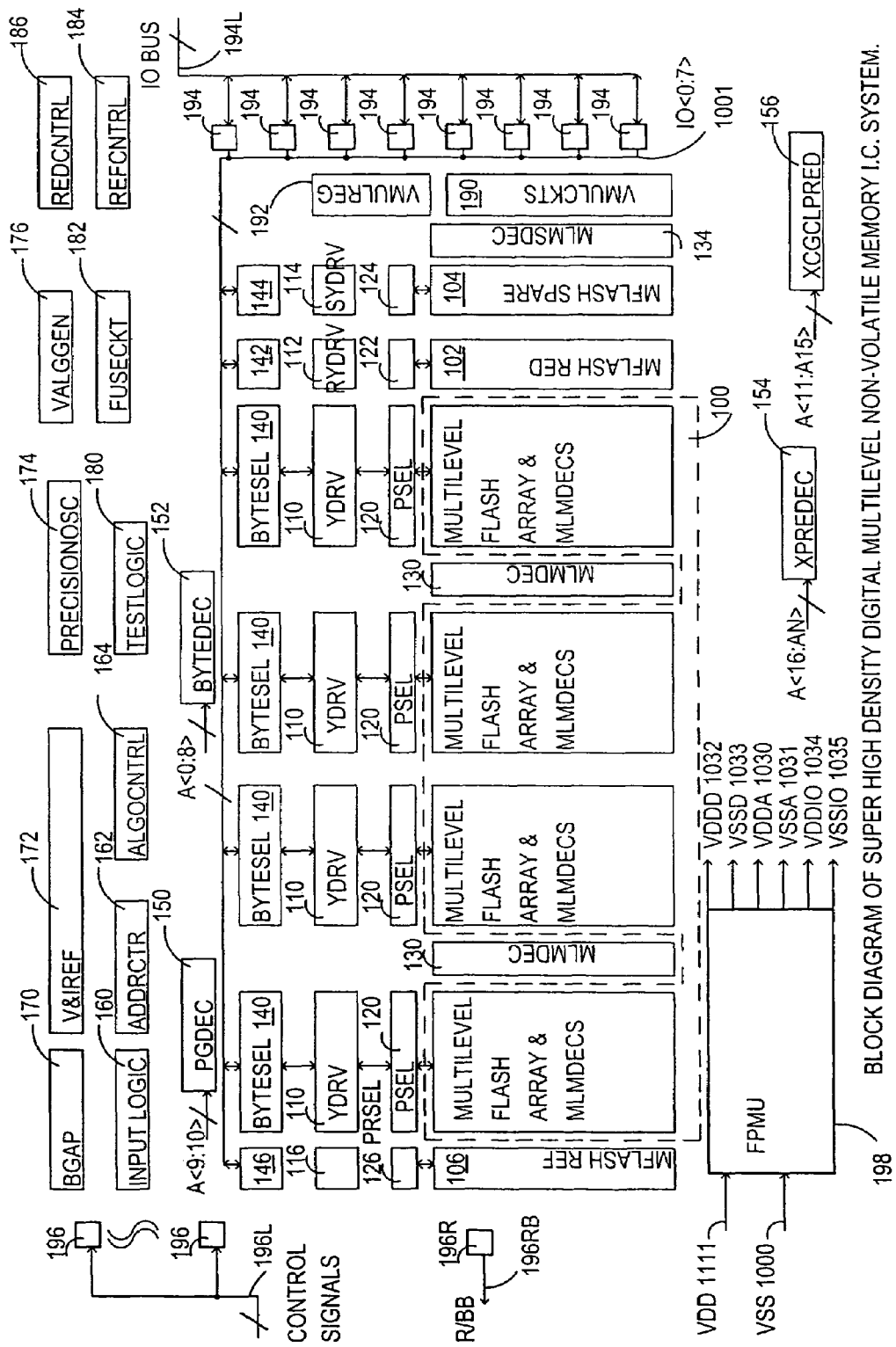
FIG. 2A is a block diagram of super high-density nonvolatile multilevel memory integrated circuit system.

A circuit block diagram of the super high density nonvolatile multilevel memory integrated circuit system 2000 based on the concepts described above and also on ideas described below, is shown in FIG. 2A. For the purpose of discussion, a giga bit nonvolatile multilevel memory chip is described.

A circuit block 100 includes regular memory array. It includes a total of for example, 256 million nonvolatile memory cells for a 4-bit digital multilevel memory cell technology or 128 million cells for a 8-bit digital multilevel memory cell technology. An N-bit digital multilevel cell is defined as a memory cell capable of storing $2^N$ levels. A reference array MFLASHREF 106 is used for the reference system. A redundancy array MFLASHRED 102 is used to increase production yield by replacing bad portions of the regular memory array of the circuit block 100. An optional spare array MFLASHSPARE 104 can be used for extra data overhead storage such as for error correction.

A y-driver block YDRV 110 including a plurality of single y-drivers YDRVS 110S is used for controlling the bitline during write, read, and erase operation. Block YDRVS Laos will be described in detail below in the description of the multilevel algorithm. Multiples of y-driver block YDRV 110 are used for parallel multilevel page writing and reading to speed up the data rate during write to and read from the multilevel memory IC system 2000. A reference y-driver block REFYDRV 116 including a plurality of single reference y-drivers REFYDRVS 116S is used for the reference array block MFLASHREF 106. A redundant y-driver block RYDRV 112 including a plurality of single redundant y-drivers RYDRVS 112S is used for the redundant array MFLASHRED 102. The function of block RYDRVS 112S is similar to that of block YDRVS 110S. A spare y-driver block SYDRV 114 including a plurality of single spare y-drivers SYDRVS 114S is used for the spare array MFLASHSPARE 104. The function of block SYDRVS 114S is similar to that of block YDRVS 110S. A page select block PSEL 120 is used to select one bitline out of multiple bitline for each single y-driver YDRVS 110S inside the block YDRV 110. Corresponding select circuit blocks for reference array, redundant array, and spare array are a reference page select block PRSEL 126, a redundant page select block 122, and a spare page select block 124. A byte select block BYTESEL 140 is used to enable one byte data in or one byte data out of the blocks YDRV 110 at a time. Corresponding blocks for reference array, redundant array, and spare array are a reference byte select block 146, a redundant byte select block 142, and a spare byte select block 144. The control signals for circuit blocks 116, 126, 146, 112, 122, 142, 114, 124, and 144 are in general different from the control signals for circuit blocks 110, 120, and 140 of the regular memory array of the circuit block 100. The control signals are not shown in the figures.

A multilevel memory precision decoder block MLMDEC 130 is used for address selection and to provide precise multilevel bias levels over temperature, process corners, and power supply as required for consistent multilevel memory operation for the regular memory array of the circuit block 100 and for the redundant array 102. A multilevel memory precision decoder block MLMSDEC 134 is used for address selection and to provide precise multilevel bias levels over temperature, process corners, and power supply as required for consistent multilevel memory operation for the spare array 104.

An address pre-decoding circuit block XPREDEC 154 is used to provide decoding of addresses A<16:AN>. AN denotes the most significant bit of addresses depending on the size of the memory array. The outputs of block XPREDEC 154 couple to blocks MLMDEC 130 and block MLMSDEC 134. An address pre-decoding block XCGCLPRED 156 is used to provide decoding of addresses A<11:15>. The outputs of block 156 also couple to blocks MLMDEC 130 and block MLMSDEC 134.

A page address decoding block PGDEC 150 is used to provide decoding of addresses A<9:10>. The outputs of block PGDEC 150 couple to blocks PSEL 120. A byte address decoding block BYTEDEC 152 is used to provide decoding of addresses A<0:8>. The outputs of block BYTEDEC 152 couple to blocks BYTESEL 140. An address counter block ADDRCTR 162 provides addresses A<11:AN>, A<9:10>, and A<0:8> for row, page, and byte addresses respectively. The outputs of the block ADDRCTR 162 couple to blocks XPREDEC 154, XCGCLPRED 156, PGDEC 150, and BYTEDEC 152. The inputs of the block ADDRCTR 162 are coupled from the outputs of an input interface logic block INPUTLOGIC 160.

The input interface logic block INPUTLOGIC 160 is used to provide external interface to systems off-chip such as the microcontroller 2001. Typical external interface for memory operation are read, write, erase, status read, identification (ID) read, ready busy status, reset, and other general purpose tasks. Serial interface can be used for the input interface to reduce pin counts for high-density chip due to a large number of addresses. Control signals 196L are used to couple the INPUTLOGLC 160 to the system microcontroller 2001. The INPUTLOGIC 160 includes a status register that is indicative of the status of the memory chip operation such as pass or fail in program or erase, ready or busy, write protected or unprotected, cell margin good or bad, restore or no restore, etc. The margin and restore concepts are described more in detail in the multilevel algorithm description.

An algorithm controller block ALGOCNTRL 164 is used to handshake the input commands from the block INPUT- LOGIC 160 and to execute the multilevel erase, programming and sensing algorithms as needed for multilevel nonvolatile operation. The ALGOCNTRL 164 is also used to algorithmically control the precise bias and timing conditions as required for multilevel precision programming.

A test logic block TESTLOGIC 180 is used to test various electrical features of the digital circuits, analog circuits, memory circuits, high voltage circuits, and memory array. The inputs of the block TESTLOGIC 180 are coupled from the outputs of the INPUTLOGIC 160. The block TESTLOGIC 180 also provides timing speed-up in production testing such as faster write/read and mass modes. The TESTLOGIC 180 is also used to provide screening tests associated with memory technology such as various disturb and reliability tests. The TESTLOGIC 180 also allows an off-chip memory tester to directly take over the control of various on-chip logic and circuit bias blocks to provide various external voltages and currents and external timing. This feature permits, for example, screening with external voltage and external timing or permits accelerated production testing with fast external timing.

A fuse circuit block FUSECKT 182 is a set of nonvolatile memory cells configured at the external system level, at the tester, at the user, or on chip on-the-fly to achieve various settings. These settings can include precision bias levels, precision on-chip oscillator, programmable logic features such as write-lockout feature for portions of an array, redundancy fuses, multilevel erase, program and read algorithm parameters, or chip performance parameters such as write or read speed and accuracy.

A reference control circuit block REFCNTRL 184 is used to provide precision reference levels for precision voltage levels as required for multilevel programming and sensing.

A redundancy controller block REDCNTRL 186 is for redundancy control logic.

A voltage algorithm controller block VALGGEN 176 provides various specifically shaped voltage signals of amplitude and duration as required for multilevel nonvolatile operation and to provide precise voltage levels with tight tolerance, as required for precision multilevel programming, erasing, and sensing.

A circuit block BGAP 170 is a bandgap voltage generator based on the bandgap circuit principle to provide a precise voltage level over process, temperature, and supply as required for multilevel programming and sensing.

A voltage and current bias generator block V&IREF 172 is an on-chip programmable bias generator. The bias levels are programmable by the settings of the control signals from the FUSECKT 182 and also by various metal options. A precision oscillator block PRECISIONOSC 174 is needed to provide accurate timing as required for multilevel programming and sensing.

Input buffer blocks 196 are typical input buffer circuits, for example, TTL input buffers or CMOS input buffers. Input/output (io) buffer blocks 194 includes typical input buffers and typical output buffers. A typical output buffer is, for example, an output buffer with slew rate control, or an output buffer with level feedback control. A circuit block 196R is an open drained output buffer and is used for ready busy handshake signal R/BB 196RB.

A voltage multiplier (also known as charge pump) block VMULCKT 190 provides voltage levels above the external power supply required for erase, program, read, and production tests. A voltage multiplying regulator block VMULREG 192 provides regulation for the block VMULCKT 190 for power efficiency and for transistor reliability such as to avoid various breakdown mechanisms.

A flash power management block FPMU 198 is used to efficiently manage power on-chip such as powering up only the circuit blocks in use. The FPMU 198 also provides isolation between sensitive circuit blocks from the less sensitive circuit blocks by using different regulators for digital power VDDD 1032/VSSD 1033, analog power VDDA 1030/VSSA 1031, and IO buffer power VDDIO 1034/VSSIO 1035. The FPMU 198 also provides better process reliability by stepping down power supply VDD to lower levels required by transistor oxide thickness. The FPMU 198 allows the regulation to be optimized for each circuit type. For example, an open loop regulation could be used for digital power since highly accurate regulation is not required; and a closed loop regulation could be used for analog power since analog precision is normally required. The flash power management also enables creation of a "green" memory system since power is efficiently managed.

Figure 2B:
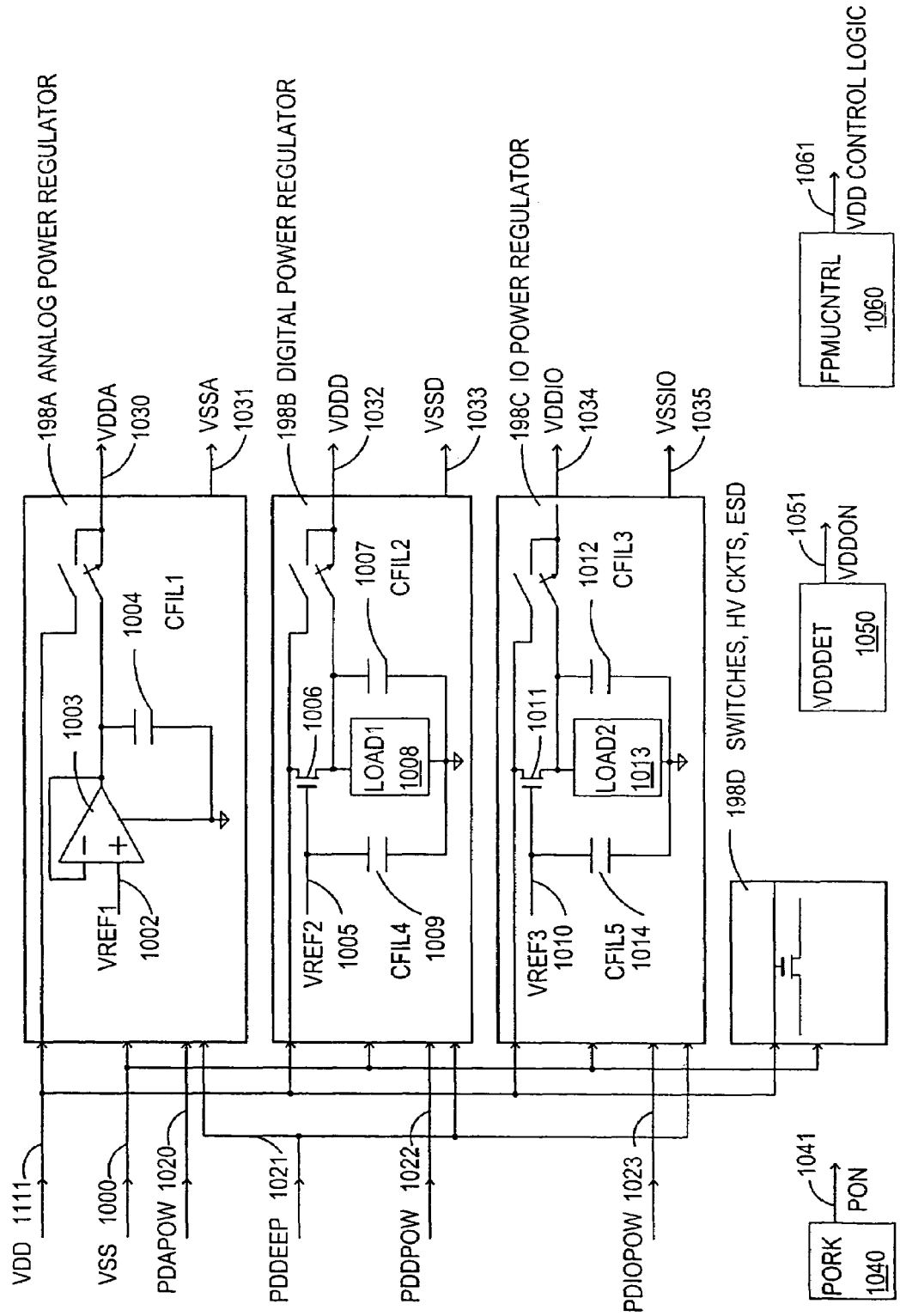
FIG. 2B is a block diagram of flash power management unit.

Block diagram of the FPMU 198 is shown in FIG. 2B. A VDD 1111 and a VSS 1000 are externally applied power supply and ground lines respectively. A block ANALOG POWER REGULATOR 198A is an analog power supply regulator, which uses closed loop regulation. The closed loop regulation is provided by negative feedback action of an operational amplifier (op amp) 1003 configured in a voltage buffer mode with a reference voltage VREF1 1002 on the positive input of the op amp. A filter capacitor CFIL1 1004 is used for smoothing transient response of the analog power VDDA 1030. A ground line VSSA 1031 is for analog power supply. A block DIGITAL POWER REGULATOR 198B is a digital power supply regulator, which uses open loop regulation. The open loop regulation is provided by source follower action of a transistor 1006 with a reference voltage VREF2 1005 on its gate. A pair of filter capacitor CFIL4 1009 and CFIL2 1007 are used for smoothing transient response of digital power VDDD 1032. A loading element LOAD1 1008 is for the transistor 1006. A ground line VSSD 1033 is for digital power supply. A block IO POWER REGULATOR 198C is an io power supply regulator, which uses open loop regulation similar to that of the digital power supply 198B. The open loop regulation is provided by a transistor 1011 with a reference voltage VREF3 1010 on its gate. A loading element LOAD2 1013 is for transistor 1011. A pair of capacitor CFIL5 1014 and CFIL3 1012 are used for smoothing transient response of io power VDDIO 1034. A ground line VSSIO 1035 is for io power supply. A block 198D includes various circuits that require unregulated power supply such as transmission switches, high voltage circuits, ESD structures, etc.

A block PORK 1040 is a power on reset circuit which provides a logic signal PON 1041 indicating that the power supply being applied to the chip is higher than a certain voltage. The signal PON 1041 is typically used to initialize logic circuits before chip operation begins.

A block VDDDET 1050 is a power supply detection circuit, which provides a logic signal VDDON 1051 indicating that the operating power supply is higher than a certain voltage. The block VDDDET 1050 is normally used to detect whether the power supply is stable to allow the chip to take certain actions such as stopping the programming if the power supply is too low.

A block FPMUCNTRL 1060 is a power supply logic controller, that receives control signals from blocks PORK 104, VDDDET 1050, INPUTLOGIC 160, ALGOCNTRL 164, and other logic control blocks to power up and power down appropriately power supplies and circuit blocks. The FPMUCNTRL 1060 is also used to reduce the power drive ability of appropriate circuit blocks to save power. A line PDDEEP 1021 is used to power down all regulators. Lines PDAPOW 1020, PDDPOW 1022, and PDIOPOW 1023 are used to power down blocks 198A, 198B, and 198C respectively. Lines PDDEEP 1021, PDAPOW 1020, PDDPOW 1022, and PDIOPOW 1023 come from block FPMUCNTRL 1060.

It is possible that either closed or open loop regulation could be used for any type of power supply regulation. It is also possible that any power supply could couple directly to the applied power supply VDD 1111 without any regulation with appropriate consideration. For example, VDDA 1030 or VDDIO 1034 could couple directly to VDD 1111 if high voltage transistors with thick enough oxide are used for analog circuits or io buffer circuits respectively.

A typical memory system operation is as follows: a host such as the microcontroller 2001 sends an instruction, also referred to as a command, such as a program instruction via the CONTROL SIGNALS 196L and IO BUS 194L to the multilevel memory chip 2000 (see FIG. 1C). The INPUTLOGIC 160 interprets the incoming command as a valid command and initiate the program operation internally. The ALGOCNTRL 164 receives the instruction from the INPUTLOGIC 160 to initiate the multilevel programming algorithmic action by outputting various control signals for the chip. A handshake signal such as the ready busy signal R/BB 196RB then signals to the microcontroller 2001 that the multilevel memory chip 2000 is internally operating. The microcontroller 2001 is now free to do other tasks until the handshake signal R/BB 196RB signals again that the multilevel memory chip 2000 is ready to receive the next command. A timeout could also be specified to allow the microcontroller 2001 to send the commands in appropriate times.

Read Operation:

A read command including a read operational code and addresses is sent by the microcontroller 2001 via the CONTROL SIGNALS 196L and IO BUS 194L. The INPUTLOGIC 160 decodes and validates the read command. If it is valid, then incoming addresses are latched in the ADDRCTR 162. The ready busy signal R/BB 196RB now goes low to indicate that the multilevel memory device 2000 has begun read operation internally. The outputs of ADDRCTR 162 couple to blocks XPREDEC 154, XCGCLPRED 156, PGDEC 150, BYTEDEC 152, and REDCNTRL 186. The outputs of blocks 154, 156, 150, 152, and 186 couple to blocks MLMDEC 130, MLSMDEC 134, and block 100 to enable appropriate memory cells. Then the ALGOCNTRL 164 executes a read algorithm. The read algorithm will be described in detail later in the multilevel algorithm description. The read algorithm enables blocks BGAP 170, V&IREF 172, PRECISIONOSC 174, VALGGEN 176, and REFCNTRL 184 to output various precision shaped voltage and current bias levels and algorithmic read timing for read operation, which will be described in detail later in the description of the multilevel array architecture. The precision bias levels are coupled to the memory cells through blocks MLMDEC 130, MLMSDEC 134, and block 100.

In an embodiment, the read algorithm operates upon one selected page of memory cells at a time to speed up the read data rate. A page includes a plurality of memory cells, e.g., 1024 cells. The number of memory cells within a page can be made programmable by fuses, e.g., 512 or 1024 to optimize power consumption and data rate. Blocks PGDEC 150, MLMDEC 130, MLMSDEC 134, 100, and PSEL 120 select a page. All memory cells in the selected page are put in read operating bias condition through blocks MLMDEC 130, MLMSDEC 134, 100, PSEL 120, and XCGCLPRED 156. After the readout voltage levels are stable, a read transfer cycle is initiated by the ALGOCNTRL 164. All the readout voltages from the memory cells in the selected page are then available at the y-drivers YDRVS 110S, RYDRVS 112S, and SYDRVS 114S inside block YDRV 110, RYDRV 112, and SYDRV 114 respectively.

Next, in the read transfer cycle the ALGOCNTR 164 executes a multilevel read algorithm to extract the binary data out of the multilevel cells and latches them inside the YDRVS 110S, RYDRVS 112S, and SYDRVS 114S. This finishes the read transfer cycle. A restore flag is now set or reset in the status register inside the INPUTLOGIC 160. The restore flag indicates whether the voltage levels of the multilevel memory cells being read have been changed and whether they need to be restored to the original voltage levels. The restore concept will be described more in detail in the multilevel algorithm description. Now the ready busy signal R/BB 196RB goes high to indicate that the internal read operation is completed and the multilevel memory device 2000 is ready to transfer out the data or chip status. The microcontroller 2001 now can execute a status read command to monitor the restore flag or execute a data out sequence. The data out sequence begins with an external read data clock provided by the microcontroller 2001 via the CONTROL SIGNAL 196L coupled to an input buffer 196 to transfer the data out. The external read data clock couples to the blocks BYTEDEC 152 and BYTESEL 140, 142, and 144 to enable the outputs of the latches inside blocks YDRV 110 or RYDRV 112 or SYDRV 114 to output one byte of data at a time into the bus IO<0:7> 1001. The external read data clock keeps clocking until all the desired bytes of the selected page are outputted. The data on bus IO<0:7>1001 is coupled to the microcontroller 2001 via IO BUS 194L through io buffers 194.

Program Operation:

A program command including a program operational code, addresses, and data is sent by the microcontroller 2001 via CONTROL SIGNALS 196L and IO BUS 194L. The INPUTLOGIC 160 decodes and validates the command. If it is valid, then incoming addresses are latched in the ADDRCTR 162. The data is latched in the latches inside YDRV 110, RYDRV 112, and SYDRV 114 via blocks BYTEDEC 152, BYTESEL 140, 142, and 144 respectively. The ready busy signal R/BB 196RB now goes low to indicate that the memory device has begun program operation internally. The outputs of ADDRCTR 162 couple to blocks XPREDEC 154, XCGCLPRED 156, PGDEC 150, BYTEDEC 152, and REDCNTRL 186. The outputs of blocks 154, 156, 150, 152, and 186 couple to blocks MLMDEC 130, MLSMDEC 134, and 100 to enable appropriate memory cells. Then the ALGOCNTRL 164 executes a program algorithm, which will be described in detail later in the multilevel algorithm description. The ALGOCNTR 164 enables blocks BGAP 170, V&IREF 172, PRECISIONOSC 174, VALGGEN 176, and REFCNTRL 184 to output various precision shaped voltage and current bias levels and algorithmic program timing for the program operation, which will be described in detail later in the description of the multilevel array architecture. The precision bias levels are coupled to the memory cells through blocks MLMDEC 130, MLMSDEC 134, and block 100.

In an embodiment, the program algorithm operates upon one selected page of memory cells at a time to speed up the program data rate. Blocks PGDEC 150, MLMDEC 130, MLMSDEC 134, 100, and PSEL 120 select a page. All memory cells in the selected page are put in appropriate program operating bias condition through blocks MLMDEC 130, MLMSDEC 134, 100, PSEL 120, and XCGCLPRED 156. Once the program algorithm finishes, program flags are set in the status register inside the block INPUTLOGIC 160 to indicate whether the program has been successful. That is, all the cells in the selected page have been programmed correctly without failure and with enough voltage margins. The program flags are described more in detail in the multilevel algorithm description. Now the ready busy signal R/BB 196RB goes high to indicate that the internal program operation is completed and the memory device is ready to receive the next command.

Erase Operation:

An erase command including an erase operational code and addresses is sent by the microcontroller 2001 via CONTROL SIGNALS 196L and IO BUS 194L. The INPUTLOGIC 160 decodes and validates the command. If it is valid, then incoming addresses are latched in the ADDRCTR 162. The ready busy signal R/BB 196RB now goes low to indicate that the memory device has begun erase operation internally. The outputs of ADDRCTR 162 couple to blocks XPREDEC 154, XCGCLPRED 156, PGDEC 150, BYTEDEC 152, and REDCNTRL 186. The outputs of blocks 154, 156, 150, 152, and 186 couple to blocks MLMDEC 130, MLSMDEC 134, and 100 to enable appropriate memory cells. Then the ALGOCNTRL 164 executes an erase algorithm. The ALGOCNTRL 164 enables blocks BGAP 170, V&IREF 172, PRECISIONOSC 174, VALGGEN 176, and REFCNTRL 184 to output various precision shaped voltage and current bias levels and algorithmic erase timing for erase operation. The shaped voltage for erase is to minimize electric field coupled to memory cells, which minimizes the damage to memory cells during erasing. The precision bias levels are coupled to the memory cells through blocks MLMDEC 130, MLMSDEC 134, and block 100.

In an embodiment, the erase algorithm operates upon one selected erase block of memory cells at a time to speed up the erase time. An erase block includes a plurality of pages of memory cells, e.g., 32 pages. The number of pages within an erase block can be made programmable by fuses to suit different user requirements and applications.

Blocks PGDEC 150, MLMDEC 130, MLMSDEC 134, 100, and PSEL 120 select a block. All memory cells in the selected block are put in erase operating bias condition through blocks MLMDEC 130, MLMSDEC 134, 100, PSEL 120, and XCGCLPRED 156. Once the erase algorithm finishes, the erase flags are set in the status register inside the block INPUTLOGIC 160 to indicate whether the erase has been successful. That is, all the cells in the selected page have been erased correctly to desired voltage levels without failure and with enough voltage margins. Now the ready busy signal R/BB 196RB goes high to indicate that the internal ease operation is completed and the multilevel memory device 2000 is ready to receive the next command.

Multilevel Array Architecture:

The demanding requirements associated with putting together a billion transistors on a single chip with the ability to store multiple precision levels per cell and operating at a very high speed are contradictory. These requirements need innovative approaches and careful tradeoffs to achieve the objective. Examples of tradeoffs and problems with prior art implementation are discussed below. In conventional prior art architectures, a voltage drop along a metal line of a few tens of millivolts could be easily tolerated. Here, in a super high density nonvolatile multilevel memory integrated circuit system-such a voltage drop can cause unacceptable performance degradation in precision levels due to the high number of levels stored per memory cell. In conventional array architectures a bit line capacitance in the order of 10 pico farads would be a non-issue. Here it may be unworkable due to the high data rate required. In prior art array architectures a bias level variation from one memory cell to another in the order of +/−30 percent would be a typical situation. Here such a bias variation would be a serious performance problem. In prior art array architectures the total resistance of a memory source line in the order of a few-hundreds of ohms would be a typical situation, here a few tens of ohms is a serious problem. The huge number of memory cells of the giga bit high-density memory system compounds the matter even further by making the memory source line longer. Another challenge facing the multilevel system is maintaining high speed sensing and programming with low power, again requiring tradeoffs. Another challenge facing the multilevel system is high speed sensing and programming with very high precision voltages due to a high number of levels stored per digital multilevel memory cell, again a conflicting demand. Another challenge facing the multilevel system is high speed sensing and programming consistently every time over many years, process corners, temperature, and power supply variation.

To get an appreciation of the order of magnitude of the difficulty involved in the super high density multilevel nonvolatile memory system, numerical examples will be given corresponding to a one giga bit array architecture system suitable for 256 levels, i.e., 8 bits. The array is then organized as 8192 bitline or columns and 16384 rows or wordlines for a total of 134,217,730 physical cells.

One sensing level, V1level,=multilevel sensing range/$2^N$, N=number of digital bits stored per memory cell. Multilevel sensing range is the readout voltage range from sensing a multilevel memory cell. Assuming the multilevel sensing range from the multilevel memory cell available is 2048 millivolts, then V1level=2048/256=8 millivolts.

A very high data rate is required for applications such as image or high density data storage. For example, write and read rates of a mega byte per second are required. To achieve this high data rate, parallel writing and sensing is required for the super high density nonvolatile multilevel memory integrated circuit system. In the present embodiment, a total of 1024 y-drivers YDRVS Laos inside blocks YDRV 110 are used. This allows 1024 memory cells to be written and sensed at the same time in a page mode manner, effectively increasing the speed by a factor of 1024 over single cell operation. The number of bitline multiplexed into one single y-driver YDRVS 110S is=8192/1024=8 bitline.

A program algorithm described in more detail elsewhere in this specification is able to achieve desired multilevel resolution. The read or program multilevel resolution is the smallest voltage range in read or program, respectively, needed to operate the multilevel memory cells correctly. An erase algorithm first erases the memory cells to make the cell readout voltage reaching a certain desired voltage level. Then the iterative program algorithm is applied to the memory cells. The program algorithm includes a plurality of verify-program cycles. A verify-program cycle includes a verify cycle followed by a program cycle. A verify cycle is done first to inhibit the cell from the first programming pulse if the cell is verified, therefore preventing possible overprogramming. Over-programming means that after a programming pulse the cell sensing level passes a desired voltage level by more than a desired voltage amount. A verify cycle is used to determine whether the desired readout sensing level has been reached. If the desired readout sensing level is reached, the cell is inhibited from further programming. Otherwise, the cell is enabled for the next program cycle. A program cycle is used to change incrementally the charge stored in the cell and the corresponding cell sensing readout voltage. Instead of a verify-program cycle, a program-verify cycle can be used. A program-verify cycle begins with a program cycle followed by a verify cycle. In this case, care should be taken to ensure that the first programming pulse does not cause over-programming.

Figure 2C:
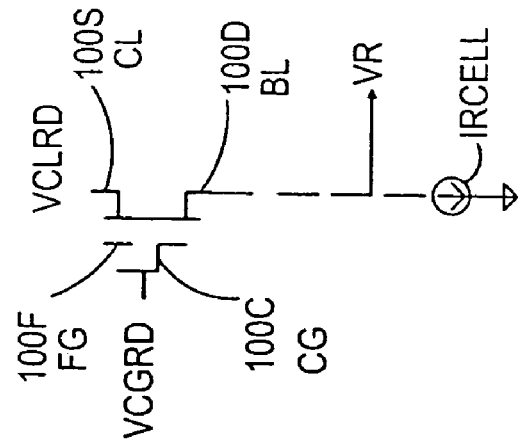
FIG. 2C shows voltage mode sensing.

In an embodiment the program cycle includes applying a voltage on the source line, (interchangeably referred to as common line CL) VCL, with a predetermined program pulsewidth TPPWD and a predetermined program bias cell current, Ipcell. The verify cycle makes use of the voltage mode sensing as shown in FIG. 2C, which applies a reference voltage VCLRD on the source line CL, another reference voltage VCGRD on the control gate, and a predetermined read bias current Ircell on the bitline and through the memory cell. The current Ircell is applied to the bitline and the memory cell through select transistors which are not shown. The resulting voltage on the bitline is the sensing readout voltage VR, which has a unique relationship to the charge on the floating gate. The voltage mode sensing is also used during read. To change incrementally the readout sensing voltage to the next value (VR+dVR), with dVR equals to the incremental readout sensing voltage change, the next program cycle is repeated with the common line voltage increased incrementally to (VCL+dVCLP), with dVCLP equals to the incremental programming voltage change.

The number of verify-program cycles NC is dependent on the number of voltage levels and various margins of the memory system. For example, for an equivalent 8-bit digital multilevel cell, there are $2^N=2^8=256$ levels, with N=8. The minimum possible number of verify-program cycles NC required would be 256. To cover variations due to cell-to-cell variation, temperature, process corners, an algorithm may require, for example, approximately 1.4×256=360 verify-program cycles. To cover various margins needed-such as for data retention and programming distribution, the number of verify-program cycles required is actually higher. Assuming a factor of 2 due to various margin coverage, the number of verify-program cycles is approximately equal to 720. The exact number of verify-program cycles is typically varied depending on various memory technologies and particular desired performance targets.

For write data rate of 1 mega byte per second and for 8-bit digital multilevel operation with 1024 bytes per page, the write timing per page is, TWRT=# of bytes written in parallel/data rate=1024 bytes per page/1 mega bytes/second=1024 us=1.024 ms per page.

Hence the time to execute each program-verify cycle, TPV, must be less than TWRT/NC=1.024 ms/720=1.42 us. This fast timing coupled with parallel operation of 1024 cells has important implication on memory cell program speed, capacitance loading, power consumption and other effects as will be described below.

Typical process parameters of a sub-micron memory cell are as follows. A typical diffused source line resistance per cell is 100 ohms. A typical bitline resistance per cell is 80 milliohms. A typical silicided row line resistance per cell is 20 ohms. A typical source line capacitance per cell is 2 fF. A typical bitline capacitance per cell is 1.5 fF. And a typical row line capacitance per cell is 3 fF.

Hence for the 8192×16384 array, the total bitline capacitance is CBL=~16384×1.5 fF=25 pF, where "=~" is defined as approximately equal to. The total metal bitline resistance RBL=~16384×0.08=1330 ohms. The total diffused source line resistance is RSL=8192×100=819 K ohms. The total row line resistance is RWL=8192×20=164 K ohms. For a typical memory system, the diffused source line is strapped by metal along the source line, with approximately 80 milliohms per cell, in this case RSL=8192×0.08=655 ohms.

In conventional stacked gate drain-side CHE programming (abbreviated as CHE flash program), the single cell current is typically 1 ma, which causes a voltage drop along a single metal bitline of=~1 ma×RBL=1 ma×1330 ohms=1330 millivolts, which is unacceptable since it is much greater than 1 level=8 millivolts. In SSI flash programming (abbreviated as SSI flash program), the typical cell current can be lowered to 1 ua, which causes a voltage drop along a single metal bitline of=~1 ua×1330 ohms=1.33 millivolts, which is acceptable.

For 1024 cells drawing the cell current Icell continuously, the voltage drop DVCL along the source line from the driver to the other end follows the geometric equation:

$$DVCL=0.5*P*(P+1)*R8cell*Icell, \quad (1)$$

where R8cell=the metal source line resistance for 8 cells in series=0.08 ohms×8=0.64 ohms, and P=1024.

Along the source line, for 1024 cells programming simultaneously, the total current is 1024×1 ma=1.024 A for the CHE flash program and=1024×1 ua=1.024 ma for the SSI flash program. The power needed for the drain side CHE flash programming for parallel page mode operation is unsustainable due to very high current. Additionally, the voltage drop along the metal source line by equation (1) is=~0.5×1024*1025*0.64*1 ma=336 Volts for CHE. This is obviously unworkable for CHE flash technology. Similarly the source line voltage drop for the SSI flash=336 millivolts. This is also unworkable in the multilevel program for the following reasons.

For a multilevel nonvolatile system, in one program cycle, the cell sensing voltage can only shift (dVR) a maximum of<(Q*V1level) for reliable sensing, where Q was 0.5 in the prior example. However Q could vary from ⅓ to ⅛ for long term reliability. This is needed, for example, to allow for sensing margin, verify margin, program disturb, data retention, and endurance. The number of cells programming simultaneously within a selected page can vary between as many as 1024 to as few as only one from one program cycle to the next. Thus the total program current flowing through the common line CL could change by a factor of 1024 from one program cycle to the next. The resulting worst case voltage change in the source line VCL from one program cycle to the next is dVCL=~336 millivolts for SSI flash. This voltage jump in VCL causes the only remaining programming cell to over program, which causes the cell sensing voltage to shift much greater than the (Q*V1level). Hence the challenge is to bring the voltage drop dVCL to an acceptable level during programming.

For verifying after programming multilevel memory cells, conventional methods would shut off the read cell currents for cells that have already reached their desired verifying levels, this would cause the voltage shift dVCL in verify as much as in programming as described above. This voltage jump dVCL would couple to the memory cells and cause a large jump in cell sensing voltage. This undesired large jump in cell sensing voltage causes an error in sensing, herein called a sense error VRerr. This sense error should be much less than (Q*V1level). Hence this large jump is unacceptable. The invention solves the problem by enabling the total current all the time whether the cells have been verified or not. This mitigates the change in the source line voltage. However a new problem surfaces as compared to that in programming. As temperature changes from −45 C to +85 C the resistance of the source line metal line changes by about 40%, hence the source line voltage drop changes by about 40%, which causes an additional sense error VRerr in read. This sense error should be much less than (Q*V1level) to prevent overall read margin degradation. Therefore, an array architecture is needed to achieve this, as will be described in detail below.

With 1024 cells operating simultaneously, assuming sense current Ircell=10 ua, the total sense current is=1024×10 u=10.24 ma flowing into the source line. This presents several problems. With power specification for a typical memory chip ICC=20–30 ma. This 10.24 ma is a big percentage of the power specification. To deliver 10.24 ma while maintaining a precise voltage level VCLRD, VCLRD is defined as the voltage in read on CL line, requires a challenging decoding and driver scheme, which will be addressed in the description of the multilevel decoding scheme. Large current flowing across the source line also causes the voltage drop as described above.

High data rata, meaning high sense speed and write speed, is required for data intensive application. The speed is proportional to capacitance and voltage swing and inversely proportional to the current, $$T=C*V/I \qquad (2).$$

For typical bitline capacitance as calculated above, CBL=25 pF and assuming voltage swing V=1V, and assuming available current I=10 ua, the time it takes to charge or discharge a bitline as needed in verify or program cycle is, TBL=25 pF*1V/10 ua=2.5 us. This is greater than the TPV=1.42 us as calculated above. At least a 2× or better timing is required for TBL to allow for various settling time, sensing time, and programming time. Increasing the current would cause higher power consumption, large decoding driver, and voltage problems as described above.

Further, in programming 1024 cells in parallel, the programming current is supplied from an on-chip voltage multiplier, also known as a charge pump. The on-chip voltage multiplier multiplies the low voltage power supply, e.g., 2.5 V to the required higher voltages. Allowing a reasonable area penalty from the on-chip voltage multiplier, a total current of 100 ua is allowed for programming. The programming current per cell is 100 ua/1024=0.1 ua. This causes a TBL=25 pF*1V/0.1 ua=250 us, which is even more severe of a timing problem. Here an improvement of more than 2 order of magnitude or better in speed is needed. The invention describes array architectures with suitable operating methods to achieve this improvement and will be described below.

Figure 3A:
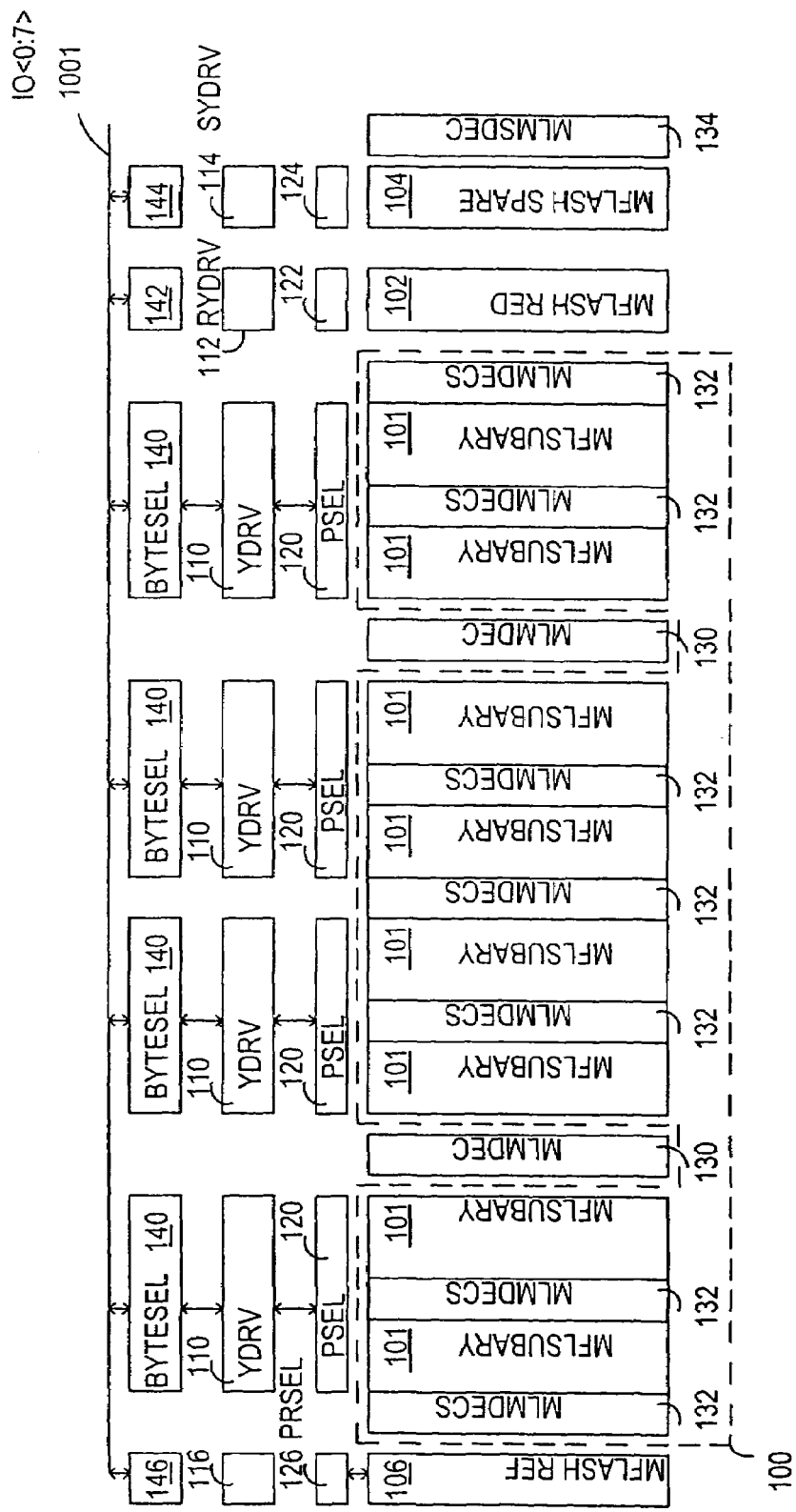
FIG. 3A is a block diagram of super high-density nonvolatile multilevel array architecture.

FIG. 3A is the block diagram of a super high-density digital nonvolatile multilevel memory array architecture which is capable of >8-bit multilevel operation. The block 100 has been expanded from FIG. 2A to show the sub-blocks inside. A multilevel precision memory decoder MLMDECS 132 is used for delivering bias voltage levels with tight tolerance over temperature, process, and power supply variation for multilevel memory cells. A multilevel memory sub-array MFLSUBARY 101 includes a plurality of single multilevel memory cells. Other blocks in FIG. 3A have already been described in association with the description of FIG. 2A.

Figure 3B:
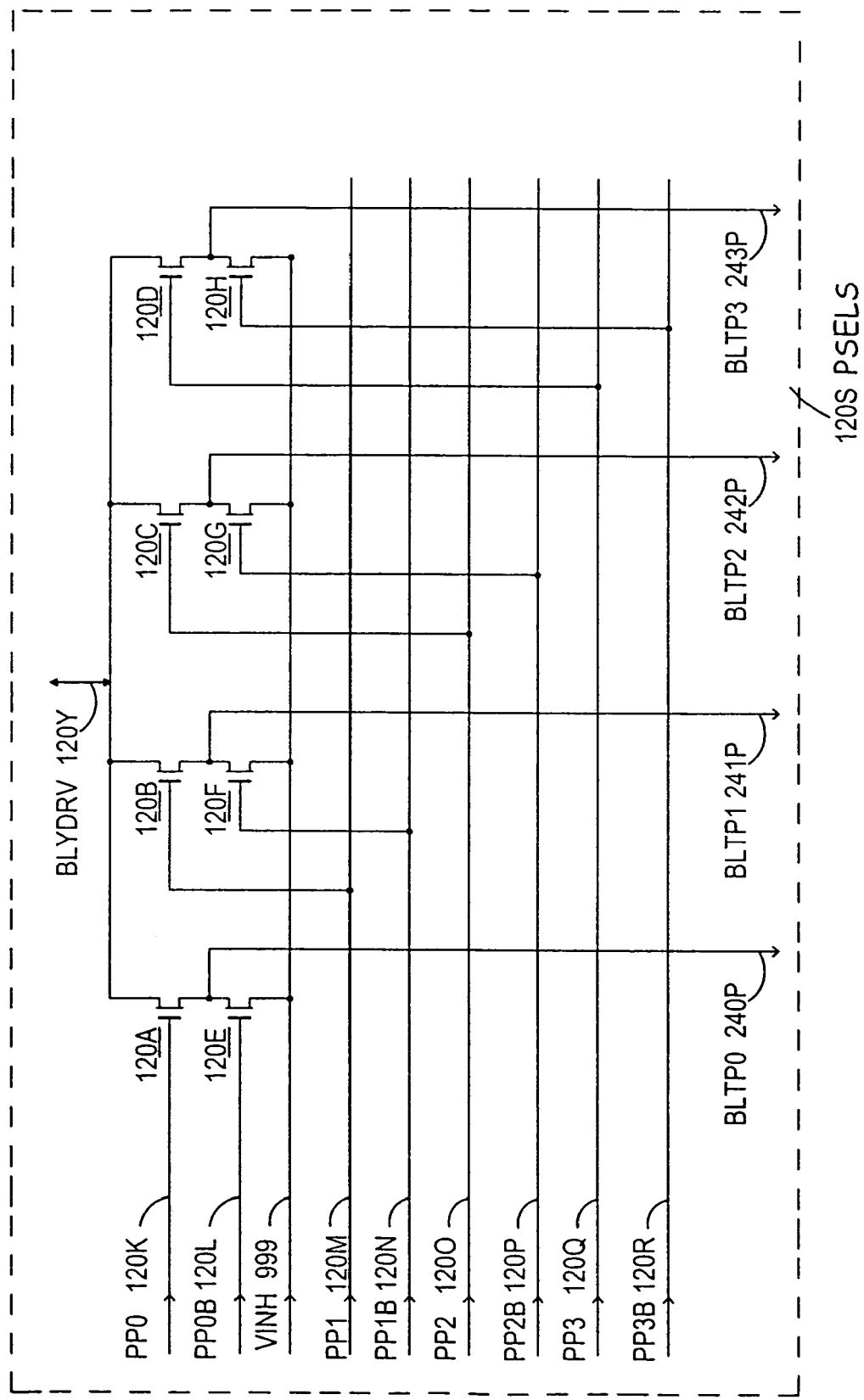
FIG. 3B is a page select circuit, which together with the segment select decoder selects one bitline at a time for each y-driver.

A block PSEL 120 includes a plurality of circuit blocks PSELS 120S. FIG. 3B shows details of a page select circuit PSELS 120S that selects a pair of bitline at a time. Transistors 120A–D are select transistors. Transistors 120E–H are inhibit transistors. Lines PP0 120K, PP1 120M, PP2 120O, and PP3 120Q are complementary signals of lines PP0B 120L, PP1B 120N, PP2B 120P, and PP3B 120R, respectively. Line BLYDRV 120Y goes to one y-driver YDRVS 110S inside the block YDRV 110. Block YDRVS 110S will be described in detail later in the description of the multilevel algorithm. Lines BLTP0 240P, BLTP1 241P, BLTP2 242P, and BLTP3 243P couple to the bitline in block 101 and couple to a set of lines BLP0 240, BLP1 241, BLP2 242, and BLP3 243 of the circuit block 290 in FIG. 4A.

Figure 3C:
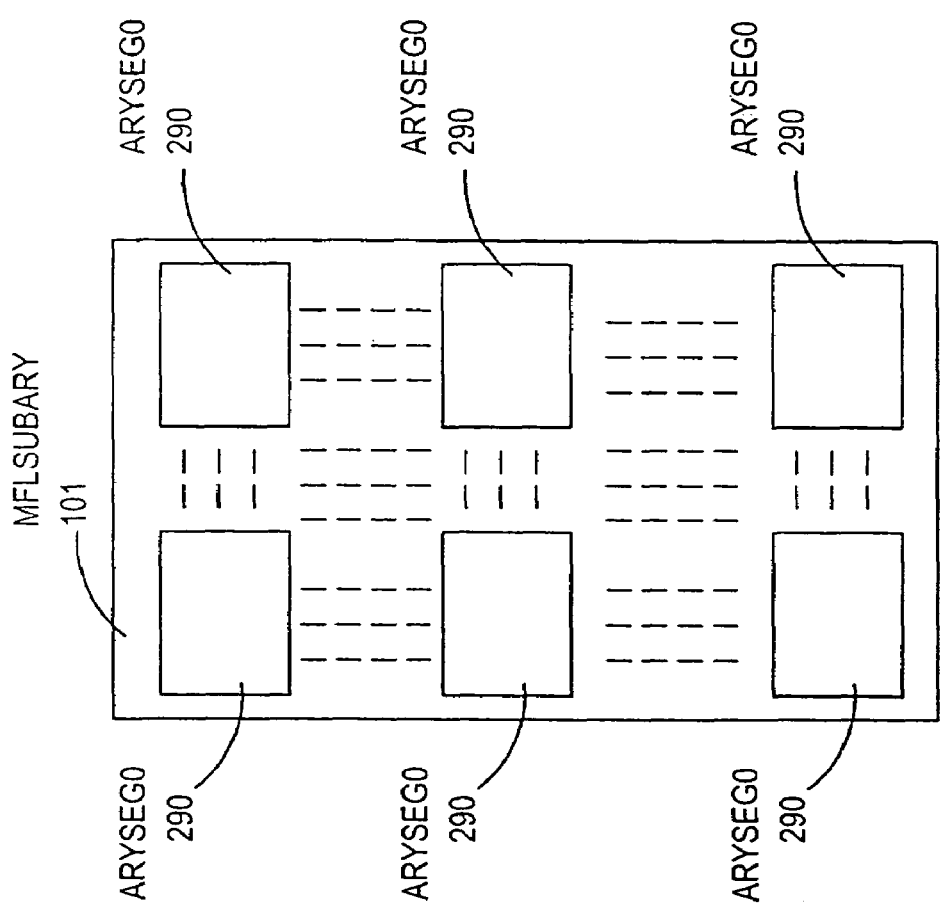
FIG. 3C is a block diagram of a multilevel sub-array block.

FIG. 3C shows a block diagram of a block MFLSUBARY 101. A block MFLSUBARY 101 includes a plurality of blocks ARYSEG0 290. Blocks ARYSEG0 290 are first tiled horizontally NH times and then the horizontally tiled blocks 290 are tiled vertically NV times. For a page with 1024 memory cells, NH is equal to 1024. NV is determined such that the total number of memory cells is equal to the size of the desired physical memory array.

FIG. 4A shows a basic array unit ARYSEG0 290. A block RD1SEG 300 is a multilevel decoding block. A plurality of the blocks RD1SEG makes up the circuit block MLMDEC 130. In the block ARYSEG0 290, there are 8 columns and FIG. 4A shows only 8 rows of memory cells, while other rows, e.g., 120 rows, are not shown for clarity. Each ARYSEG0 290 includes a plurality, e.g. 8, of array blocks ARY1BLK 290A tiled vertically. A set of transistors 220, 221, 222, 223, 224, 225, 226, 227 couples respectively a set of segment bitline SBL0 240A and SBL1 240B, SBL2 241A and SBL3 241B, SBL4 242A and SBL5 242B, SBL6 243A and SBL7 243B to a set of top bitline BLP0 240, BLP1 242, BLP2 242, BLP3 243, respectively. Top bitline refer to bitline running on top of the whole array and running the length of the MFLSUBARY 101. Segment bitline refer to bitline running locally within a basic array unit ARYSEG0 290. A set of transistors 230, 231, 232, 233, 234, 235, 236, 237 couples respectively segment bitline SBL 0 240A and SBL1 240B, SBL2 241A and SBL3 241B, SBL4 242A and SBL5 242B, SBL6 243A and SBL7 243B to an inhibit line VINHSEG0 274. A line CL0 264 is the common line coupled to common lines of the first four rows of memory cells. A line CL3 269 couples to common lines of the last four rows of memory cells. A set of control gates CG0 262, CG1 263, CG2 265, CG3 266 couples to control gates of memory cells of the first four rows respectively. A set of control gates CG12 267, CG13 268, CG14 270, CG15 271 couples to control gates of memory cells of the last four rows respectively. A pair of inhibit select lines INHBLB0 272 and INHBLB1 273 couples to gates of transistors 231, 233, 235, 237 and transistors 230, 232, 234, 236 respectively. A pair of bitline select lines-ENBLB0 260 and ENBLA0 261 couples to gates of transistors 221, 223, 225, 227 and transistors 220, 222, 224, 226 respectively.

Multiple units of the basic array unit ARYSEG0 290 are tiled together to make up one sub-array MFLSUBARY 101 as shown in FIG. 3C. And multiples of such MFLSUBARY 101 are tiled horizontally to make up the final 8192 columns for a total of 32768×8192=268,435,460 physical memory cells, or called 256 mega cells. The logical array size is 256 mega cells×4 bits per cell=1 giga bits if 4-bit digital multilevel memory cell is used or 256 mega cells×8 bits per cell=2 giga bits if 8-bit digital multilevel memory cell is used. The top bitline BLP0 240, BLP1 241, BLP2 242, and BLP3 243 run from the top of the array to the bottom of the array. The segment bitline SBL0 240A, SBL1 240B, SBL2 241A, SBL3 241B, SBL4 242A, SBL5 242B, SBL6 243A, and SBL7 243B only run as long as the number of rows within a segment, for example, 128 rows. Hence the capacitance contributed from each segment bitline is very small, e.g., 0.15 pF.

The layout arrangement of the top bitline 240–243 in relative position with each other and with respect to the segment bitline SBL0 240A, SBL1 240B, SBL2 241A, SBL3 241B, SBL4 242A, SBL5 242B, SBL6 243A, SBL7 243B are especially advantageous in reducing the bitline capacitance. The purpose is to make the top bitline as truly floating as possible, hence the name of truly-floating-bitline scheme.

Figure 5A:
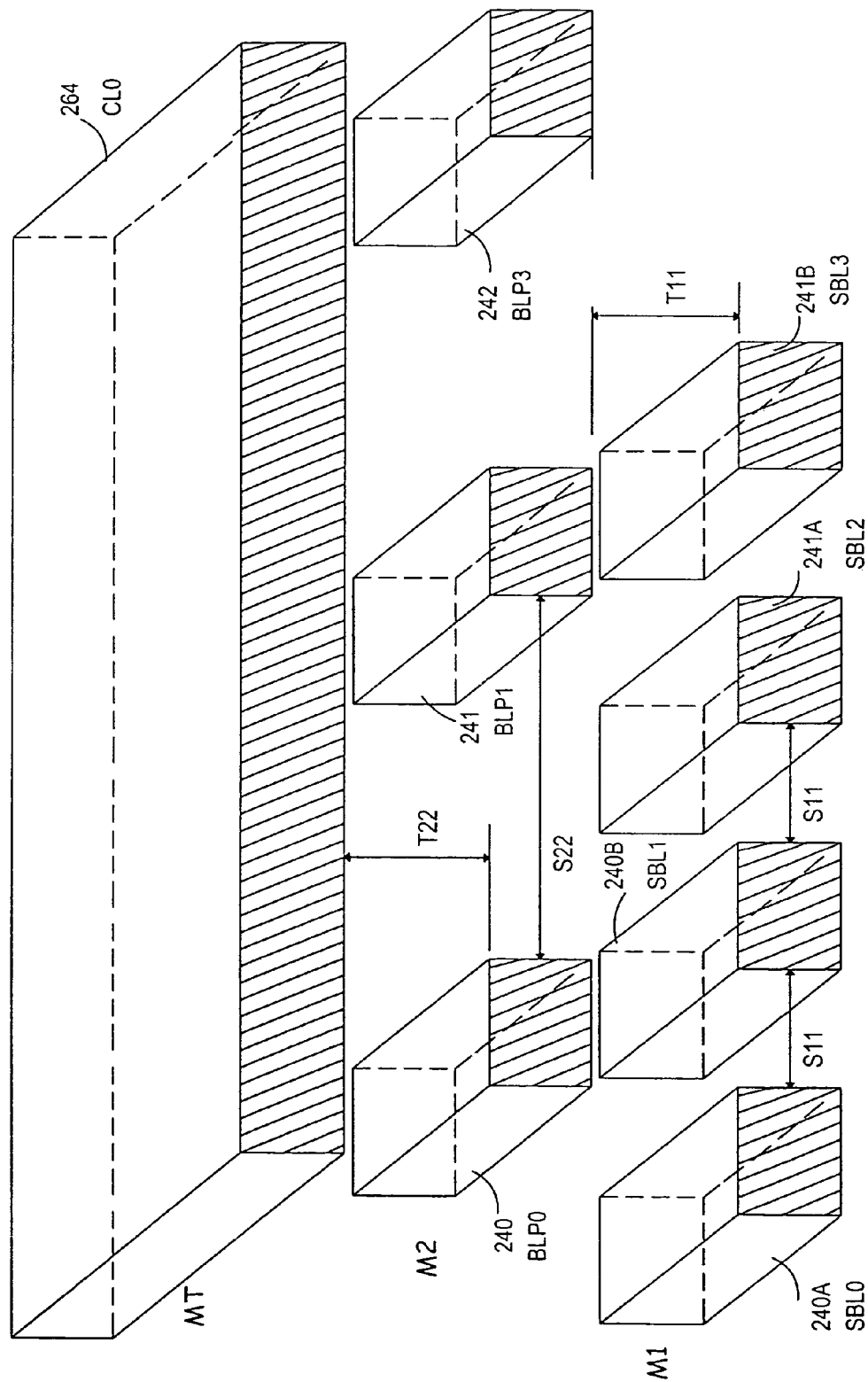
FIG. 5A is a cross section of inhibit and select segmentation interconnection.

In an embodiment as shown in FIG. 5A, line 240, 241, and 242 are in the middle, sandwiched between lines 240A, 240B, 241A and 241B in the bottom and lines CL0 264 in the top. Furthermore, line 240 is on top of the spacing between lines 240A and 240B and line 241 is on top of the spacing between lines 241A and 241B. This has the benefit of reducing significantly the bottom plane capacitance of line 240 and line 241 since the oxide below each line is almost doubled. The lines 240 and 241 could be positioned on top of lines 240A and 241A respectively when the sidewall capacitance reduction outweighs the benefit of the bottom plane capacitance reduction. The sidewall capacitance refers to the capacitance resulting from the vertical walls of a line, the bottom plane capacitance refers to the capacitance from the bottom of a line, and the top plane capacitance refers to the capacitance from the top of a line.

In another embodiment, as shown in FIG. 5B, the top bitline 240–242 have been positioned all the way to the top metal of a multi-layer metal integrated circuit system. For example, for a 5 layer metal integrated circuit system, the top bitline are metal 5 layer. This avoids the top plane capacitance of the top bitline 240–242. This also reduces the bottom plane capacitance of the top bitline 240–242 by a factor of as much as 4 if metal 5 is used. The reduction factor of 4 is due to the oxide below the line increasing by a factor of about as much as 4. Also since the top bitline 240–242 are spaced further apart as compared to the segment bitline, the sidewall capacitance is reduced significantly. The top bitline are now almost floating on top of the array. The end effect is more than on order of magnitude reduction in bitline capacitance. Also since the top bitline 240–242 spacing are relaxed, the width of the top metal lines can be made larger to reduce the metal bitline resistance.

The reduction in bitline capacitance results in a corresponding increase in speed. To help increase the speed in programming, a bitline-stabilization-assisted operating method can be applied and is described as follows. At the beginning of the programming cycle, a bitline stabilization control signal is used to set all the bitline to a predetermined voltage VBLPRE, e.g., 0.4–0.8 V. Then high voltage VCL is applied to selected memory common lines for programming. Now the bitline only have to move partially to a final voltage. This speeds up the TBL timing.

There is an important transient effect related to bitline capacitance in programming. For high speed writing, each program cycle takes time in the microsecond range. The program bias condition for a memory cell is control gate voltage VCGP,=~0.7–2.5 V, bitline cell current Ipcell,=~50–500 nA, and common line voltage VCL going from a low,=~0 V, to a high programming voltage,=~8–13 V. As the VCL ramps from a low to a high voltage, there is a transient current flowing through the memory cell to charge up the bitline node capacitance. This transient current flowing through the cell contributes to the cell programming in addition to the programming current Ipcell. Prior art CHE programming would not be bothered with this effect since the additional transient programming current is small compared to the actual programming current. However, for a very fine programming voltage level control as required for high bits per cell, this effect will cause the programming level to be uncontrollable, making the multilevel memory system useless. The following example is given to appreciate the magnitude of this transient current. Assuming program VCL ramp time=1 us, CBL=1 pF, the voltage the bitline has to slew=1 V, then, by equation (2), I=CV/T=1 pF×1 V/1 us=1 uA, which can be 10× the programming current. Hence a method is needed to reduce the transient programming current.

Figure 5C:
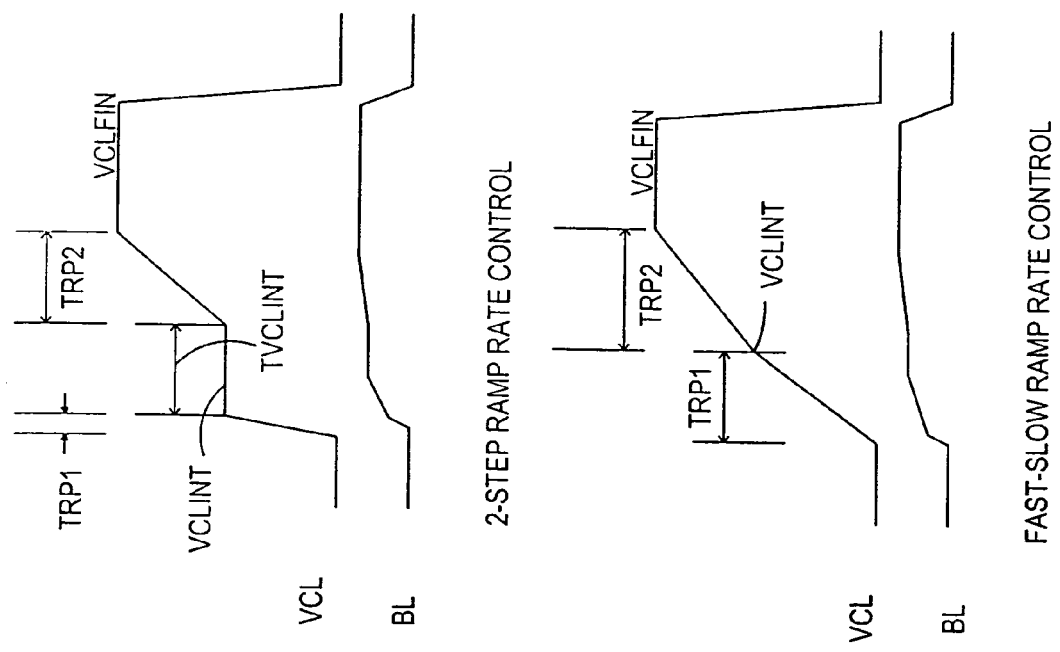
FIG. 5C is a 2-step ramp rate control and fast-slow ramp rate control.

Two approaches are shown in FIG. 5C to reduce this transient phenomenon. In one embodiment, 2-step ramp rate control approach greatly reduces this transient effect without prolonging the programming time as follows. First VCL ramps fast during TRP1 to an intermediate voltage VCLINT, e.g., 2–6 V, then VCL stays at an intermediate voltage for a finite time TVCLINT, then VCL ramps slow during TRP2 to a final voltage VCLFIN. The first fast ramp with the flat intermediate time TVCLINT will let transient current flowing through the cell to stabilize most of the cell capacitances such as CBL in a short time and at sufficiently low VCL voltage so that insignificant programming takes place while the transient current is flowing. The TRP1 is made fast to consume little programming time. The second slow ramp then brings the cell to a final programming voltage without effecting the programming rate since very little current is flowing through the cell in the second ramp.

Another embodiment of the ramp rate control is a fast-slow ramp rate control approach. VCL first ramps fast during TRP1 to an intermediate voltage VCLINT, then VCL ramps slow during TRP2 to a final voltage VCLFIN. The first ramp TRP1 is faster than that of the TRP2 ramp to allow the transient current during the first ramp TRP1 to stabilize not cause significant programming.

The ramp rate can be generated by a RC network, meaning the rate is controlled by a certain capacitance multiplied by a certain resistance, or by a CV/I network, meaning the rate is controlled by a certain capacitance multiplied by a voltage swing divided by a certain bias current. Further, the ramp rate can be programmable by programmable fuses as a function of bitline capacitance to optimize the programming time without introducing adverse transient current. That is the ramp rate is made to be faster for smaller bitline capacitance.

The common line CL0 264 is common to four rows of memory cells for the following reason. Allowing 4 mV voltage drop along the CL line during programming to avoid programming error as described previously, with 1024 cells operating simultaneously with 0.1 ua drawn per cell, the voltage drop by equation (1) is, dVCLP=4 mV=0.5*(1024)(1025) R8cell*0.1 ua, hence R8cell=76 milliohms. For a typical CL line with the line width half as wide as the memory cell, the CL resistance per cell is=~80 milliohms, for 8 cells in series, R8cell is 8×80=640 milliohms, which is much greater than 76 milliohms. Hence by making CL line 264 4 memory cells wide, R8cells is=~80 milliohms. The reason the width of the line CL 264 cannot be made arbitrarily large is due to the program disturb. As the high voltage is applied to CL line 264 in programming, all the cells connected to the CL line 264 will see the VCL voltage whether they are selected for programming or not. The more cells connected to the same CL line, the longer time for the disturb for the unselected cells.

Shown in FIG. 4A are the metal strapping lines CLOS-TRAP 264S and CL3STRAP 269S of the common lines that connect the diffusion common lines to the metal common lines. The metal strapping could be done every 8, 16, or 32 memory cells depending on an allowable voltage drop along the common line diffusion inside the strapping. This voltage drop depends on the diffusion common line resistance for a given operating current.

An alternative method that mitigates the voltage drop problem along the common line in the program cycle is by the constant-total-current-program scheme. Namely by keeping the same total current flowing all the time independent of whether the cells have been verified or not, the common line voltage drop is kept constant during programming. This could be done for example, by adding additional switching transistors in the array every 8, 16, 32, or 64 memory cells and switching into the CL line the current equivalent to the current from verified cells.

Table 1 shows the operating conditions for the memory array in read, erase, and program. The array operating conditions are shown for the cell 200 of the block ARY1BLK 290A in FIG. 4A, of a selected page for read and program. The selected cell 200 is one cell out of 1024 selected cells within a selected page. The other 1023 selected cells belong to the other 1023 ARYSEG0 290 connected horizontally. The array operating conditions are also shown for all cells connected to CL0 264 for erase.

As shown in table 1, the operating conditions are such that all the unselected memory cells see no voltage other than 0 volts. This reduces significantly the power consumption. This is also particularly advantageous for improved speed in very high-density memory chips since all the necessary driver circuits only see the loading from the selected memory cells. The loading from the whole array is tremendous due to large number of transistors in array, i.e., 256 million transistors, with its tremendous diffusion, metal and poly interconnect parasitics. For example, one bitline capacitance, CBL is 25 pF, with 8192 bitline the total bitline capacitance is 8192×25 pF=204 nF. This would require a tremendous amount of power during signal switching, for example, to inhibit all the bitline during programming. Also not shown in Table 1, the unselected control signals ENBLAs, ENBLBs, INHBLAs, and INHBLBs for unselected array units ARYSEG0 290 only see 0 or VDD but not the multiplied high voltage. This again saves significant power and increases speed due to no loading from unselected control circuits.

Another factor that is reduced greatly is the excessive leakage current from the bitline to ground due to junction leakage, bitline to bitline leakage, band-to-band tunneling, and cell subthreshold conduction. For example, for a typical leakage of 10 pA per cell, with 16,384 cells per bitline, the total leakage is 164 nA, which is greater than Ipcell=100 nA. Meaning the multilevel programming will be uncontrolled due to the uncontrollable excessive leakage current contributing to the controlled programming current Ipcell. With the inhibit and segmentation scheme, the total leakage current is reduced to 128×10 pA=1.28 nA, which is much less than Ipcell=100 nA.

Figure 4B:
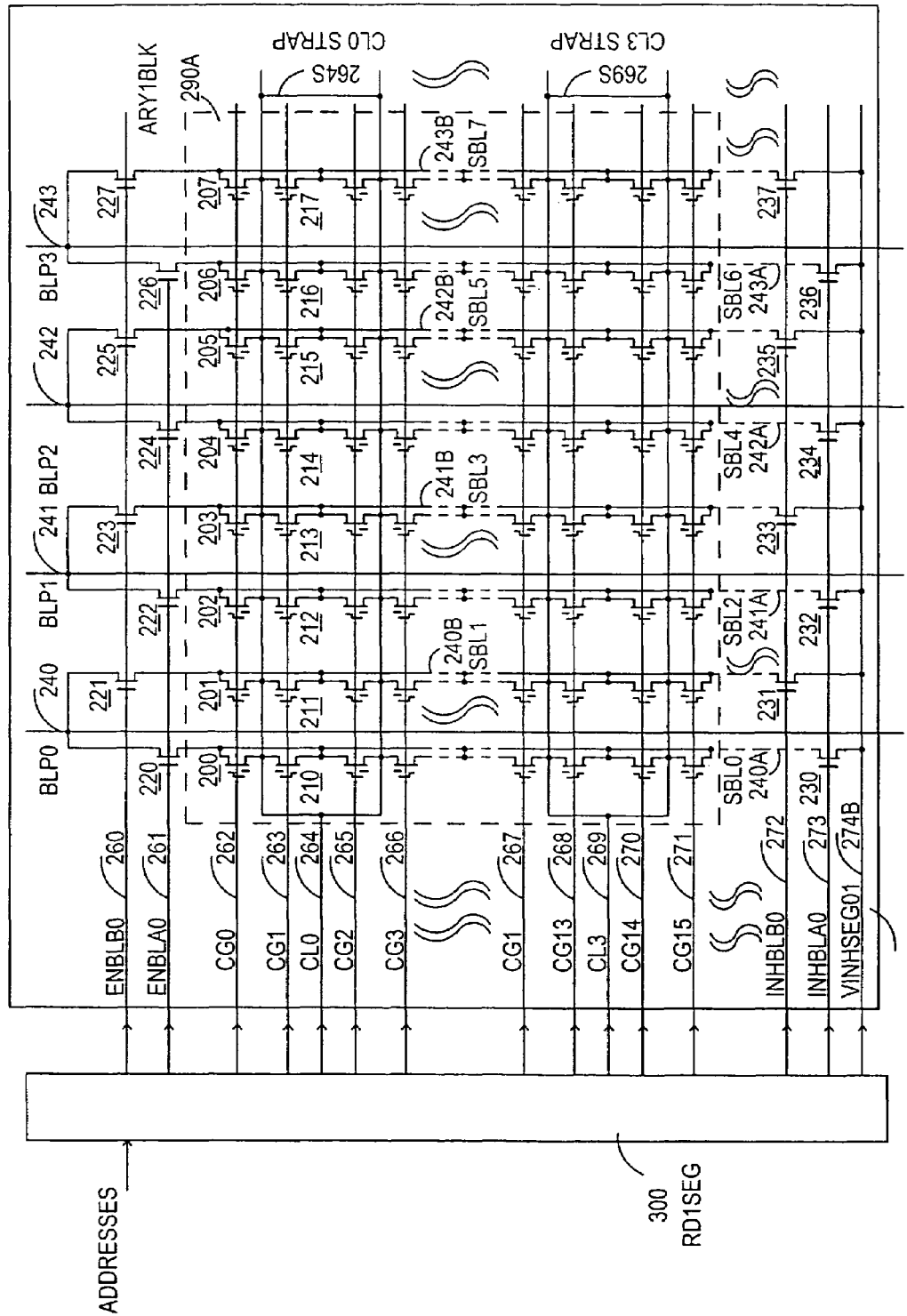
FIG. 4B shows an alternate embodiment of the inhibit and select segmentation scheme.

FIG. 4B shows an alternative array architecture in which the decoded inhibit line VINHSEG01 274B is shared between any two adjacent segments. This has the benefit of reducing the number of inhibit lines in the array.

FIG. 4C shows an alternative array architecture in which the inhibit line VINH 999 is shared for all the segments. This has the benefit of sharing one inhibit line for the whole array.

FIG. 4D shows an alternative array architecture in which a set of inhibit select line INHBLA1–3 and INHBLB1–3 275 to 280 are used to inhibit all segment bitline except the selected segment bitline. VINH 999 is shared for all the segments. The operating method makes use of a segment cascoding scheme that is described as follows. To even isolate the bitline capacitance further, bitline select transistors 220–227 are also used as cascoding transistors in programming in addition to the select and inhibit function. In programming, cell 200 for example, the voltage on line 261 is initially pulsed high to pass inhibit voltage VINH 999 from a page select PSELS 120S into the selected segment bitline SBL0 240A. Then the voltage on line ENBLA0 261 is pulsed to a cascoding voltage VPBCAS, e.g., 1 V. A precharge signal then charges the selected top bitline BLP0 240 to 0.3V. The final voltage on the top bitline BLP0 240 is =~0.3 V since 1V−VT=~0.3 V. Hence the voltage on line BLP0 240 no longer changes during programming. The voltage on the segment bitline, however, still changes as VCL is applied and stabilized. But the capacitance on the segment bitline is minimal,=~0.15 pF. Here the operating method just described could also apply to the array shown in FIG. 4A but the inhibit voltages on the unselected segment bitline are floating. The array shown in FIG. 4D just makes sure all the unselected segments bitline are kept at a constant inhibit voltage VINH 999.

FIG. 4E shows another array suitable for the method just described above. It needs a set of 4 additional lines INH-BLAB0–3 281–284 and a set of 8 additional transistors 240I–247I for inhibit decoding. However additional transistors 240I–247I occupy less die area than that required for additional inhibit decoding lines 275–280 in FIG. 4D.

Figure 4F:
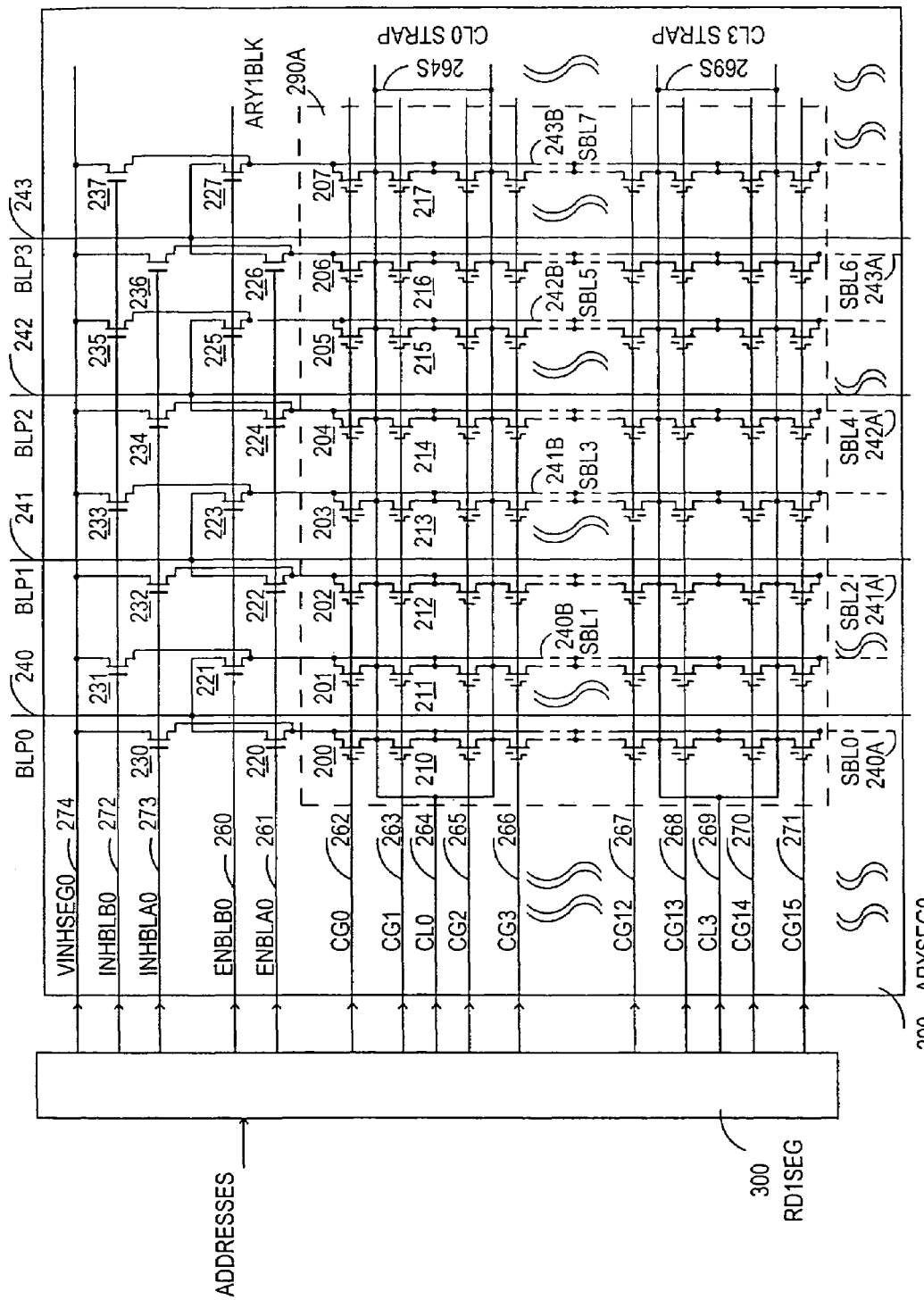
FIG. 4F shows another alternate embodiment of the inhibit and select segmentation scheme.

FIG. 4F shows an array architecture similar to that in FIG. 4A with the inhibit transistors physically at the top of the segment array.

Note that it is possible to do one top bitline per one segmented bitline in the ARYSEG0 290. In this case, the sidewall capacitance from one top bitline to adjacent top bitline increases due to reduced spacing between the top bitline and the adjacent top bitline.

Note that it is also possible to do one top bitline per more than two segmented bitline in the ARYSEG0 290. In this case, more decoding transistors are needed in the array to select one segmented bitline out of more than two segmented bitline, which leads to more die size. However the sidewall capacitance from one top bitline to adjacent top bitline decreases due to increased spacing between the top bitline and the adjacent top bitline. This reduction of capacitance may not be significant if the spacing is already wide enough.

An alternative embodiment of reducing the bitline capacitance is by hierarchical interconnect segmentation that is an extension over the previous concept as follows. A first segment bitline running in first layer of metal couples to a plurality of memory cells. A second segment bitline running in second layer of metal is coupled to a plurality of first segment bitline by bitline segment transistors through vias between metal 1 and metal 2. Third segment bitline running in third layer of metal is coupled to a plurality of second segment bitline by other bitline segment transistors through vias between metal 1 and metal 2 and metal 3. This can continue to higher metal layers. This approach allows optimization of horizontal spacing, vertical spacing, interconnect width, and interconnect length between different layers of interconnect metals for minimum capacitive coupling between metal interconnect lines. This results in further reduced bitline capacitance.

TABLE 1

Array Operating Conditions.

| | READ | ERASE | PROGRAM |
|---|---|---|---|
| SELECTED SEGMENTS: | | | |
| CG0 | 3–6 V | 8–13 V | 0.7–2.5 V |
| CG1, 2, 3 | 0 | 8–13 V | 0 |
| CG4–15 | 0 | 0 | 0 |
| Rest of all CG lines | 0 | 0 | 0 |
| CL0 | 2–3 V | 0 | 4–13 V |
| CL1, 2, 3 | 0 | 0 | 0 |
| Rest of all CL lines | 0 | 0 | 0 |
| BL0, 8, 16 ... | 0 TO 2–3 V | FL or 0 V | 0–0.8 V |
| BL1–7, 9–15, 17–23, ... | VINH | VINH | VINH |
| UNSELECTED SEGMENTS: | | | |
| All CG lines | 0 V | 0 V | 0 V |
| All CL lines | 0 V | 0 V | 0 V |
| All BL lines | 0 V | 0 V | 0 V |

Figure 6:
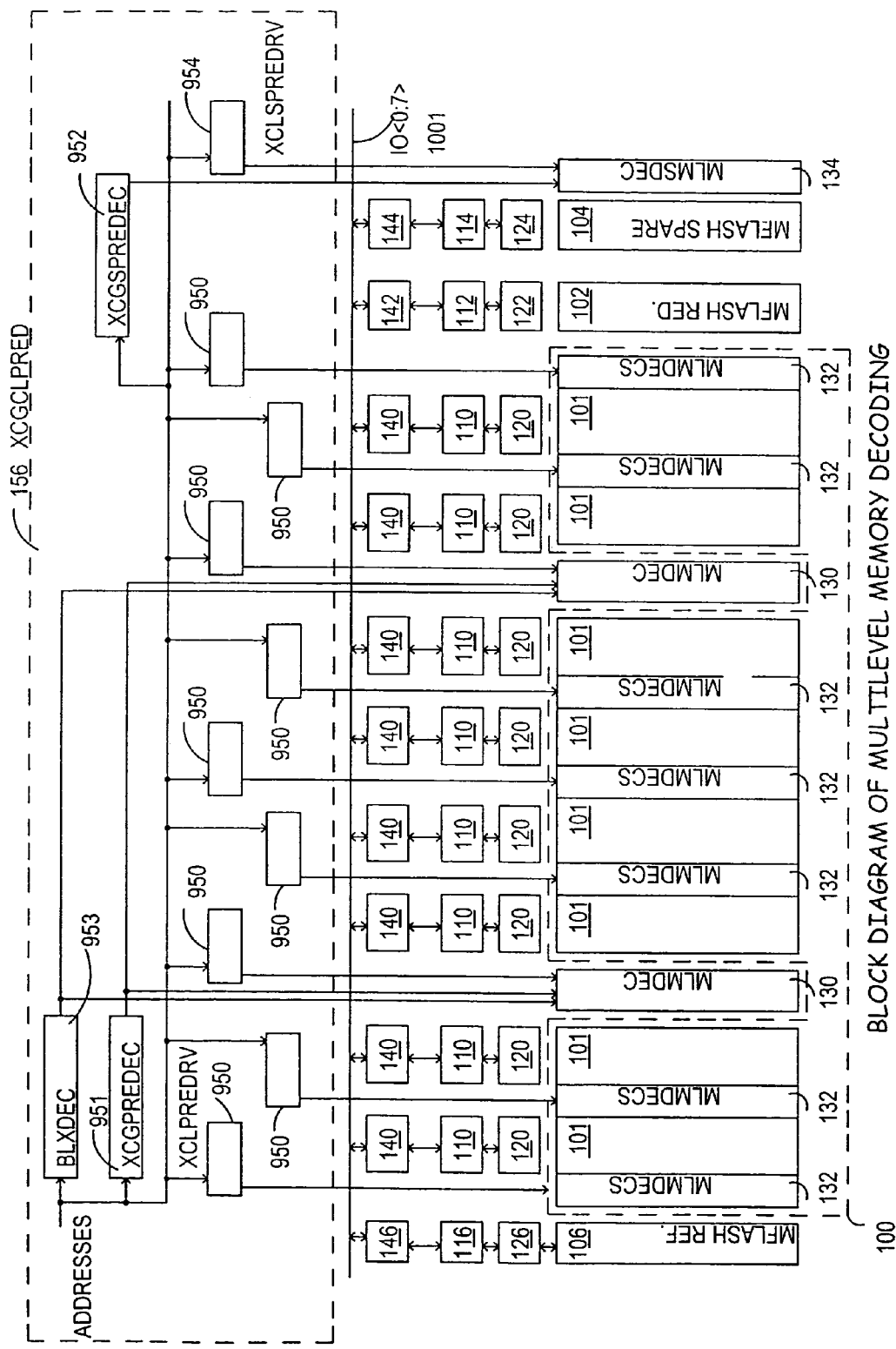
FIG. 6 shows a block diagram of multilevel decoding.

Multilevel Memory Decoding:

FIG. 6 shows the block diagram of the multilevel decoding scheme. The invention provides precision voltages with millivolt control tolerances to the memory array over temperature, process corners, and power supply variation. The invention provides these voltages in an efficient manner, meaning deliver power where it is needed and reducing the output loading through circuit configuration. The invention also provides a multilevel precision decoding circuit with minimum area overhead.

As discussed in the array architecture section, the voltage drop along the common line would cause a programming error as well as sense error in read. Hence the drop is brought down to a manageable level. By partitioning a common line into small line sections, with drivers on both sides of each of the line sections, the voltage drop is reduced. However, prior art partition would cause a tremendous area penalty due to the large amount of decoding lines and circuits. This invention provides an enhanced decoding circuit by routing the interconnect in the higher metal layers and by using circuit configurations suitable for multilevel decoding.

The block VCGCLPRED 156 has been expanded to include sub-blocks inside. Common line predecoder and driver XCLPREDRV 950 provide predecoded common lines with precision voltages to regular memory common lines in block 130 and 132. A common line predecoder and driver XCLSPREDRV 954 provides predecoded common lines with precision voltages to spare memory common lines in block 134. The circuit block 954 is functional equivalent to circuit 950. A control gate predecoder XCGPREDEC 951 provides predecoded control gate lines to block 130. A spare control gate predecoder XCGSPREDEC 952 provides predecoded control gate lines to block 134. A bitline predecoder BLXDEC 953 provides predecoded bitline to block MLMDEC 130. All other circuit blocks have been described in association with FIG. 2A.

Figure 7:
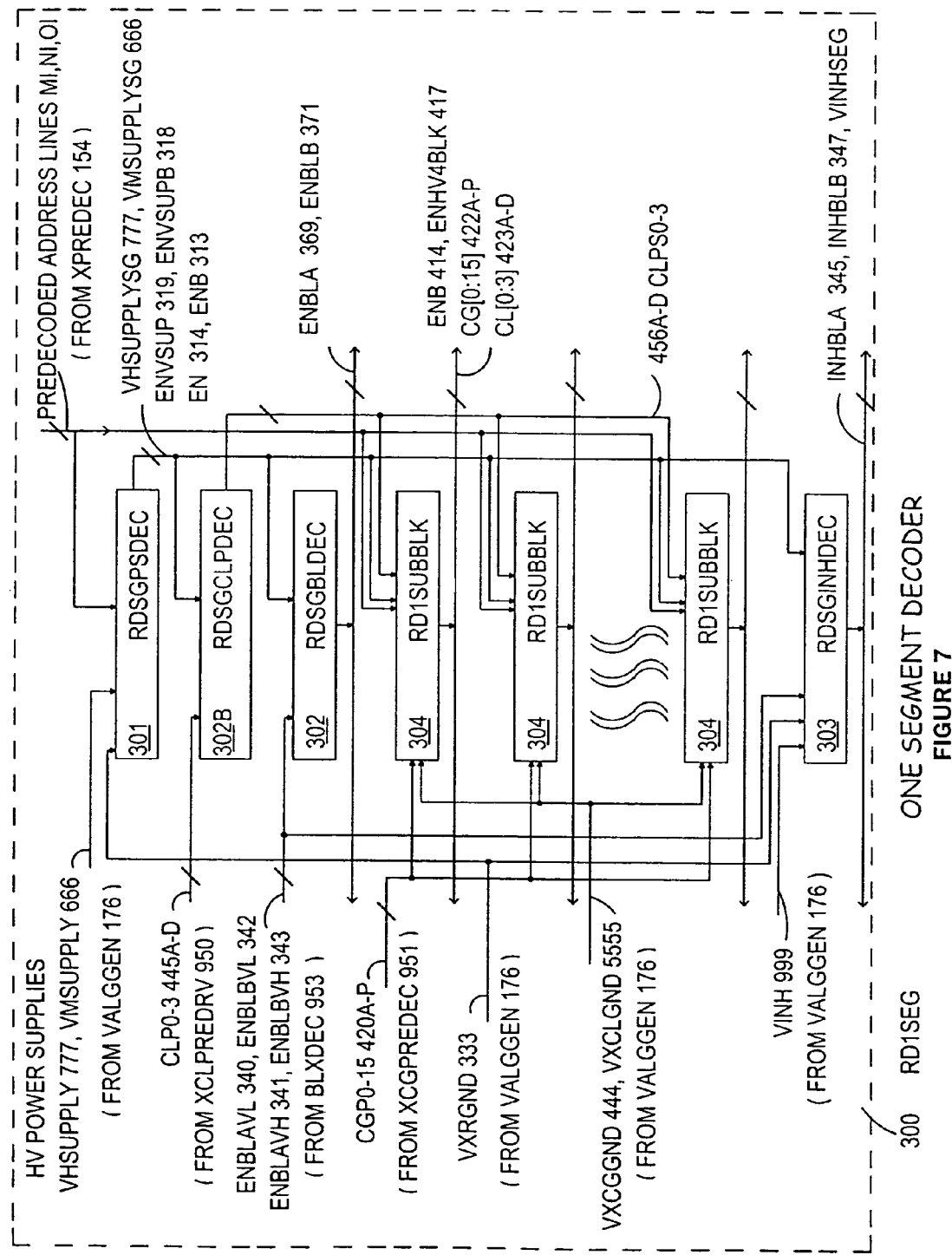
FIG. 7 shows one segment decoder that includes segmented power supply decoder, segmented bitline select decoder, inhibit decoder, segmented predecoded common line decoder, and control gate and control line decoder.

FIG. 7 shows one segmented decoder RD1SEG 300. The RD1SEG 300 selects or deselects a plurality of basic array unit ARYSEG0 290 connected horizontally. The RD1SEG 300 includes a circuit segmented supply decoder RDSGPSDEC 301, a segmented bitline decoder RDSGBLDEC 302, a segmented common line pre-decoder RDSGCLPDEC 302B, a segmented inhibit decoder RDSGINHDEC 303, and multiples of a sub-block decoder RD1SUBBLK 304. The RDSGPSDEC 301 decodes the high voltage supply for each segmented decoder RD1SEG 300. The high voltage supplies for the unselected segmented decoders RD1SEG 300 are disabled and hence power is minimized due to much less loading and die size is reduced due to a smaller voltage multiplier. The RDSGBLDEC 302 couples the segment bitline to the top bitline when selected. The RDSGINHDEC 303 couples the inhibit voltage VINH 999 to the appropriate bitline of the selected array units ARYSEG 290 when selected or unselected as described later in FIG. 9B. The RDLSUBBLK 304 enables appropriate control gates and common lines for the memory cells.

Figure 8:
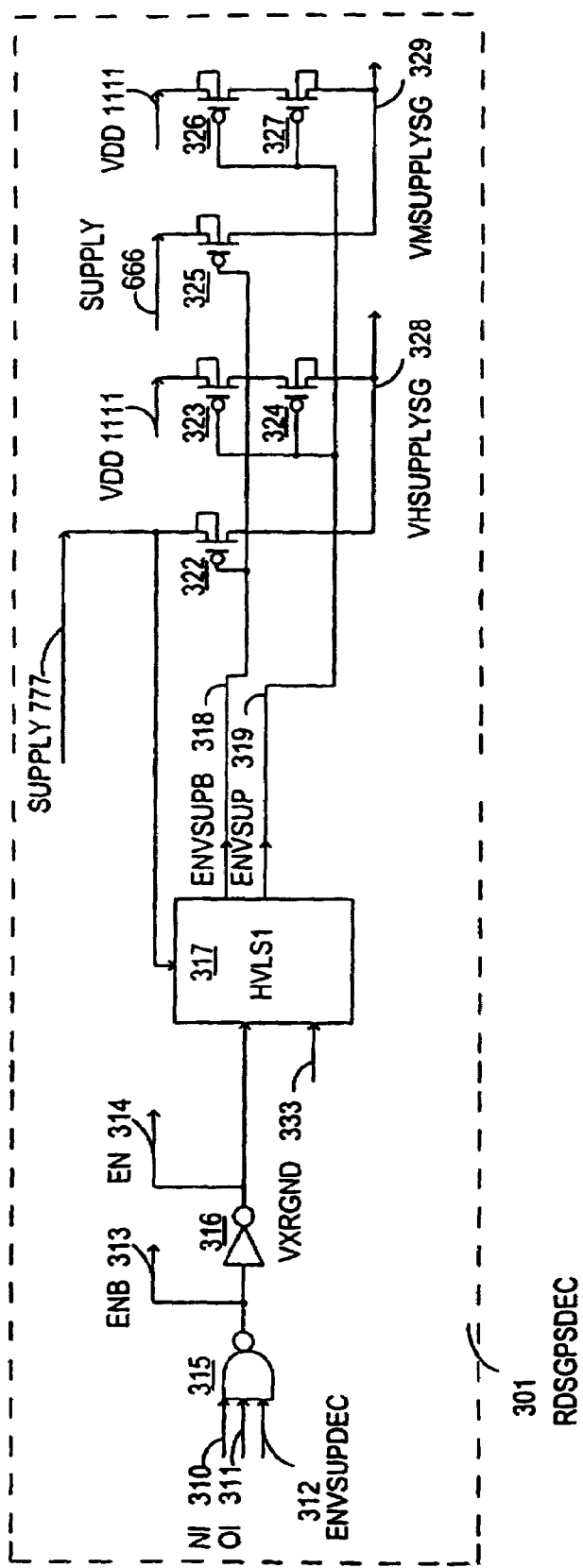
FIG. 8 shows a segmented power supply decoder.

FIG. 8 shows details of the power supply decoder RDSGPSDEC 301. Line NI 310 and OI 311 are predecoded address lines coming from the address predecoder block XPREDEC 154. Line ENVSUPDEC 312 is a global enable signal for disabling or enabling all the supply decoders. A NAND gate 315 is a typical 3-input NAND gate with an output line ENB 313. An inverter 316 is a typical inverter with input line ENB 313 and an output line 314. A high voltage level shifter HVLS1 317 shifts logic signal EN 314 into high voltage complementary output signal lines ENVSUPB 318 and ENVSUP 319. A line VXRGND 333 is a low voltage line for HVLS1 317. A line VHSUPPLY 777 is a precisely regulated high voltage supply for the decoding. A line VMSUPPLY 666 is another precisely regulated high voltage supply. A transistor PMOS 322 couples the high voltage supply VHSUPPLY 777 into line VHSUPPLYSG 328 when the RDSGPSDEC 301 is selected. Transistors PMOS 323 and 324 couple regular voltage supply VDD 1111 into line VHSUPPLYSG 328 when the RDSGPSDEC 301 is deselected. A transistor PMOS 325 couples another high voltage supply VMSUPPLY 666 into line VMSUPPLYSG 329 when the RDSGPSDEC 301 is selected. The voltage level on line VMSUPPLY 666, e.g., 5–10V, is such that in read the bitline select transistors in the memory array are heavily overdriven to reduce their on resistance, which results in insignificant sense error. Transistors PMOS 326 and 327 couple regular voltage supply VDD 1111 into line VMSUPPLYSG 329 when the RDSGPSDEC 301 is deselected. The PMOS 323 and 326 have their wells connected to line VDD 1111. The PMOS 324 and 327 have their wells connected to the VHSUPPLYSG 328 and VMSUPPLYSG 329 respectively. The connection of their wells is done to avoid source and drain junction diodes turning on during the switching.

Figure 9A:
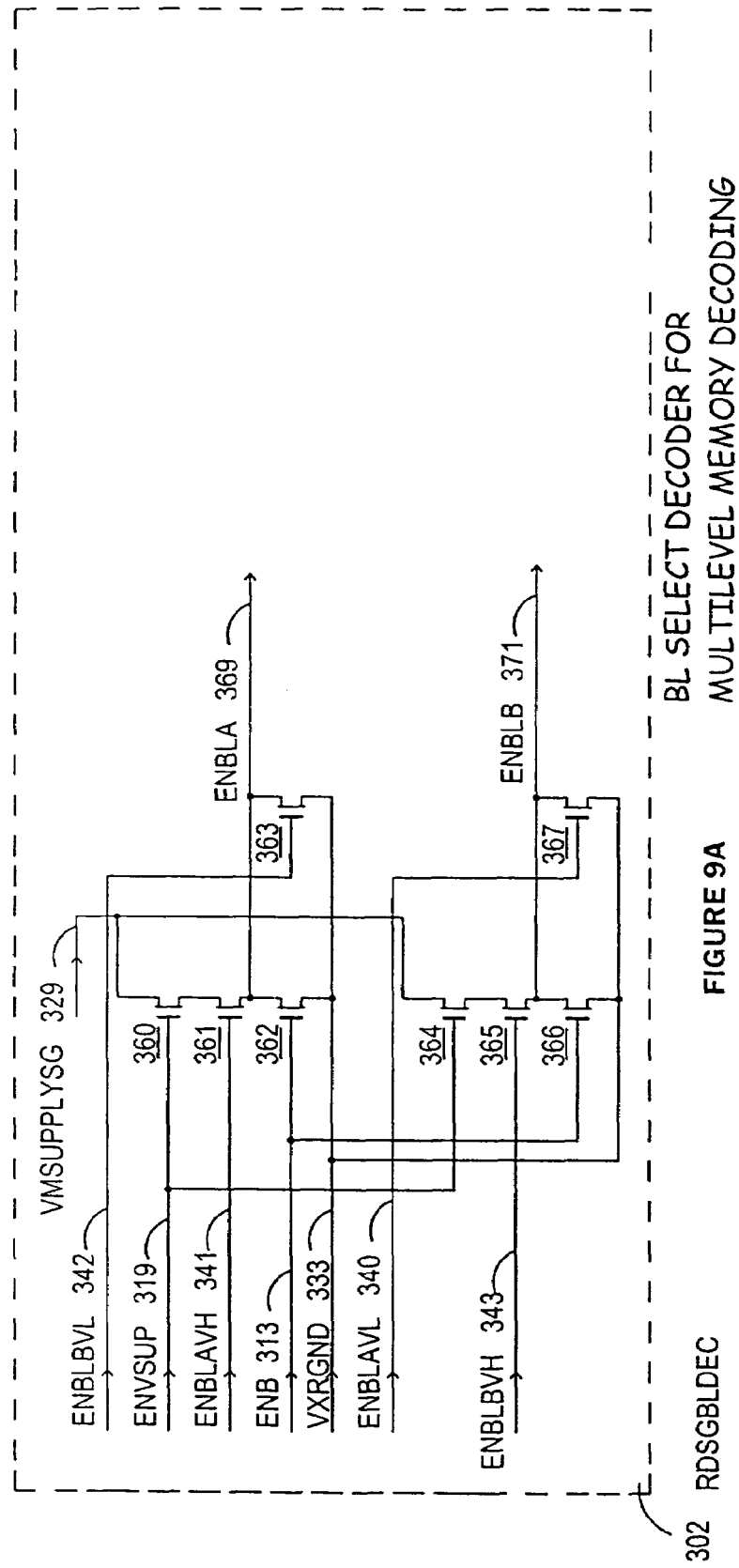
FIG. 9A shows a segmented bitline decoder.

FIG. 9A shows details of the segmented bitline select decoder RDSGBLDEC 302. Line ENVSUP 319 and line ENBLAVH 341 connected to the gates of transistors 360 and 361 respectively are used to couple voltage on line VMSUPPLYSG 329 into line ENBLA 369. Either transistor 362 with line ENB 313 on its gate or transistor 363 with line ENBLBVL 342 on its gate is used to couple line ENBLA 369 to line VXRGND 333. Similarly transistors 364 and 365 together with lines ENVSUP 319 and line ENBLBVH 343 respectively on their gates are used to couple voltage on line VMSUPPLYSG 329 into line ENBLB 371. Either transistor 366 with line ENB 313 on its gate or transistor 367 with line ENBLAVL 340 on its gate is used to couple line ENBLB 371 to line VXRGND 333. The voltage level on line VHSUPPLY 777 in the block RDSGPSDEC 301, e.g., 7–12 V, is such that the transistors 360, 361, 364, 365 couple, with minimal loss, the voltage from VMSUPPLYSG 329 into lines ENBLA 369 and ENBLB 371. The deselect transistors 362, 363, 366, and 367 have their gates coupled only to the low voltage signals instead of the high voltage control signals as conventionally done. This circuit configuration has the benefit of reducing significantly the loading for the high voltage supply VHSUPPLY 777. This circuit configuration is applied throughout all the decoding circuits.

Figure 9B:
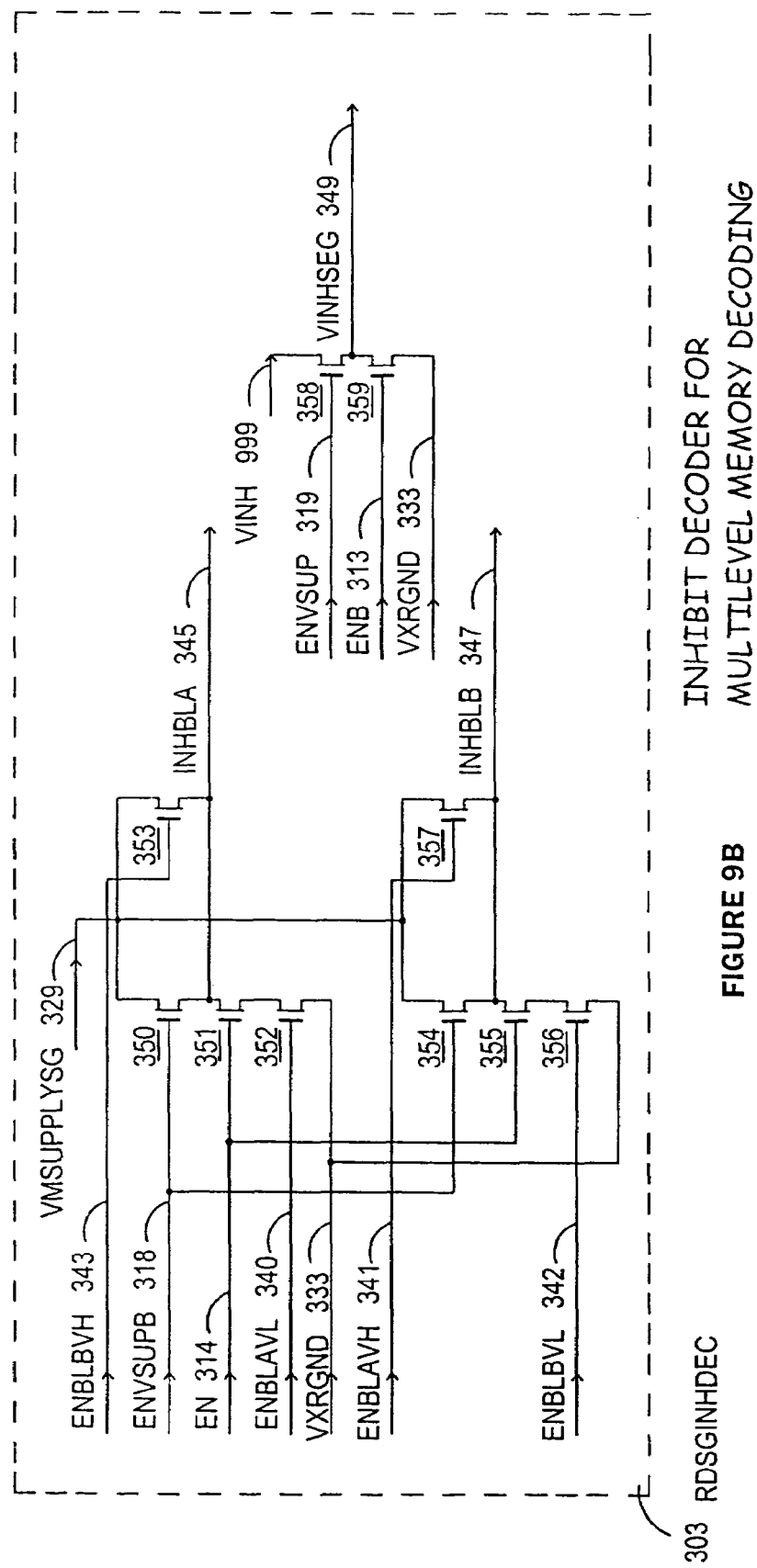
FIG. 9B shows a segmented inhibit decoder.

FIG. 9B shows details of the segmented inhibit select decoder RDSGINHDEC 303. Either transistor 350 with line ENVSUPB 318 on its gate or transistor 353 with line ENBLBVH 343 on its gate couples the voltage on line VMSUPPLYSG 329 to line INHBLA 345. Transistors 351 and 352 together with lines EN 314 and ENBLAVL 340 respectively on their gates are used to couple line INHBLA 345 to line VXRGND 333. Similarly either transistor 354 with line ENVSUPB 318 on its gate or transistor 357 with line ENBLAVH 341 on its gate is used to couple the voltage on line VMSUPPLYSG 329 to line INHBLB 347. Transistors 355 and 356 together with lines EN 314 and line ENBLBVL 342 respectively on their gates are used to couple line INHBLB 347 to line VXRGND 333. Transistor 358 with line ENVSUP 319 on its gate is used to couple the inhibit voltage on line VINH 999 to line VINHSEG 349. Transistor 359 with line ENB 313 on its gate is used to couple the voltage on line VINHSEG 349 to line VXRGND 333. Similar to the circuit configuration in the RDSGBLDEC 302, the low voltage signals are used for signal deselection.

The circuit blocks RDSGPSDEC 301, RDSGBLDEC 302, RDSGINHDEC 303, and RDLSUBBLK 304 are used in the array as shown in FIG. 4A for array selection and inhibit decoding.

Figure 9C:
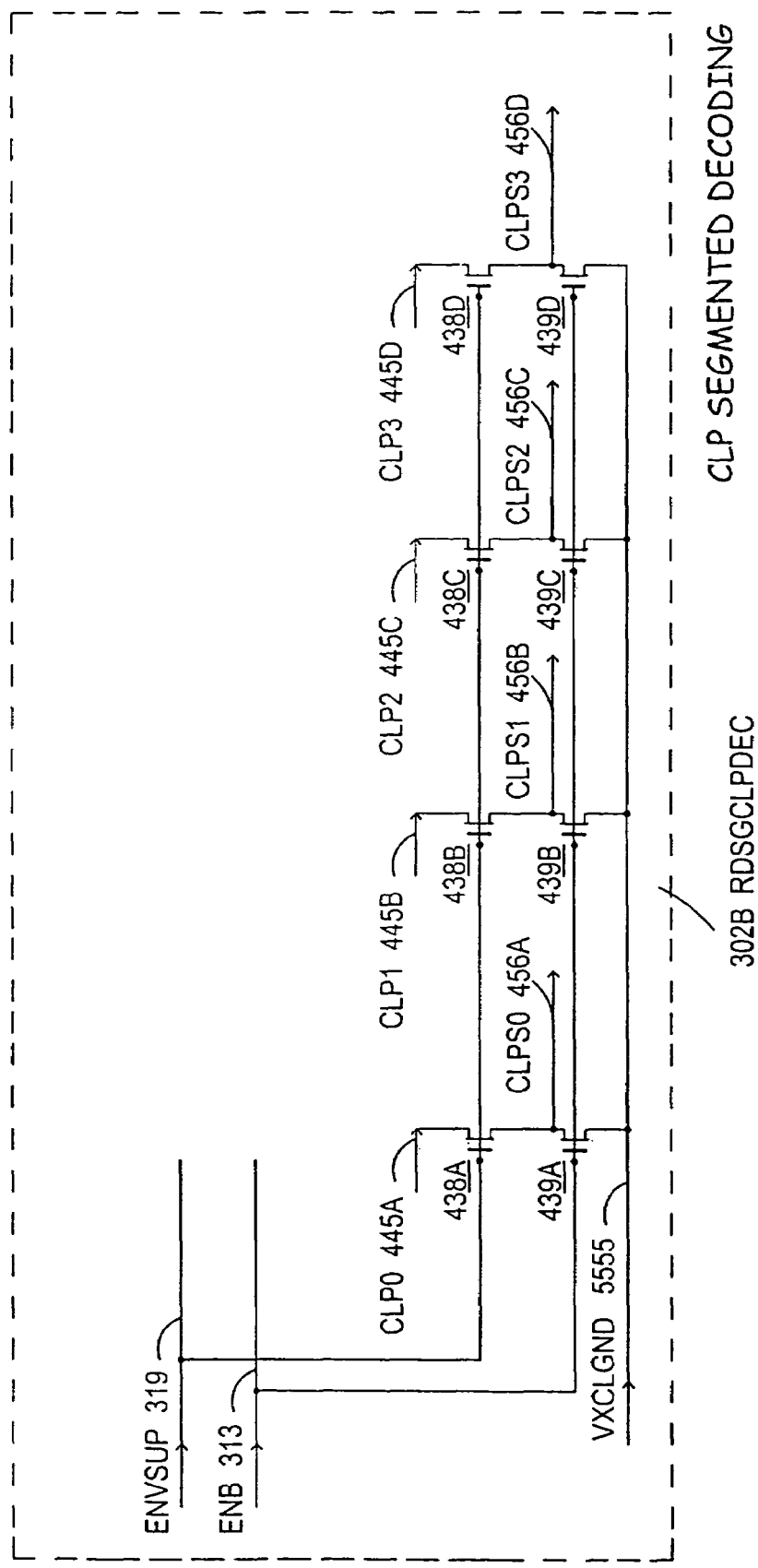
FIG. 9C shows a segmented predecoded common line decoder.

FIG. 9C shows a predecoded common line segmented decoder RDSGCLPDEC 302B for lines CLP0–3 445A–D. Lines CLP0–3 445A–D come from a common line pre-decoder XCLPREDRV 950. The purpose of this circuit RDSGCLPDEC 302B is to greatly reduce the capacitive loading on lines CLP0–3 seen by the common line pre-decoder XCLPREDRV 950. Lines CLPS0–3 456A–D are the output lines. Transistors 438A–D with line ENVSUP 319 on their gates are used to couple lines CLP0–3 445A–D to lines CLPS0–3 456A–D respectively. Transistors 439A–D with line ENB 313 on their gates are used to couple lines CLPS0–3 456A–D to line VXCLGND 5555. This concept of segmented loading could also be applied to predecoded control gates CGP0–15.

Figure 10:
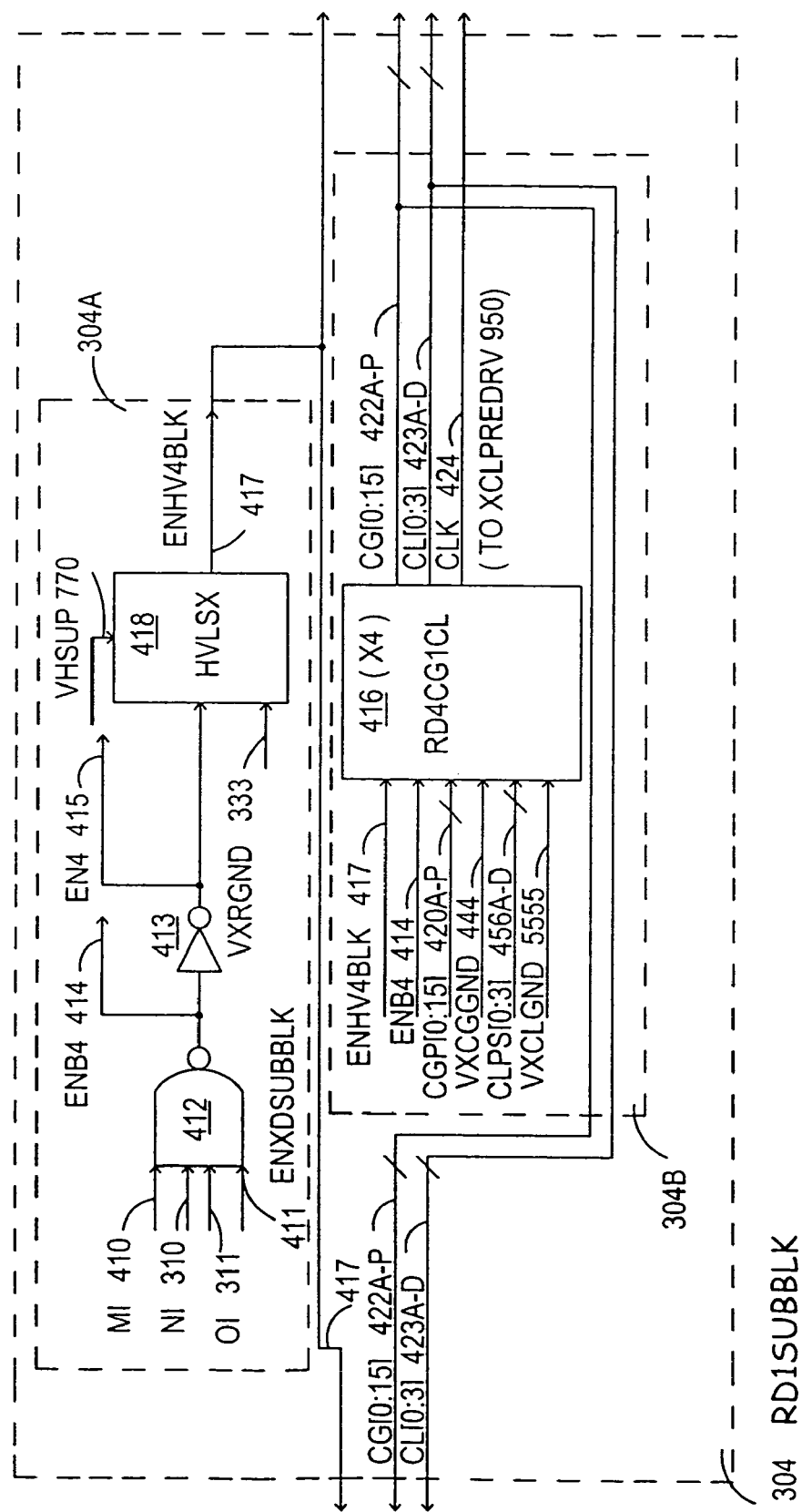
FIG. 10 shows a sub-block decoder for control gate and common line multilevel decoder.

FIG. 10 shows details of the sub-block decoder RDLSUBLK 304, that includes a circuit block 304A and a circuit block 304B. The block 304A includes a NAND gate 412, an inverter 413, and a high voltage level shifter HVLSX 418. The 3-input NAND gate 412 is used for address decoding. Line ENB4 414 is its output. Lines MI 410, NI 310, and OI 311 are predecoded address lines coming from the address pre-decoder XPREDEC 154. The inverter 413 inverts line ENB4 414 into line EN4 415. The high voltage level shift HVLSX 418 is used to shift the logic signal EN4 415 into the high voltage output signal ENHV4BLK 417. Line VHSUP 770 supplies high voltage for the level shifter HVLSX 418. Line VHSUP 770 couples to line VHSUPLYSG 328 of circuit block RDSGPSDEC 301. The circuit block 304B including a set of four circuit blocks RD4CG1CL 416 provides control signals for control gates CG and common lines CL. Lines CG[0:15] 422A–P couple to 16 rows of memory cells, for example, lines 262,263, 265–268,270,271 of the block ARY1BLK 290A in FIG. 4A. Lines CL[0:3] 423A–D couple to 4 shared common lines of memory cells, for example, lines 264 and 269 of the block ARY1BLK 290A in FIG. 4A. Lines CGP[0:15] 420A–P are predecoded control gate lines coming from the control gate pre-decoder XCGPREDEC 951. Lines CLPS[0:3] 456A–D are predecoded common lines coming from block RDSGCLPDEC 302B. Line VXCGGND 444 is a line for control gate CG deselection. Line VXCLGND 5555 is a line for common line CL deselection.

Figure 11A:
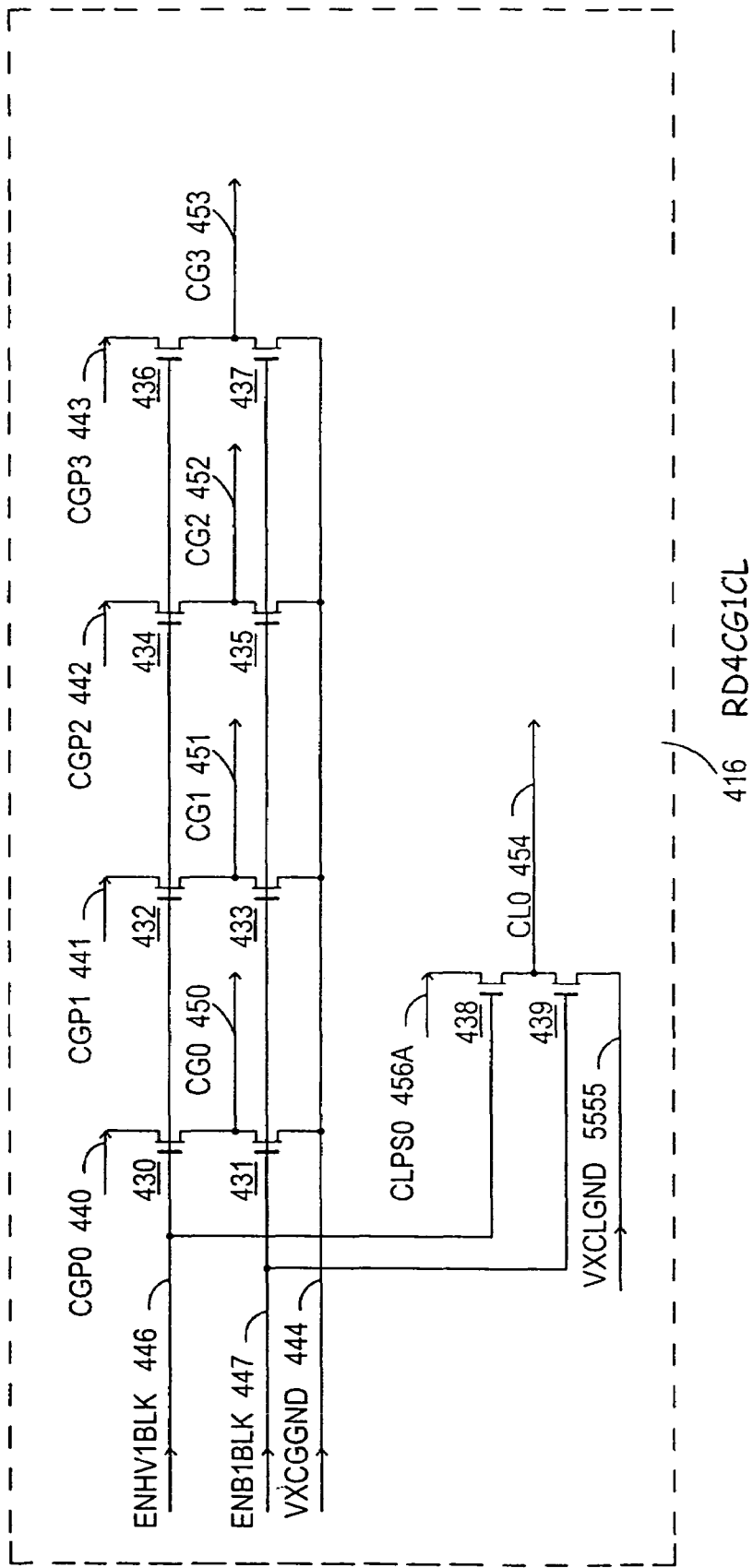
FIG. 11A shows a sub-block of the circuit in FIG. 10 for four control gates and one common line multilevel decoder.

FIG. 11A shows details of circuit block RD4CG1CL 416. Transistors 430, 432, 434, 436 together with lines CGP0 440, line CGP1 441, line CGP2 442, line CGP3 443 respectively on their drains are used to couple these lines 440–443 to output line CG0 450, line CG1 451, line CG2 452, and line CG3 453 respectively. Lines CGP0–CGP3 440–443 come from a control gate predecoder XCGPREDEC 951. Transistor 438 is used to couple line CLPS0 456A to line CL0 454. Transistor 439 is used to couple line CL0 454 to line VXCLGND 5555. Line ENHV1BLK 446 couples high voltage into the gates of transistors 430, 432, 434, and 436. Line ENB1BLK 447 couples lines CG0–3 450–453 to the line VXCGGND 444 through transistors 431, 433, 435, and 437 respectively and couples line CL0 454 to line VXCLGND 5555 through transistor 439. The lines ENHV1BLK 446 and ENB1BLK 447 are coupled respectively to lines ENHV4BLK 417 and ENB4 414 generated by circuit block 304.

Four common lines of memory cells are coupled together to one decoded common line CL as shown in the block ARYSEG0 290 in FIG. 4A. Four blocks of the RD4CG1CL 416 are used to provide array block selection as shown in the block ARYSEG0 290 in FIG. 10. One array block is defined as including 16 rows and 4 common lines of memory cells. One array block includes a plurality of blocks ARY1BLK 290A connected horizontally.

The lines VXRGND 333, VXCLGND 5555, and VXCGGND 444 could be individually controlled to be biased at different voltage levels during erase, read, and program to optimize circuit functionality, for instance, to increase the breakdown or to reduce the leakage of MOS decoding transistors.

Note that the same transistors are used for decoding in erase, read, and program operation. In conventional decoding, read decoding is isolated from erase and program decoding since read decoding requires only low voltage and hence the decoding size can be optimized for read speed. Here all decoding is combined together to minimize the die size. Further all decoding is done by NMOS transistors instead of by both PMOS and NMOS transistors as conventionally done. This has the benefit of reducing the capacitive loading. This is so because in deselection one PMOS presents itself as a gate capacitor load while one NMOS only presents itself as a source or drain overlap capacitor load, which is much smaller than a gate capacitor load. Low capacitive loading leads to less power consumption for NMOS decoding. This is against conventional wisdom, which holds that a CMOS circuit is more power efficient than a NMOS circuit.

Figure 11B:
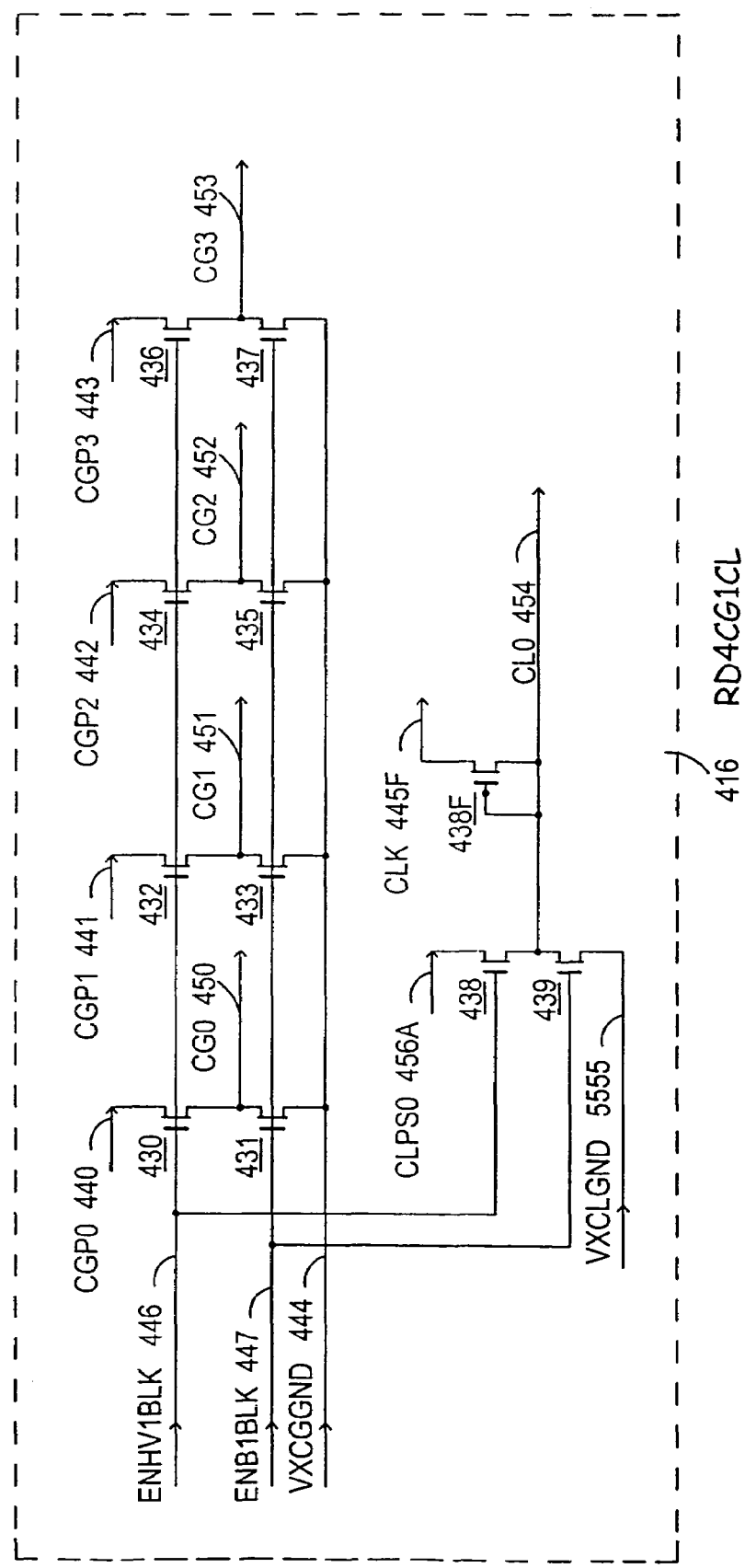
FIG. 11B shows another embodiment of sub-block for four control gates and one common line multilevel decoder with winner-take-all Kelvin connection.

FIG. 11B shows an alternative circuit block RD4CG1CL 416 with a diode-connected transistor 438F. The transistor 438F provides feedback signal CLK 445F for a Kelvin type connection to a circuit driver inside the block XCLPREDRV 950. A Kelvin connection line consumes minimal (or no) DC current. A Kelvin connection allows a circuit driver such as a common line circuit driver to stabilize its output signal at a desired voltage level based on feedback voltage from the Kelvin connection line. This Kelvin connection line CLK 445F is connected to other Kelvin connection lines vertically. This is possible since only one common line is on at any given time. Once a common line is selected, this common line will take control of the CLK 445F line since the diode-connected transistor will be forward biased and other diode-connected transistors on the rest of the common lines will be reverse biased. This will be known as winner-take-all Kelvin decoder. This winner-take-all Kelvin decoder will ensure a predetermined voltage on the line CL0 454 will be stable all the time over varying load, process corners, temperature, and power supply variation with minimum cost. The stable voltage on the common line is required to not introduce significant voltage error in program or in read as described previously in the description of the multilevel array architecture.

Figure 11C:
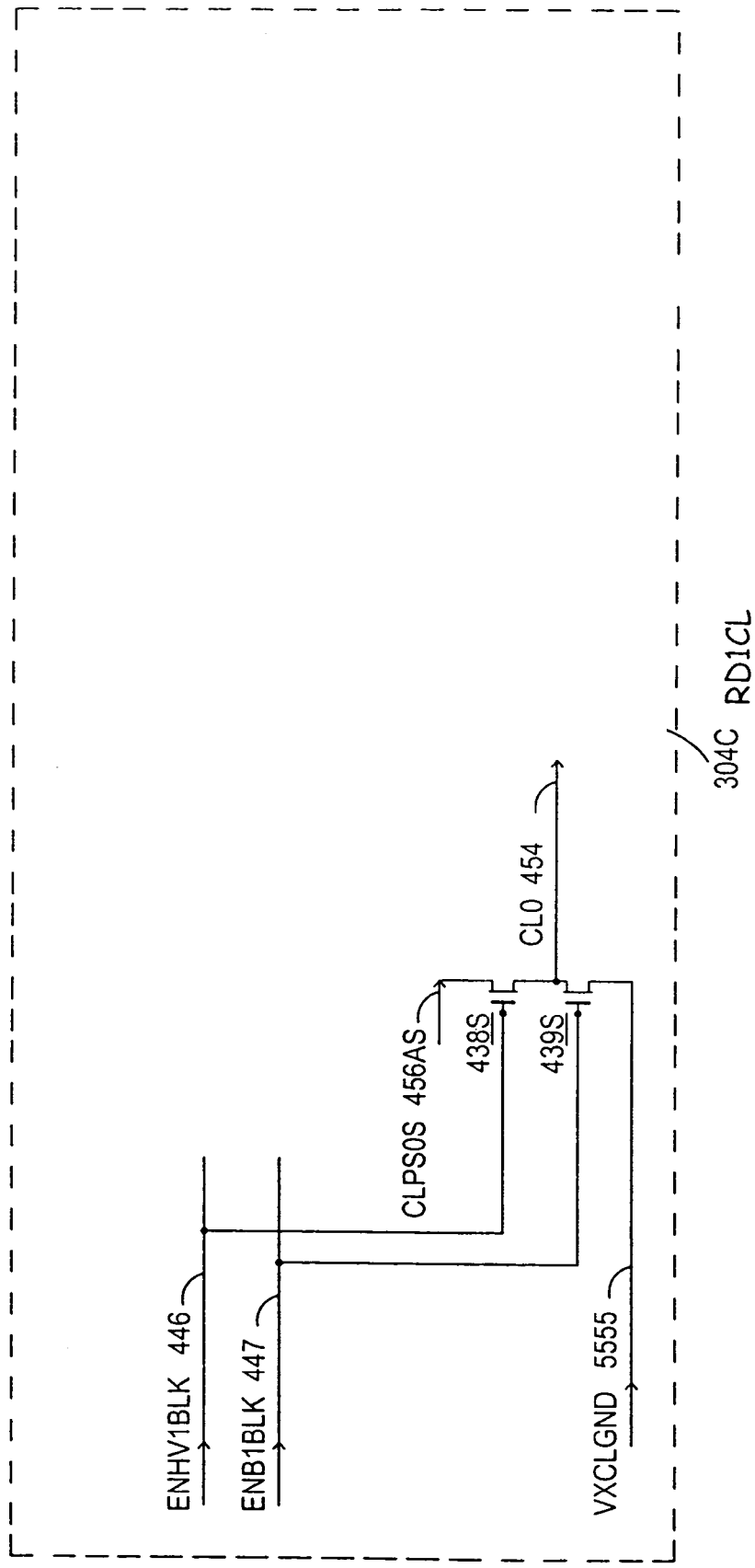
FIG. 11C shows a circuit for one common line driver.
Figure 12:
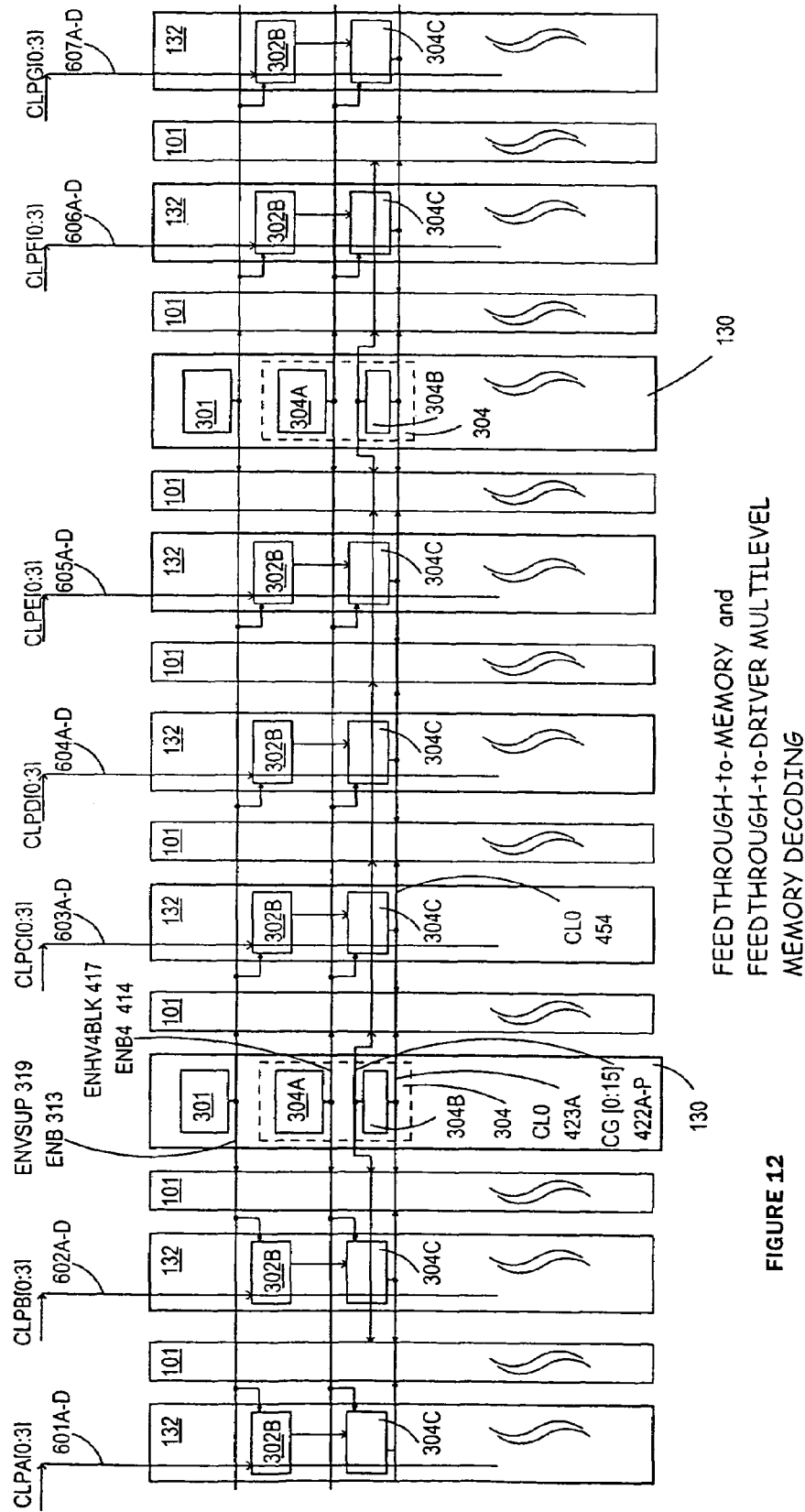
FIG. 12 shows a scheme of the feedthrough-to-driver and feedthrough-to-memory multilevel precision decoding.

FIG. 11C shows a circuit block RD1CL 304C, which is used in a common line segmentation scheme with the array partitioning shown in FIG. 12 to reduce the voltage drop along the common lines. In an embodiment, one common line CL is connected together across the full array with a plurality of blocks RD1CL 304C driving the same common line CL. Transistor 438S with line ENHV1BLK 446 on its gate couples line CLPS0S 456AS to line CL0 454. Line CL0 454 of this circuit block 304C is the same line CL0 454 of the circuit block RD4CG1CL 416. A deselect transistor 439S with line ENB1BLK 447 couples line CL0 454 to line VXCLGND 5555. The transistor 439S is optional in this circuit since the function of coupling line CL0 454 to line VXCLGND 5555 is already provided by the transistor 439 in the RD4CG1CL 416. The transistor 439S provides additional drive ability in addition to that of the transistor 439. Line CLPS0S 456AS couples to a common line pre-decoder XCLPREDRV 950. The winner-take-all Kelvin decoding can also be used here. The control signals ENHV4BLK 417 and ENB4 414 shown in the block RD1SUBBLK 304 couple to control signals ENHV1BLK 446 and ENB1BLK 447 respectively. The control signals ENHV4BLK 417 and ENB4 414 are fed through the memory array as shown in FIG. 12. In an alternate embodiment, one common line is divided into many separate common lines across the full array. These separate common lines are not connected to each other. In this case, each separate common line is driven on both sides by two blocks RD1CL 304C or by a RD1CL 304C and a RD4CG1CL 416. Common line segmentation is described more in detail below in description associated with FIG. 12.

FIG. 12 shows a feedthrough-to-memory and feedthrough-to-driver scheme together with the common line segmentation to deliver precise voltages for memory cells as described in the following. The feedthrough scheme exploits the multi-layer metal interconnect to reduce the circuit complexity and die size and to enable innovative circuit configurations. A conventional flash memory system typically only uses up to a maximum of 2 metal layers and hence is limited in core interconnect scheme possibilities. This feedthrough scheme is made possible by three or more metal layers.

The block MLMDECS 132, shown in FIG. 12 and also in FIG. 3A, includes a plurality of the blocks RDSGCLPDEC 302B and a plurality of the blocks RD1CL 304C. Only one block RDSGCLPDEC 302B and one block RD1CL 304C per block 132 are shown in FIG. 12 for clarity. Other blocks have similar connections. The block MLMDEC 130, shown in FIG. 12 and also in FIG. 3A, includes a plurality of the blocks RD1SEG 300. The block RD1SEG 300 includes a block RDSGPSDEC 301 and a plurality of blocks RD1SUBBLK 304. Only the block RDSGPSDEC 301 and one block RD1SUBBLK 304 inside one block RD1SEG 300 are shown in FIG. 12 for clarity. Other blocks have similar connections.

The feedthrough-to-memory uses a single driver to drive both left and right sides of a memory array. The layout of row decoding circuits such as of the block RD1SUBBLK 304 is very dense because of the limited height of a typical advanced memory cell, e.g., 0.5–1 um per cell height, and the very wide width of each decoding transistor, e.g., 20–50 um, due to their required precision multilevel drive ability. This makes it extremely difficult to route the required lines from the right side across the active circuit of this row decoding circuit to the left side with limited layers of metal interconnect. As shown in FIG. 10, the control lines CG[0:15] 422A–P and common lines CL [0:3] 423A–D provides the control signals to the memory cells on the right side as well as the memory cells on the left side. This is also shown in FIG. 12 in block 304B with lines pointing to the right as well as to the left. Similarly it also shows the control lines from circuit block 304A and 304C driving both sides. The feedthrough-to-memory scheme also shows predecoded high voltage lines ENHV4BLK 417 and ENVSUP 319 and predecoded low voltage lines ENB 313 and ENB4 414 being fed through the memory by running on top of the memory, for example, in metal 4, without interfering with the memory cells underneath. Other control lines could also be fed through the memory. Again this is achievable by three or more metal layers which allow a different circuit configuration with minimal active area. The circuit block 304C is the precision voltage driver for the common lines CL of the memory cells in addition to the circuit block 304B. The feedthrough-to-driver scheme shows control signals from circuit blocks 304B and 304A being fed through the memory array to the precision voltage drivers 304C.

The common line segmentation is also shown in FIG. 12. Each metal common line runs the length of the memory core horizontally across the full array with seven circuit blocks RD1CL 304C and two circuit blocks RD1SUBBLK 304 driving the same common line. The voltage drop across one common line is thus divided into eight voltage drop segments. Each voltage drop segment belongs to each common line of each sub-array block MFLSUBARY 101. Within each voltage drop segment, the voltage value on the left side is same as the voltage value on the right side of the voltage drop segment and the lowest voltage value is in the middle of the voltage drop segment. This is because there is a precision circuit driver RD1CL 304C or RD4CG1CL 416 on each side of the voltage drop segment. One alternative embodiment of the common line segmentation scheme is to have these common lines physically divided into eight separate common lines. That is, each sub-array block MFLSUBARY 101 shown in FIG. 12 has its separate common line. However, in this case, the deselect transistor 439S in the block RD1CL 304C is no longer optional but necessary to deselect each separated common line.

The voltage level on the control gates is controlled by the voltage on the lines CGP[0:15] 420A–P in circuit block 304. The voltage on lines CGP[0:15] 420A–P are in turn controlled by a precise bandgap-referred regulated voltage. Hence precision voltage level is provided at the memory control gates. The voltage level on the common lines is controlled by the voltage on the predecoded common lines CLP[0:3] 421A–D in circuit block 304. The voltage on lines CLP[0:3] 421A–D are in turn controlled by a precise bandgap-referred regulated voltage for each common line driver. Hence precision voltage level is provided at the memory common lines. The programming and sensing current bias are also bandgap-referred; hence they are highly stable.

Note that in FIG. 12 an alternative embodiment is to share one block RDSGPSDEC 301 or 304A across the full array by doing feedthrough of the outputs of RDSGPSDEC 301 or 304A across the full memory array. In this case the drive ability of the driver circuit inside block RDSGPSDEC 301 or 304A should be adequately designed to drive the long interconnect lines.

Note that in FIG. 10 an alternative embodiment is to have a separate block RD4CG1CL 416 for driving the right side of an array and another separate block RD4CG1CL 416 for driving the left side of an array. Another alternative embodiment is to share just one CL driver for both left and right sides but to have separate control gate CG drivers for the left side and the right side.

Figure 13:
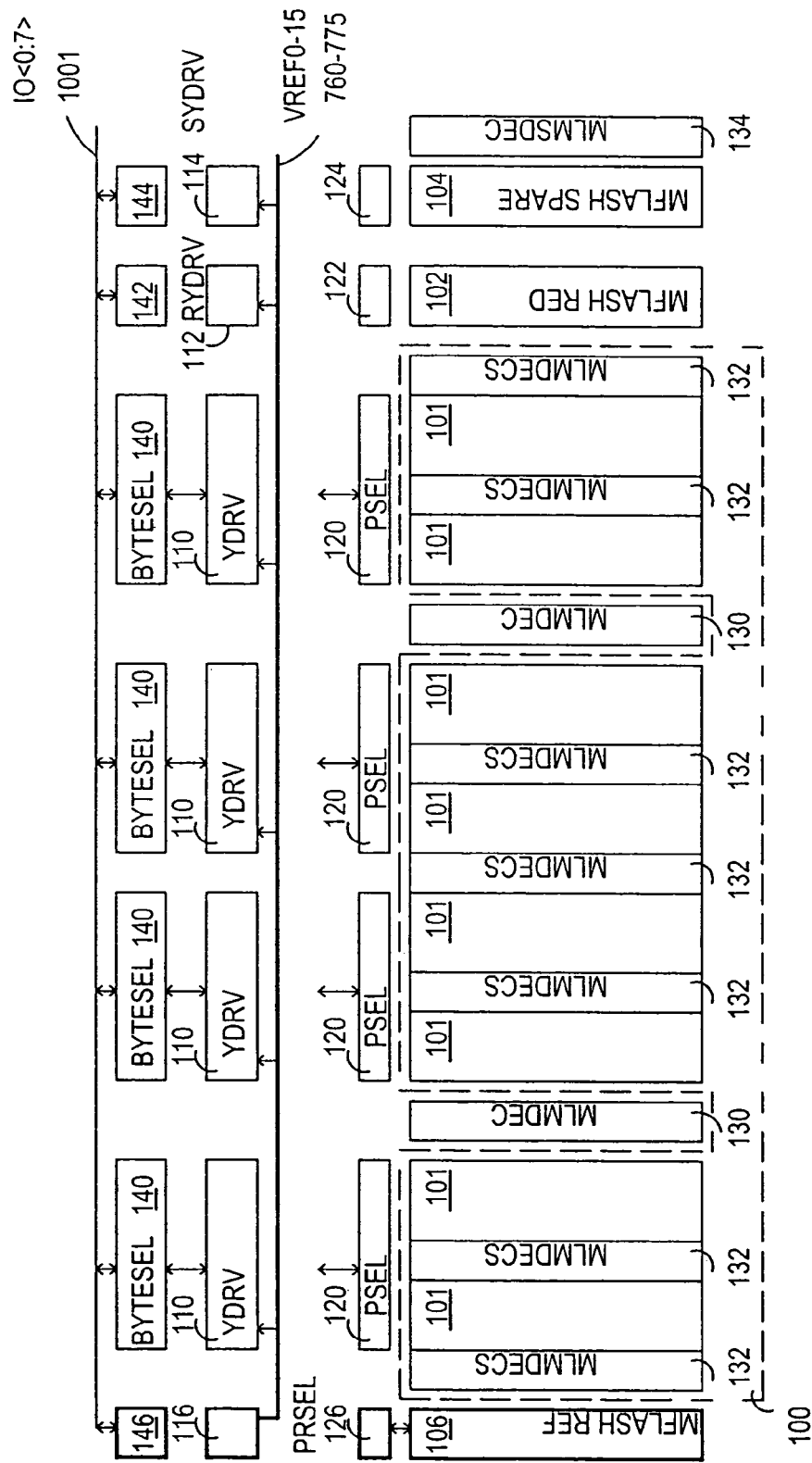
FIG. 13 shows a block diagram of a multilevel reference system.

Multilevel Reference System:

FIG. 13 shows a block diagram for a multilevel digital memory reference system. All the relevant blocks have been described in association with previous figures. The highlighted blocks 106, 116, 126, and 146 with the highlighted lines VREF0–15 760–775 are shown to show the reference system in relation to the physical position of the array and y-drivers. The physical position of the reference array corresponding to various schemes is explained in the following description.

Figure 14:
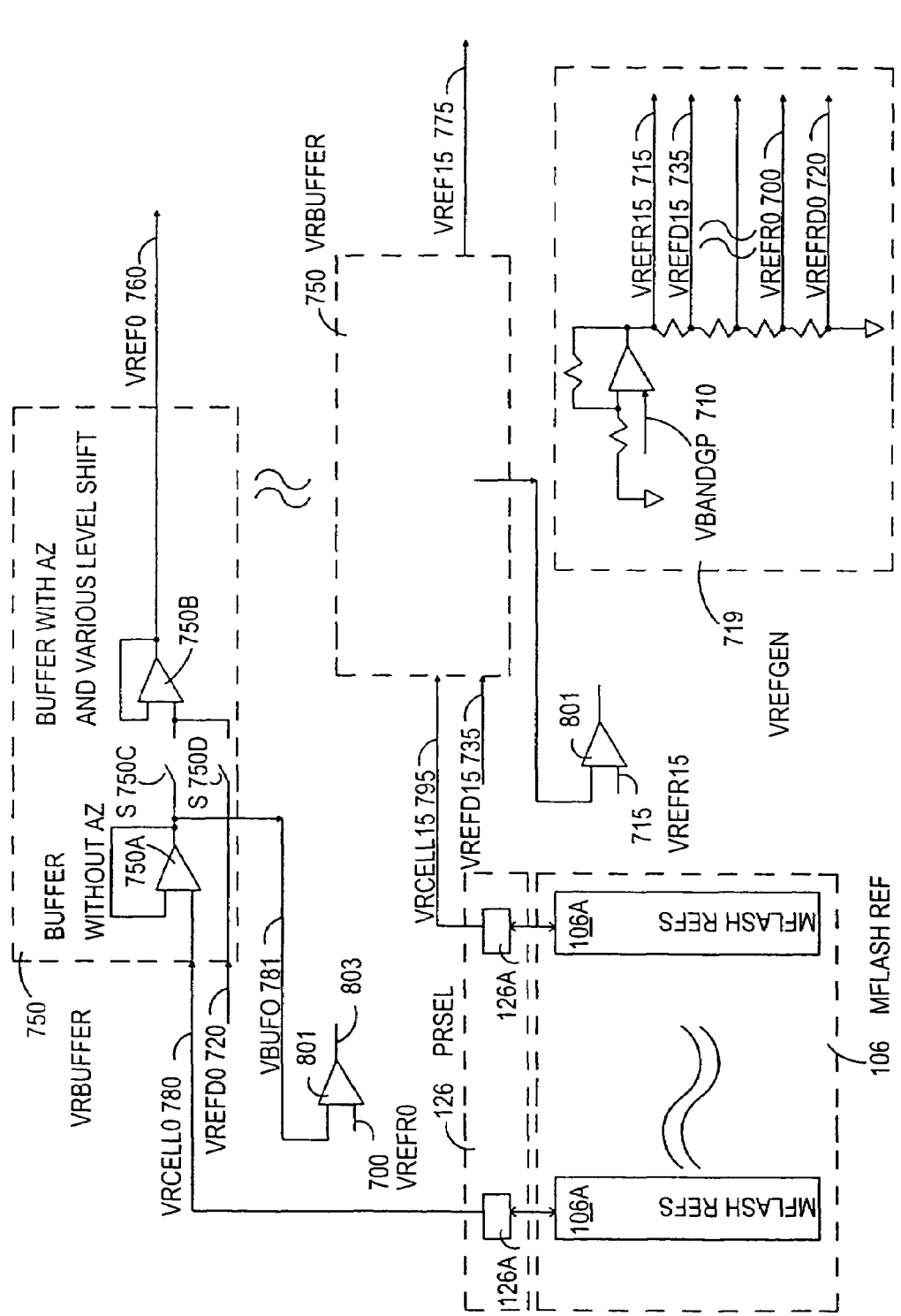
FIG. 14 shows details of a block diagram of a multilevel reference system.

FIG. 14 shows details of a multilevel digital memory reference system. A reference circuit block VREFGEN 719 is used to provide all reference voltage levels for erasing, programming, sensing, margin tests, and production tests. Shown are reference levels for reference cells VREFR0–15 700–715 and reference levels for data cells VREFD0–15 720–735. Data cells refer to memory cells that store digital data. A 16 level multilevel flash cell is assumed for this discussion. A flash reference array MFLASHREF 106 includes a plurality of blocks MFLASHREFS 106A. A block MFLASHREFS 106A includes a plurality of reference memory cells. A reference page select 126A is used to select the reference cells in the blocks MFLASHREFS 106A associated with a selected page. Each block 126A selects one reference cell in one corresponding block MFLASHREFS 106A. For each selected page, there are 16 blocks 126A selecting 16 reference cells in 16 corresponding blocks MFLASHREFS 106A. The 16 selected reference cells makes up one page reference.

A buffer VRBUFFER 750 and a comparator 801 are inside a block REFYDRVS 116S. The buffer VRBUFFER 750 is used to drive each reference level of VREF0–15 760–775 for all the y-drivers. A buffer circuit without offset auto zero 750A is used to isolate the reference cell from all capacitance from auxiliary circuits. The offset auto zero cancels out the voltage offset of an analog buffer. The voltage offset of an analog buffer is typically uncontrollable and is caused by threshold voltage mismatch, transistor transconductance mismatch, and systematic offset. This voltage offset would cause an uncertainty in the reference voltage, which would degrade the margin of one voltage level with respect to another voltage level. Line VBUFO 781 is used to verify a reference cell is programmed to one desired reference level out of 16 possible reference levels. Line VBUFO 781 is used instead of the direct memory cell output for verifying in the verify cycle. This is to include the buffer offset from buffer 750A in the verifying process. The comparator 801 is used to do the actual comparison in verify. A buffer with offset auto zero 750B is used to drive a reference level. Various voltage levels needed for multilevel algorithm are also generated by the buffer 750B with switch capacitor technique. The auto zero is needed to zero out the offset of this buffer since a typical buffer offset is 10–20 mV. This voltage amount if not canceled out would degrade the margin of a reference level, which effectively reduces the voltage margin for each level. Capacitors are needed to accomplish the auto zero and level shifting operation in the buffer 750B. However as described in the array architecture description, any additional capacitance would adversely degrade the write and read speed. Hence buffer 750A is inserted between the reference cell and the buffer 750B so that the reference cell only sees one gate capacitance inside a typical buffer as a capacitor load.

Lines VREF0–15 760–775 are the final reference lines driving into all the y-drivers as needed for verify-program cycles and read cycles. Switch S 750D couples line VREFD 720 to the input terminal of buffer 750B when one selected page programs for the first time. Switch S 750C couples line VBUFO 781 to input terminal of buffer 750B when the same selected page programs for the second time or more without an erase in between program. The reason is that for first time programming, reference levels for data cells come from a reference generator VREFGEN 719 and for subsequent programming reference levels come from the reference cells in MFLASHREFS 106A.

For the memory system described herein, there are 8 pages for each row, 4 rows for each block, and 512 bytes per page with a 4-bit digital multilevel memory cell. Since any one page is written or read at any time a complete reference set of 16 levels is reserved for each page instead of for each row. This is done to preserve the operating conditions through the lifetime of a memory system exactly the same for reference cells as regular data cells. This is done for example to make the reference and data cells have the same voltage readout drift over time. For each row, there are 8×16=128 reference cells. This has some small die size penalty. The reference cells are written at the same time as the regular data cells.

Figure 15:
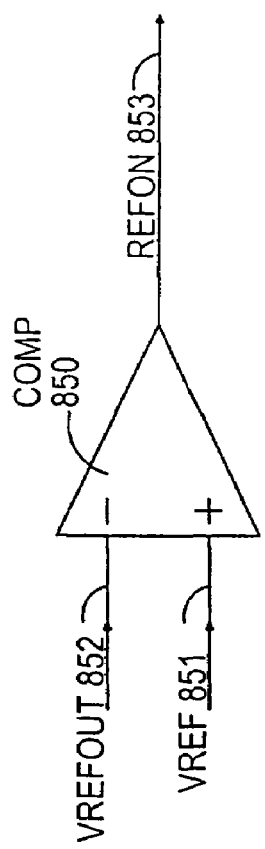
FIG. 15 shows a reference detection scheme.

After the reference cells are written with the first programming sequence, if subsequent programming cycles are allowed to write other data cells in the same page, the previously programmed reference cells stay in the program inhibit mode. This is accomplished as shown in FIG. 15. A comparator 850 is used to compare a reference voltage from a bandgap VREF 851, e.g., 1.2 V, versus a readout voltage from a reference memory cell VREFOUT 852, for example, level 0, e.g., 0.5V. If the reference cell has not been written, VREF 851<VREFOUT 852, then line REFON 853 would be low. If the reference cell has been written, VREF 851>VREFOUT 852, then line REFON 853 would be high indicating that the reference cells have been previously written and the reference cells are inhibited in programming.

For subsequent programming cycles after the first programming cycle, the reference voltages for the data cells come from the reference cells and the reference voltages are shifted appropriately to place the data voltages in between the adjacent reference voltages.

The voltage drop along the common line poses a particular problem for a multilevel reference system. Reference cells are needed to track the data cells over temperature, process, or power supply. But as temperature changes, the voltage drop along the common line changes, which causes a sense error. The voltage drop along the line from one end to the other end follows geometrically as described earlier. That is depending on position along the common line, the cells experience different amounts of common line voltage changes, which cause different voltage readout shifts due to different voltage amounts being coupled into the cells. This cannot be corrected by a conventional reference system.

Figure 16:
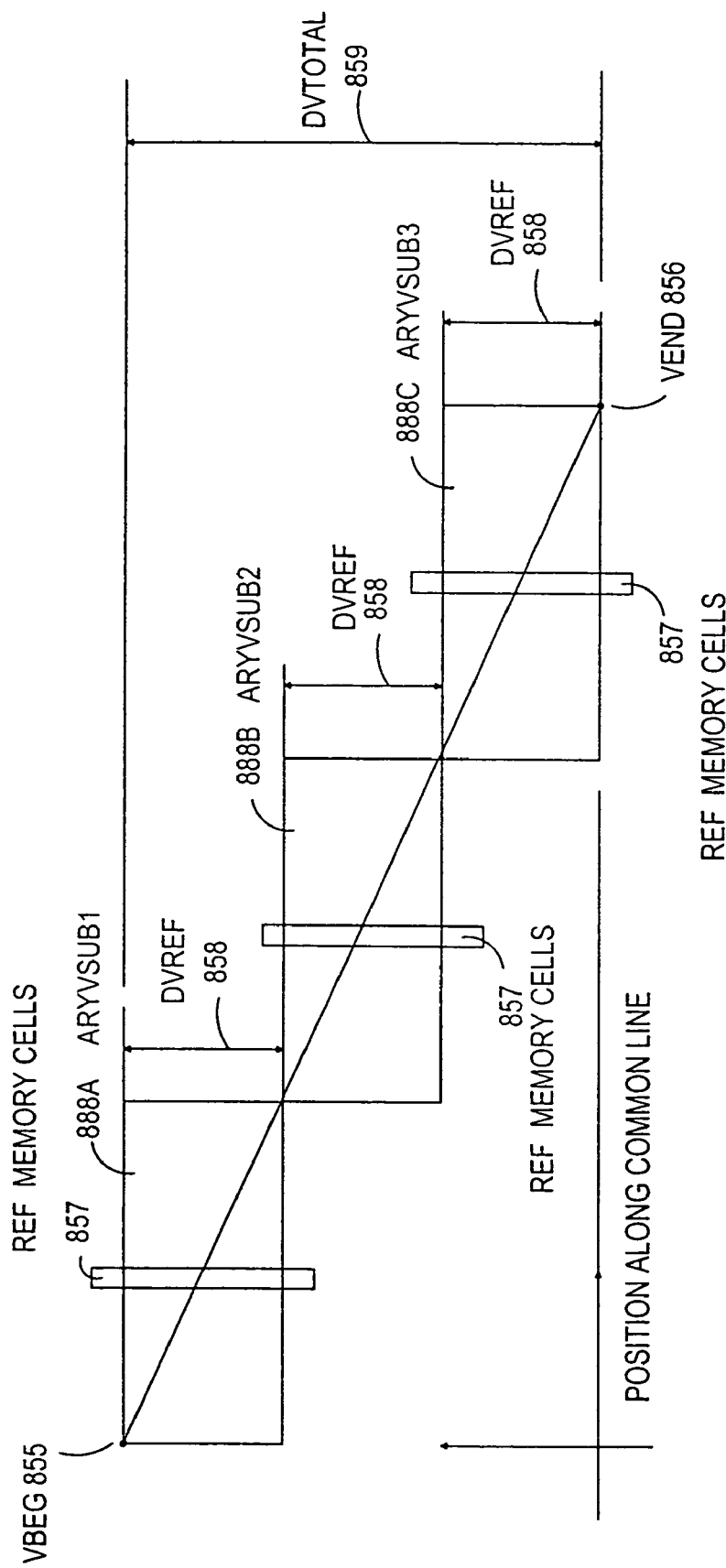
FIG. 16 shows positional linear reference system.

FIG. 16 shows a positional linear reference system that corrects this error. Assuming the voltage drop along a line is linear and assuming an acceptable voltage shift is DVREF/2, by dividing the voltage drop DVTOTAL 859=VBEG 855–VEND 856, into different voltage segments with equal voltage drop DVREF 858 and by positioning the reference cells 857 in the middle of a divided array segment ARYV-SUB1–3 888A–C corresponding to a voltage segment, the maximum voltage difference from a reference cell to a data cell in the beginning or at the end of the voltage segment is=<DVREF/2. Hence reference correction over temperature is achieved. It is possible to place the reference cells 857 at the beginning or the end of a divided array segment ARYV-SUB1–3 888A–C. In this case the maximum voltage difference from a reference cell to a data cell is DVREF instead of DVREF/2 as in the case of positioning the reference array in middle of a divided segment array. Another advantage of placing the reference cells in the middle of a divided array segment is to minimize the electrical variation due to the edge interface from the memory array to peripheral circuits.

Figure 17:
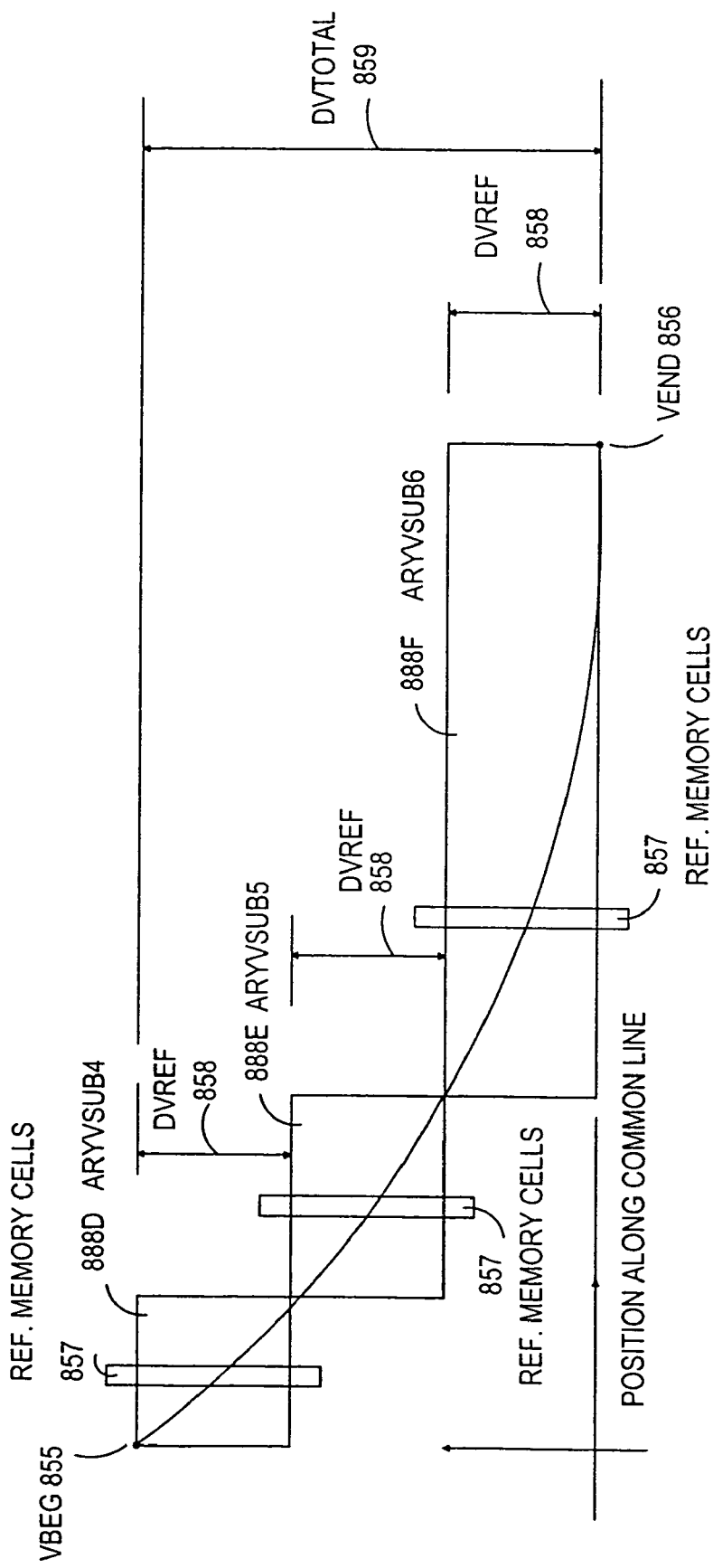
FIG. 17 shows a positional geometric reference system.

FIG. 17 shows a positional reference geometric system basing on the concepts similar to FIG. 16. In this embodiment, the reference cells 857 are not symmetrically but geometrically positioned to correct for the geometric effect of the voltage drop.

In FIGS. 16 and 17, each full array is divided into three sub-arrays ARYVSUB1–3 888A–C and ARYVSUB4–6 888D–F respectively. It should be obvious that the array could be divided into as many sub-arrays as needed to reduce the voltage error. Also shown in FIGS. 16 and 17, each sub-array of ARYVSUB1–6 888A–F includes its own complete set of reference cells in the middle. A complete set of reference cells provides all the reference levels, e.g., 16 levels for 4-bit digital multilevel cell per page, for all the pages. One row of reference cells includes 128 reference cells if each row has 8 pages and each reference cell provides one reference level. An alternative embodiment is to have more than one reference cell per level, e.g., 4–16 cells per level. This averages out the electrical variation of multiple cells.

Figure 18:
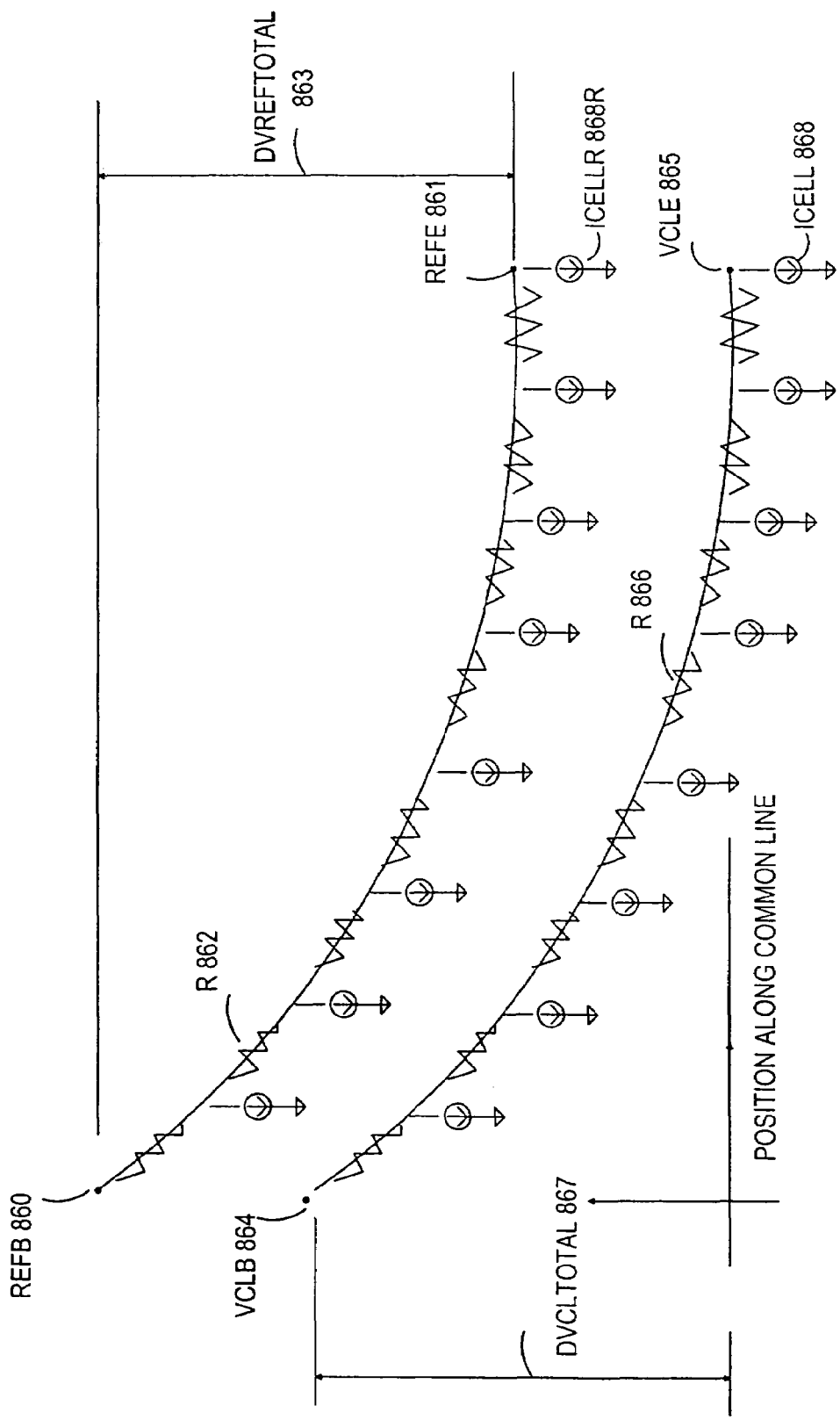
FIG. 18 shows an embodiment of geometric compensation reference scheme.

FIG. 18 shows a geometric compensation reference system. The objective is to simulate the voltage drop in the common line into the reference readout voltage by attaching similar loading currents to the reference readout voltage. A resistance R 862 in the reference line is made equivalent to a resistance R 866 in the common line. A reference loading current ICELLR 868R is made the same as that of ICELL 868. Hence the total voltage drop in reference DVREFTOTAL 863,=REFB 860–REFE 861, is equal to DVCLTOTAL 867,=VCLB 864–VCLE 865. It is not necessary to attach the same number of loading reference currents ICELLR 868R to the number of ICELL 868. It is only necessary to attach the approximate amount of the current loading at appropriate positions to minimize the error to an acceptable level.

One alternative embodiment of the reference system is, instead of using 16 reference cells for a 4-bit digital multilevel cell, to use 2 or 4 or 8 reference cells to generate 16 reference levels with level interpolation. That is from reference levels coming from reference cells, the other reference levels are interpolated by using linear or any other interpolation.

Figure 19A:
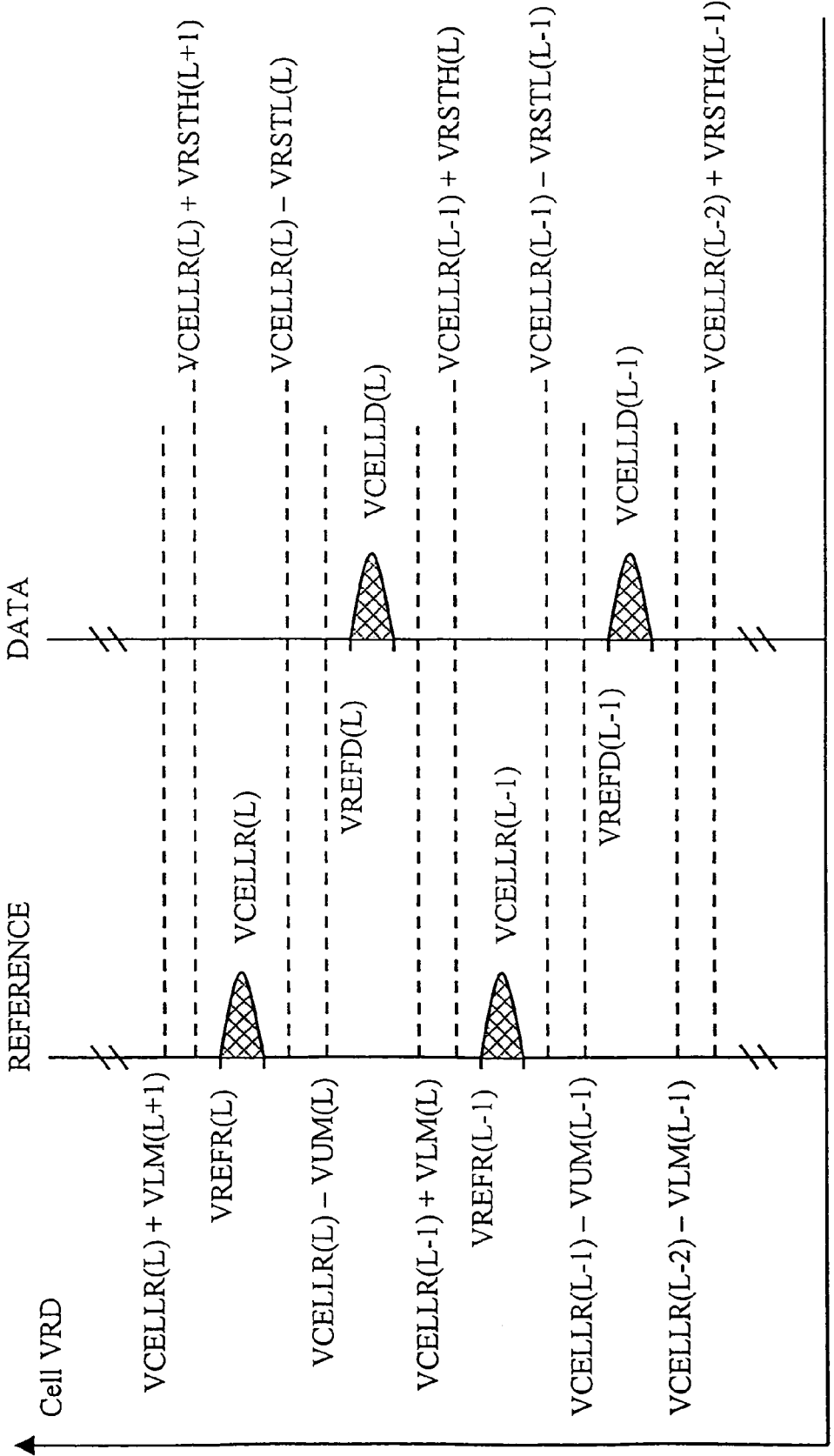
FIG. 19A shows voltage levels for program verify, margin, read, and restore for one embodiment of the current invention.

Multilevel Algorithm:

FIG. 19A shows various voltages generated and used in one embodiment of the invention for program verifying, program upper and lower margin verifying, read sensing and restore high or restore low margin verifying during read sensing. The read sensing is advantageously performed in the voltage-mode but other modes of read sensing are also applicable. All the voltages are generated by the V&IREF block 172. VREFR(L) is the program verify voltage used to verify program level L of a reference cell. VREFD(L) is the program verify voltage used to verify program level L of a data cell. For example, in a 4 bit per cell storage embodiment there are 16 levels used. It is also possible to use 15 levels instead of 16 levels since the extreme low or high levels not need to be constrained to exact low or high levels but can go to ground or power supply respectively. VREFR0 through VREFR15 are program verify voltages used for verifying programming of the reference cells. VREFD0 through VREFD15 are program verify voltages used for verifying programming of the data cells. VUM(L) and VLM(L) are upper and lower program margin voltages respectively for level L. Each level L may have its own VUM(L) and VLM(L) voltage value. VUM(L) and VLM(L) can each be of different value also for each level L. On the other hand, VUM(L) and VLM(L) can be of the same voltage value for all the levels. VUM(L) and VLM(L) voltages are generated by the block V&IREF 172. VRSTH(L) and VRSTL(L) are RESTORE HIGH and RESTORE LOW margin voltages respectively for level L. Each level L may have its own VRSTH(L) and VRSTL(L) voltage value. VRSTH(L) and VRSTL(L) can each be of different value also for each level L. On the other hand, VRSTH(L) and VRSTL(L) can be of the same voltage value for all the levels. VRSTH(L) and VRSTL(L) voltages are generated by the V&IREF 172 block. VCELLR(L) is the voltage read back from a reference cell during read sensing. VCELLD(L) is the voltage read back from a data cell during read sensing. The cross-hatched regions show the distribution of possible read back voltages during read sensing after reference cells or data cells have been programmed to a certain level L, while using YREFR(L) or VREFD(L) as the program verify voltage, respectively. The distributions occur because every cell does not have the same programming or read sensing characteristics.

Page Programming Cycle:

FIG. 20 shows the flow diagram for one embodiment of the page programming cycle. During a page programming cycle a plurality of memory cells are programmed in parallel. However this algorithm is equally applicable for single cell programming. As an example, 4 bit per cell is programmed in each cell. First the program command is issued and the address of the page to be programmed is loaded. The data count NC is initialized. The address loading may be performed through a single or a plurality of address cycles. Program data is input during the DATAIN step and is selectively loaded in the internal latches of a YDRVS 110S or SYDRVS 114S or RYDRV 112S. Block YDRV 110, SYDRV 114, RYDRV 112 includes a plurality of YDRVS 110S, SYDRVS 114S, RYDRVS 112S respectively. Block YDRVS 110S will be described in detail later in the description associated with FIG. 26. Data gets loaded into the data latches of the current YDRVS 110S or SYDRVS 114S selected from the ADDRCTR 162 and the BYTEDEC 152. The redundancy control block REDCNTRL 186 asserts RED_ADD_TRUE true (YES or Y) or false (NO or N) to signify whether the current YDRVS 110S or SYDRVS 114S is GOOD or BAD. A YDRVS 110S or SYDRVS 114S is GOOD if it has not been flagged as one that cannot be used to load input data on its data latches. A YDRVS 110S or SYDRVS 114S is BAD if it has been flagged as one that cannot be used to load input data on its data latches. GOOD or BAD YDRVSs or SYDRVSs are flagged during manufacturing testing and the flags are internally stored on non-volatile latches. If RED_ADD_TRUE=NO, meaning current YDRVS 110S or SYDRVS 114S is GOOD, then a data nibble on the IO[0:3] or IO[4:7] bus is placed at the input of the data latches of the current YDRVS 110S or SYDRVS 114S. A data byte consists of 8 digital bits and a data nibble consists of 4 digital bits. If RED_ADD_TRUE=Y, meaning current YDRVS 110S or SYDRVS 114S is BAD, then the data nibble on the IO[0:3] or IO[4:7] bus is placed at the data latches of the selected RYDRVS 112S. Next, if NEXTDATAIN=Y, the data at the input of the data latches of the respective YDRVS 110S, SYDRVS 114S or RDYRVS 112S is latched. If NEXTDATAIN=N then the flow waits for the program start command PRG. Next, if the data count NC>MAXNC=not true (N), then NC=NC+1 and the flow loops back to DATAIN step to load in the next data byte. If the data count NC>MAXNC=true (Y), then the flow goes out of the loop and waits for the program start command PRG. The data count MAXNC signifies the number of data bytes that are simultaneously programmed in a page. Next, if command PRG is received then page programming begins. If command PRG is not received then the flow loops back to check for NEXTDATAIN. No data loading is required for blocks REFYDRVS 116S because their latches are internally set. A block REFDRV 116 includes a plurality of blocks REFYDRVS 116S.

FIG. 21 shows the flow diagram after page programming begins. The Program flag=Pass is set and the BUSY signal is set. The program inhibit mode of all cells in the page being programmed are reset to enable programming. Based on the output B[0:3] of the data latches of each YDRVS 110S, SYDRVS 114S or RYDRVS 112S a program verify voltage VREFD(L) is set at the input of the comparator in each of the respective YDRVS 110S, SYDRVS 114S or RYDRVS 112S. Based on the output B[0:3] of the data latches of each REFYDRVS 116S a program verify voltage VREFR(L) is set at the input of the comparator in each REFYDRVS 116S. For each reference cell and data cell in the page being programmed, the cell voltage VCELLD(L) or VCELLR(L) is read. Depending on the output B[0:3] of the data latches of (a) for each REFYDRVS 116S the appropriate program verify voltage VREFR(L) is compared to the reference cell read back voltage VCELLR(L) and (b) for each YDRVS 110S, SYDRVS 114S, RYDRVS 112S, the appropriate program verify voltage VREFD(L) is compared with data cell read back voltage VCELLD(L) to indicate whether further programming is required. If no further programming is required for a particular reference cell or data cell, it is put in the program inhibit mode. If the Program Pulse Count=MAXPC is not true, then the cells are placed in the program mode and another programming pulse is applied to all the cells in the page, including the reference cells. Cells which are in the program inhibit mode do not get any additional programming. Cells which are not in the program inhibit mode get additional programming. After the programming pulse is applied, the program pulse count is incremented and the cells are placed in the voltage-mode read to verify if further programming is required. This iterative verify-program loop is continued until either all the cells in the page including the reference cells are in the program inhibit mode or when the program pulse count=MAXPC is true. If program pulse count=MAXPC true condition is reached, before all cells in the page including the reference cells are all in program inhibit mode, then the program flag=fail condition is set, BUSY signal is reset and the programming cycle is done. When ever the All Cells in Program Inhibit Mode=true condition is reached, the flow moves to the next step as shown in FIG. 22A.

Figure 22A:
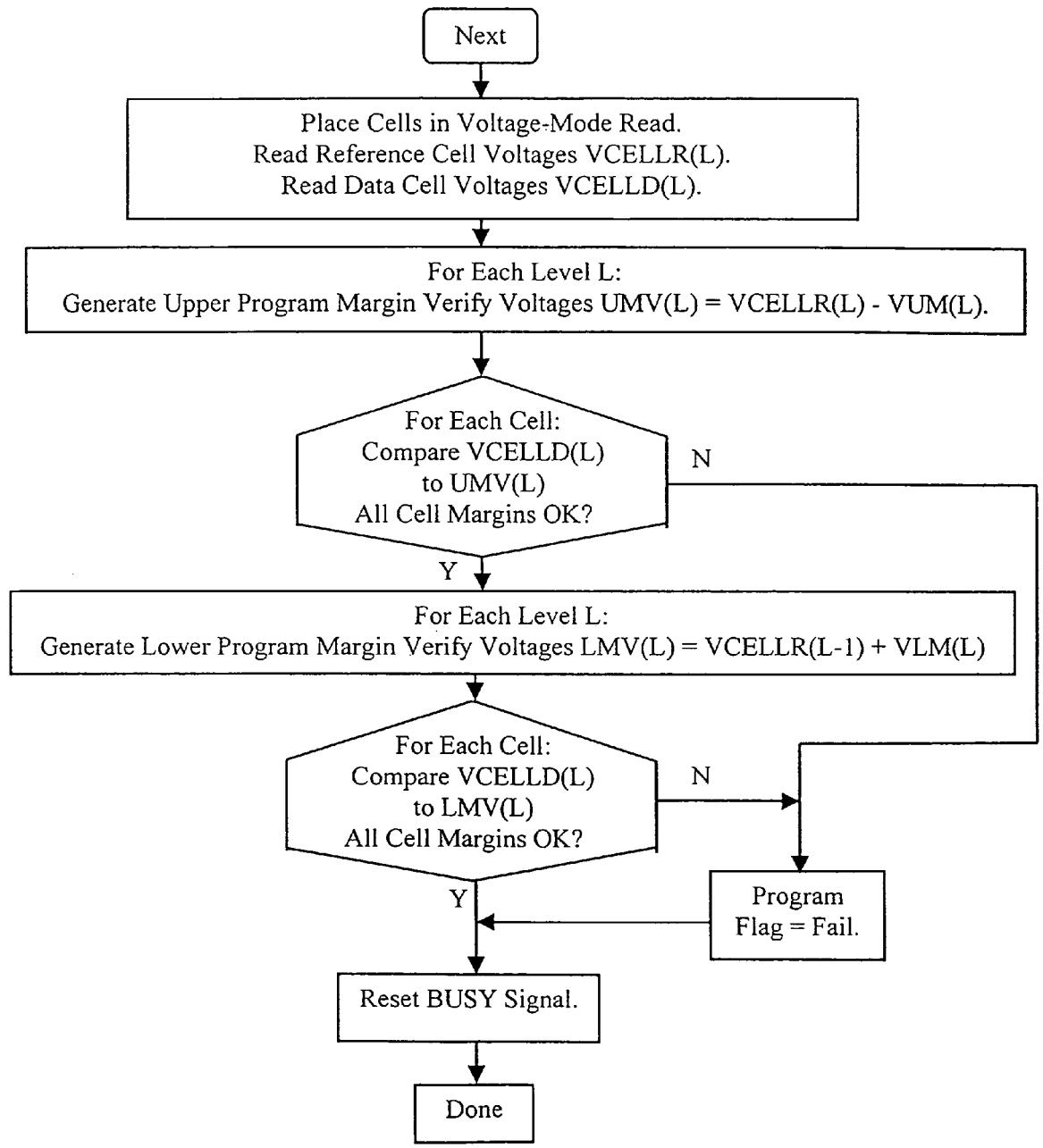
FIG. 22A shows a continuation of flow diagram after page programming begins.

As shown in FIG. 22A, next, for each level L, upper program margin verify voltage UMV(L)=VCELLR(L)−VUM(L) is generated, where VUM(L) is the upper margin voltage for level L. Depending on the data latch output B[0:3] of the data latches in the respective YDRVS 110S, SYDRVS 114S, RYDRVS 112S the appropriate voltage UMV(L) is compared with read back cell voltage VCELLD (L) for all the data cells. If the result of comparison indicates that all upper cell margins are not within limits then a program flag=fail condition is set; BUSY signal is reset and programming cycle is done. If the result of comparison indicates that all the upper cell margins are within limits then a program flag=fail condition is not set and then, for each level L, lower program margin verify voltage LMV(L)=VCELLR(L−1)+VLM(L) is generated, where VLM(L) is the lower margin voltage for level L. Depending on the data latch output B[0:3] of the data latches in the respective YDRVS 110S, SYDRVS 114S, RYDRVS 112S the appropriate voltage LMV(L) is compared with read back cell voltage VCELLD(L). If the result of comparison indicates that all lower cell margins are not within limits then a program flag=fail condition is set; BUSY signal is reset and programming cycle is done. If the result of comparison indicates that all the lower cell margins are within limits then a program flag=fail condition is not set and BUSY signal is reset and programming cycle is done. The program flag=fail indicates the programming cycle has been unsuccessful to program the current page. It does not indicate specifically which cell or cells caused the unsuccessful programming.

Figure 25:
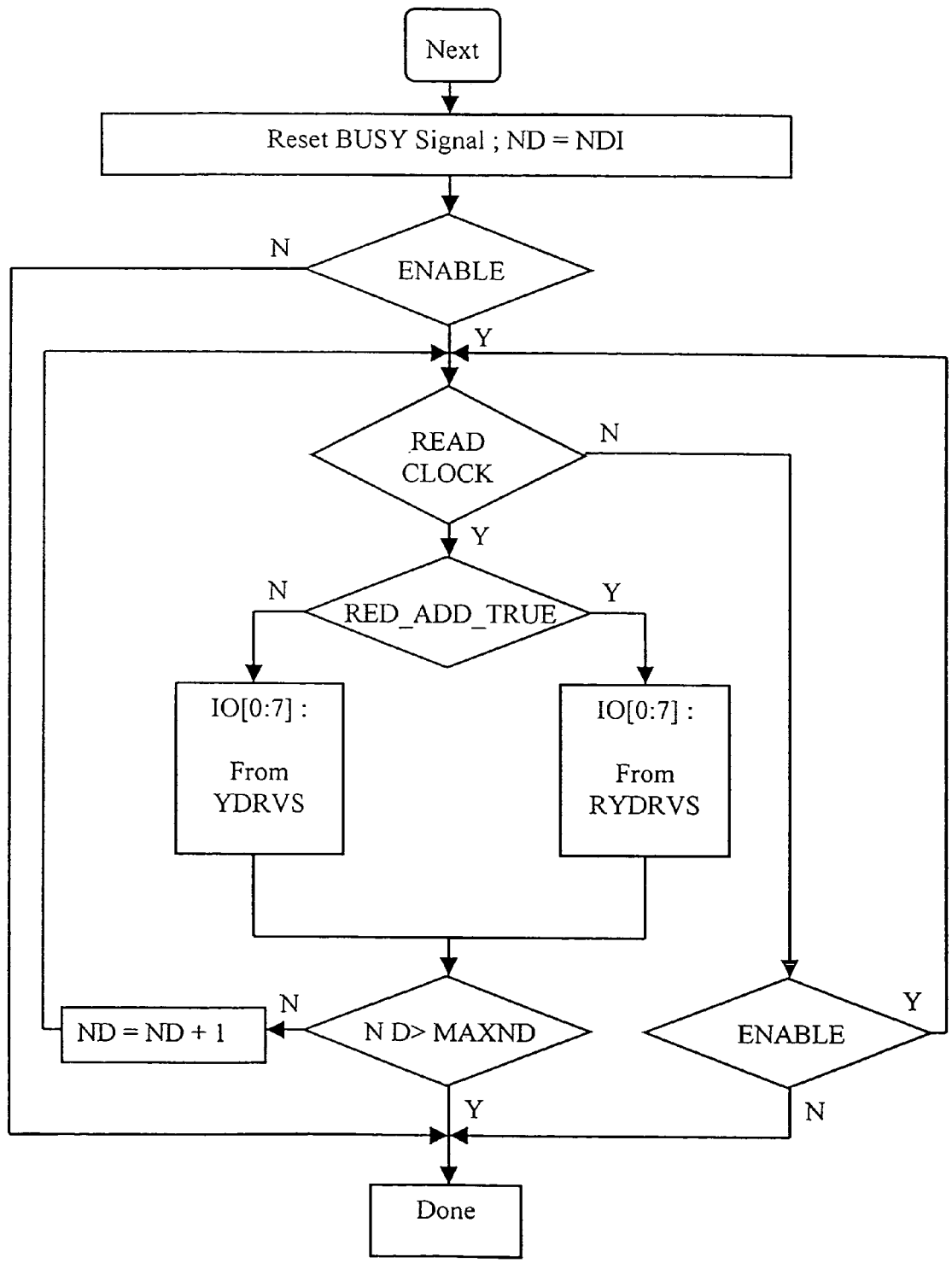
FIG. 25 shows a continuation of flow diagram of the page read cycle in FIG. 24.

Page Read Cycle:

FIG. 23 shows the flow diagram for the page read cycle. During a page read cycle a plurality of memory cells are read in parallel. However this algorithm is equally applicable for single cell read. After the page read command is issued along with the address of the page to be read, the BUSY signal is set, RESTOREL and RESTOREH flags are reset, the data latches in the YDRVS 110S, SYDRVS 114S, RYDRVS 112S are set to output B[0:3]=1111 and N is set to 3. N represents the number of bits stored per memory cell. All the cells in the addressed page are placed in the voltage-mode read and the cell voltages, VCELLR(L) for reference cells and VCELLD(L) for data cells are read. BN is forced to "0" and the read verify voltage VCELLR(L), which is one of the reference read back voltages dependent on B3, B2, B1, B0, is compared with the cell read back voltage VCELLD(L). For each cell, if the VCELLD(L)>VCELLR (L) then BN is latched as "1", otherwise BN is latched as "0". The loop continues until all the bits B3, B2, B1, B0 are latched and N=0. Next, as shown in FIG. 24, for each level L, a MARGIN RESTORE LOW Voltage VRSTRL(L)=VCELLR(L)−VRSTL(L) is generated, where VRSTL(L) is the restore low margin voltage. Depending on the latched bits B3, B2, B1, B0 on each of the YDRVS 110S, SYDRVS 114S, RYDRVS 112S, the voltage VRSTRL(L) is compared with the respective data cell read back voltage VCELLD(L). If VCELLD(L)>VRSTRL(L) for any one of the cells, then the RESTOREL flag is set. Next, for each level L a MARGIN RESTORE HIGH Voltage VRSTRH(L)=VCELLR(L−1)+VRSTH(L) is generated., where VRSTH(L) is the restore high margin voltage. Depending on the latched bits B3, B2, B1, B0 on each of the YDRVS 110S, SYDRVS 114S, RYDRVS 112S, the voltage VRSTRH(L) is compared with the respective data cell read back voltage VCELLD(L). If VCELLD(L) <VRSTRH(L) for any one of the cells, then the RESTOREH flag is set, otherwise RESTOREH flag is not set. Next, as shown in FIG. 25, BUSY signal is reset and the byte count ND is initialized to NDI. NDI is the byte count of the existing byte address location. All bits in the respective YDRVSs, SYDRVSs, or RYDRVSs data latches are ready to be sequentially read. Whenever READ CLOCK=Y, the RED_ADD_TRUE is checked for that byte address location. If RED_ADD_TRUE=Y, then data from RYDRVS 112S is output to the IO port IO[0:7] 1001, otherwise data from YDRVS 110S is output to the io port IO[0:7] 1001. If READ CLOCK=N and ENABLE=Y then the flow loops back until READ CLOCK=Y or ENABLE=N. After all the data is output i.e. ND>MAXND=Y or if ENABLE=N, the Page read cycle is done. If ND>MAXND is=N, then ND is incremented and the flow loops back to check the READ CLOCK.

Figure 26:
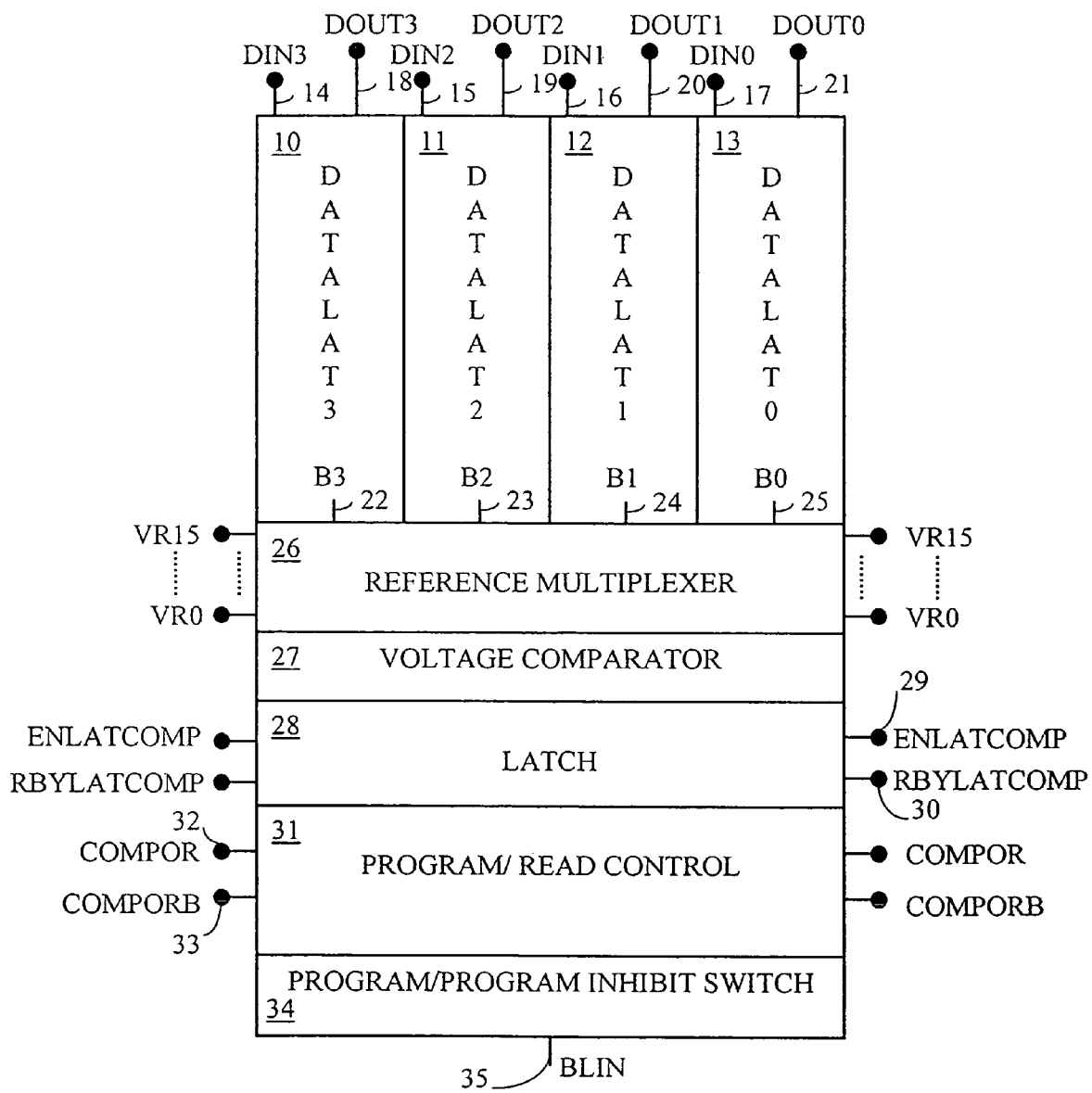
FIG. 26 shows details of an embodiment of a single y-driver YDRVS 110S.

FIG. 26 shows the details of an embodiment of YDRVS 110S. SYDRVS 114S and RYDRVS 112S have similar details. The description given for YDRVS 110S is equally applicable for SYDRVS 114S and RYDRVS 112S. In this embodiment 4 bits are stored per memory cell, hence four data latches are required per YDRVS 110S. A set of four data latches DATALAT3 10, DATALAT2 11, DATALAT1 12, DATALAT0 13 holds the data during the DATAIN step of a page programming cycle or holds the data during a LATCH BN=1 or=0 step during a page read cycle. Data is loaded into DATALAT3 10, DATALAT2 11, DATALAT1 12, DATALAT0 13 through the DIN3 14, DIN2 15, DIN1 16, DIN0 17 lines respectively and read out from the DATALAT3 10, DATALAT2 11, DATALAT1 12, DATALAT0 13 through the DOUT3 18, DOUT2 19, DOUT1 20, DOUT0 21 lines respectively. Lines DIN3 14, DIN2 15, DIN1 16, DIN0 17, DOUT3.18, DOUT2 19, DOUT1 20, DOUT0 21 connect to BYTESEL 140 for YDRV 110 and connect to blocks 144, 142 for SYDRV 114, RDYRV 112 respectively. During page program cycle, lines B3 22, B2 23, B1 24, B0 25 are outputs of DATALAT3 10, DATALAT2 11, DATALAT1 12, DATALAT0 13 respectively and have a latched logical relationship to the lines DIN3 14, DIN2 15, DIN1 16, DIN0 17 respectively. During page read cycle lines B3 22, B2 23, B1 24, B0 25 are output of DATALAT3 10, DATALAT2 11, DATALAT1 12, DATALAT0 13 respectively and represent the 4 bits read out of the cell. Depending on the status of lines B3 22, B2 23, B1 24, and B0 25, the REFERENCE MULTIPLEXER 26 couples one of the lines VR0 through VR15 to one input of the VOLTAGE COMPARATOR 27. The output of the VOLTAGE COMPARATOR 27 connects to the input of the LATCH 28. Under the control of ALGBCNTRL 164, the line ENLATCOMP 29 functions as a strobe signal to enable the LATCH 28 during a certain time to latch the output of the VOLTAGE COMPARATOR 27. Line RBYLATCOMP 30 resets the LATCH 28 at suitable times under the control of ALGOCNTRL 164. The PROGRAM/READ CONTROL 31 outputs lines COMPOR 32 and COMPORB 33. COMPOR 32 and COMPORB 33 lines are connected together in a wire-OR manner for all YDRV 110, SYDRV 114, and RYDRV 112. The PROGRAM/PROGRAM INHIBIT SWITCH 34 puts the memory cell coupled to it indirectly through line BLIN 35 into a program or program inhibit mode under the control of PROGRAM/READ CONTROL 31. Line BLIN 35 goes to the PSEL 120 for YDRV 110 and to blocks 124, 122 for SYDRV 114, RYDRV 112 respectively. The lines VR0 through VR15 individually are coupled to the output of a VRBUFFER 750.

FIG. 27 shows the details of a LATCH 28 block, a PROGRAM/READ CONTROL 31 block and a PROGRAM/PROGRAM INHIBIT 34 block. The VROUT line 55 couples the output of REFERENCE MULTIPLEXER 26 to the positive input of a VOLTAGE COMPARATOR 27. The line COMPOUT 58 couples the output of the VOLTAGE COMPARATOR 27 to the D input of a latch 59. ENLATCOMP 29 goes to the EN input of the latch 59. ENLATCOMP 29 acts as a strobe signal for the latch. When ENLATCOMP 29 is at logic high the latch 59 outputs the logic level on D input to the Q output. QB is the inverted logic level of Q. When ENLATCOMP 29 goes to logic low, the latch 59 latches the logic level on D input. RBYLATCOMP 30 goes to the reset R input of the latch 59. When RBYLATCOMP 30 is logic low latch 59 is reset, whereby Q is at logic low and QB is at logic high. Line COMLATQ 40 couples the Q output of the latch 59 to the gate of a NMOS transistor N1 43. Line COMLATQB 41 couples the QB output of the latch 59 to the gate of a NMOS transistor N2 44. Line COMLATQ 40 also couples to the data latches DATALAT3 10, DATALAT2 11, DATALAT1 12, DATALAT0 13. COMLATQ 40 also couples to one input of a 2 input NAND gate NAND 49. The other input of the NAND 49 is coupled to the signal READ2B. READ2B is at logic high during page programming cycle and at logic low during page read cycle. The line NDO 52 couples the output of NAND 49 to the input of an inverter INV 48 and also to the gate inputs of PMOS transistor P1 45 and NMOS transistor N3 47. The line INVO 53 couples the output of INV 48 to the gate of a PMOS transistor P2 46. Line BLIN 35 connects to one terminal of each of P1 45, N3 47 and P2 46. BLIN 35 also connects to the negative input of VOLTAGE COMPARATOR 27. The other terminal of P1 45 is connected to inhibit voltage input VIH 57. Line N4D 54 connects the other terminals of N3 47 and P2 46 to one terminal of NMOS transistor N4 50. Line N5D 60 connects the other terminal of N4 50 to one terminal of NMOS transistor N5 51. The other terminal of N5 51 is connected to ground. The gates of N4 50 and N5 51 are connected to inputs VBIYDRVCAS 56 and VBIYDRV 57 respectively. N4 50 and N5 51 form a current bias circuit whereby a constant current load is placed on the BLIN 35 when INVO 53 is at logic low and NDO 52 is at logic high. NH 50 and NH 51 together represent the predetermined bias current for the voltage mode sensing as shown in FIG. 2C.

After the page program command and the address of the page to be program is issued, the data to be programmed is loaded in the data latches DATALAT3 10, DATALAT2 11, DATALAT1 12, DATALAT0 13 of each of the YDRVS 110S, SYDRVS 114S or RYDRVS 112S. The REFERENCE MULTIPLEXER 26 then couples one of the inputs VR0 through VR15 to its output VROUT 55. During a program verify cycle VREFD(0) through VREFD(15) are available on the VR0 through VR15 lines respectively. VR0 through VR15 are commonly coupled to REFERENCE MULTIPLEXER 26 of all the YDRV 110, SYDRV 112, RYDRV 14. The REFYDRVS 116S have the data latches internally set. In this embodiment there are 16 REFYDRVS 116S. Each REFYDRVS 116S is used for a specific level. For example, the data latches of a REFYDRVS 116S used for level 5 will be internally set to program level 5 into reference cells coupled to it. VR0 through VR15 are commonly coupled to REFERENCE MULTIPLEXER 26 of all the REFYDRVS 116S. During a program verify cycle, VREFR(0) through VREFR(15) are respectively available at the VR0 through VR15 lines of a REFYDRVS 116S. Depending on the output B3, B2, B1, B0 of the data latches DATALAT3 10, DATALAT2 11, DATALAT1 12, DATALAT0 13 within each YDRVS 110S, SYDRVS 114S, SYDRVS 112S one specific voltage VREFD(0) through VREFD(15) is output to the input of the VOLTAGE COMPARATOR 27. Depending on the output B3, B2, B1, B0 of the data latches DATALAT3 10, DATALAT2 11, DATALAT1 12, DATALAT0 13 within each REFYDRV 116 one specific voltage VREFR(0) through VREFR(15) is output to the input of the VOLTAGE COMPARATOR 27.

The latch 59 within each REFYDRVS 116S, YDRVS 110S, SYDRVS 114S and RYDRVS 112S are all reset by pulsing line RBYLATCOMP 30. RBYLATCOMP 30 is commonly connected to the reset input of the latch 59 within each REFYDRVS 116S, YDRVS 110S, SYDRVS 114S, and RYDRVS 112S. After latch 59 is reset, COMLATQ 40 is at logic low. The NAND 49 then outputs logic high to line NDO 52. Output of INV 48 then is at logic low on line INVO 53. With NDO 52 at logic high and INVO 53 at logic low transistors N3 47 and P2 46 couple BLIN 35 to N4 50. P1 45 de-couples the inhibit voltage VIH 57 from BLIN 35. The memory cell is placed in the voltage read mode and the cell read back voltage VCELLR(L) or VCELLD(L) is available on BLIN 35. At this point, the VOLTAGE COMPARATOR 27 compares the voltages at its inputs. If voltage on BLIN 35 is higher then voltage on VROUT 55 the output COMPOUT 58 is low, otherwise it is high. At this time a positive going strobe pulse is applied to the ENLATCOMP 29 common to all the latches 59 in REFYDRVS 116S, YDRVS 110S, SYDRVS 114S and RYDRVS 112S, to latch the status of line COMPOUT 58. If COMPOUT 58 is low, then the COMLATQ 40 remains at logic low.

If COMPOUT 58 is high, then the COMLATQ 40 switches to logic high. If during an iteration of verify-program cycles any one of the latches 59 latches a logic high on COMLATQ 40, called a program inhibit state, then for that specific REFYDRVS 116S, YDRVS 110S, SYDRVS 114S or RYDRVS 112S, the line NDO 52 is at low and the line INVO 53 is at logic high. With latch 59 in a program inhibit state, BLIN 35 is de-coupled from N4D 54 and there is no current load, whereas, BLIN 35 is coupled to the inhibit voltage VIH 57 through P1 45. With latch 59 in the program inhibit state, further programming pulses do not cause programming.

The line COMPOR 32 is connected in a wire-OR fashion to all the COMPOR 32 lines of each REFYDRVS 116S, YDRVS 110S, SYDRVS 114S or RYDRVS 112S. There is a pull up load coupling the COMPOR 32 line to the power supply. Similarly, the line COMPORB 33 is connected in a wire-OR fashion to all the COMPORB 33 lines of each REFYDRVS 116S, YDRVS 110S, SYDRVS 114S or RYDRVS 112S. There is a pull up load coupling the COMPORB 33 line to the power supply. The COMPORB line 33 goes high whenever all the latches 59 have reached the program inhibit mode. When the Program Pulse Count=MAXPC is reached, the ALGOCNTRL 164 latches the status of COMPORB line 33 in a status latch in block INPUT LOGIC 160. The status latch can be read at one of the IO[0:7] 1001 lines by the external host. If ALGOCNTRL 164 latches a logic low in the status latch in block INPUT LOGIC 160 then a program fail condition is reached and the ALGOCNTRL 164 goes out of the page programming cycle.

If at the end of any verify-program iteration, the COMPOR 32 line goes high, the ALGOCNTRL 164 sequences to the margin verify mode. All latches 59 are reset. All cells are placed in the voltage read mode by READB 52 at logic low. At this time inhibit voltage is de-coupled from BLIN 35 and current bias transistor N4 50 is coupled to BLIN 35. Cell voltages VCELLR(L) or VCELLD(L) are respectively available on BLIN 35 of a REFYDRVS 116S or BLIN 35 of YDRVS 110S, SYDRVS 114S, or RYDRVS 112S. During program margin verify the voltages read back from the data cells are checked for adequate margin from voltages read back from reference cells for each programmed level L. In the Upper Program Margin Verify mode, voltages UMV(0) through UMV(15) are placed on the VR0 through VR(15). Depending on the output B3, B2, B1, B0 of the data latches DATALAT3 10, DATALAT2 11, DATALAT1 12, DATALAT0 13 within each YDRVS 110S, SYDRVS 114S, RYDRVS 112S one specific voltage UMV(0) through UMV (15) is output to the input VROUT 55 of the VOLTAGE COMPARATOR 27. At this time the VOLTAGE COMPARATOR 27 compares the voltages at its inputs. If voltage on BLIN 55 is higher then voltage on VROUT 55 the output COMPOUT 58 is low, otherwise it is high. At this time a positive going strobe pulse is applied to the ENLATCOMP 29 common to all the latches 59 in YDRVS 110S, SYDRVS 114S and RYDRVS 112S, to latch the status of line COMPOUT 58. If COMPOUT 58 is low, then the COMLATQ 40 remains at logic low. If COMPOUT 58 is high, then the COMLATQ 40 switches to logic high. At this time, if ALGOCNTRL 164 latches a logic low in the status latch in INPUT LOGIC 160 block by looking at the status of the COMPORB 33 line, then a program fail condition is reached and the ALGOCNTRL 164 goes out of the page programming cycle. Otherwise, ALGOCNTRL 164 sequences to the Lower Program Margin Verify mode.

In the Lower Program Margin Verify mode, all latches 59 are reset. Voltages LMV(0) through LMV(15) are placed on the VR0 through VR(15). Depending on the output B3, B2, B1, B0 of the data latches DATALAT3 10, DATALAT2 11, DATALAT1 12, DATALAT0 13 within each YDRVS 110S, SYDRVS 114S, RYDRVS 112S one specific voltage LMV (0) through LMV(15) is output to the input VROUT 55 of the VOLTAGE COMPARATOR 27. At this time the VOLTAGE COMPARATOR 27 compares the voltages at its inputs. If voltage on BLIN 55 is higher then voltage on VROUT 55 the output COMPOUT 58 is low, otherwise is high. At this time a positive going strobe pulse is applied to the ENLATCOMP 29 common to all the latches 59 in YDRVS 110S, SYDRVS 114S and RYDRVS 112S, to latch the status on line COMPOUT 58. If COMPOUT 58 is low, then the COMLATQ 40 remains at logic low. If COMPOUT 58 is high, then the COMLATQ 40 switches to logic high. At this time, if ALGOCNTRL 164 latches a logic low in the status latch in INPUT LOGIC 160 block by looking at the status of the COMPOR line 32, then a program fail condition is reached and the ALGOCNTRL 164 goes out of the page programming cycle.

During page read cycle, after page read command and the page address is issued, the reference and the data cells are placed in the voltage read mode. At this time all the B3[0:3] lines output 1111. VR0 through VR15 have VCELLR(0) through VCELLR(15). VCELLR(0) through VCELLR(15) are the voltages read out of the reference cells of the page being read. Under the control of the ALGOCNTRL 164 block 4 bits are sequentially read into the data latches DATALAT3 10, DATALAT2 11, DATALAT1 12, DATALAT0 13. For example, B3 is read by forcing the output of DATALAT3 to output B3=0. At this time B[0:3]=1110. The REFERENCE MULTIPLEXER 26 then outputs VCELLR (7) on the VROUT 55 in each of the YDRVS 110S, SYDRVS 114S and RYDRVS 112S. The output COMPOUT 58 of the VOLTAGE COMPARATOR 27 is high or low depending on whether voltage VCELLD(L) on the BLIN 35 is lower or higher relative to voltage VCELLR(7) on line VROUT 55. If COMPOUT 58 is high then a logic high is latched into DATALAT3 10 and B3=0, otherwise logic low is latched and B3=1. Next, B2 is read by forcing the output of DATALAT2 11 to output B2=0. At this time B[0:3]=110B3. B3 is the output of DATALAT3 from previous sequence. The REFERENCE MULTIPLEXER 26 then outputs VCELLR(L), depending on 110B3 on the VROUT 55 line in each of the YDRVS 110S, SYDRVS 114S and RYDRVS 112S. The output COMPOUT 58 of the VOLTAGE COMPARATOR 27 is high or low depending on whether voltage VCELLD(L) on the BLIN 35 is lower or higher-relative to voltage VRCELL(L) on line VROUT 55. If COMPOUT 58 is high then a logic high is latched into DATALAT2 11 and B2=0, otherwise logic low is latched and B2=1. In this manner, the next two sequences latch two bits into the DATALAT1 12 and DATALAT0 13.

After all 4 bit from the cell are latched into the DATALAT3 10, DATALAT2 11, DATALAT1 12, DATALAT0 13 for all the YDRVS 110S, SYDRVS 114S and RYDRVS 112S, the restore margins are checked. All latches 59 are reset. First the RESTORE LOW margin is checked. At this time, for each level 0 through 15, MARGIN RESTORE LOW Voltage VRSTRL(0) through VRSTRL(15) is placed at the VR0 through VR15 lines respectively. Depending on each outputs B3, B2, B1, B0 of the data latches DATALAT3 10, DATALAT2 11, DATALAT1 12, DATALAT0 13 within each YDRVS 110S, SYDRVS 114S and RYDRVS 112S, the REFERENCE MULTIPLEXER 26 outputs one of VRSTRL(0) through VRSTRL(15) on line VROUT 55 going into the positive input of the VOLTAGE COMPARATOR 27. ENLATCOMP 29 is strobed with the positive pulse to latch the status of the COMPOUT 58 line. If data cell read out voltage VCELLD(L) on BLIN 35 line is higher than voltage VRSTRL(L) on VROUT 55 line then COMLATQ 40 remains at logic low and COMLATQB 41 at logic high. Otherwise, COMLAT 40 is at logic high and COMLATQB 41 at logic low. At this time, if ALGOCNTRL 164 latches a logic low in the RESTORE LOW latch in INPUT LOGIC 160 block by looking at the status of the COMPORB line 33, then a restore low flag condition is reached. Next, all latches 59 are reset.

Next the RESTORE HIGH margin is checked. At this time, for each level 0 through 15, MARGIN RESTORE HIGH Voltage VRSTRH(0) through VRSTRH(15) is placed at the VR0 through VR15 lines respectively. Depending on each outputs B3, B2, B1, B0 of the data latches DATALAT3 10, DATALAT2 11, DATALAT1 12, DATALAT0 13 within each YDRVS 110S, SYDRVS 114S and RYDRVS 112S, the REFERENCE MULTIPLEXER 26 outputs one of VRSTRH(0) through VRSTRH(15) on line VROUT 55 going into the positive input of the VOLTAGE COMPARATOR 27. ENLATCOMP 29 is strobed with the positive pulse to latch the status of the COMPOUT 58 line. If data cell read out voltage VCELLD(L) on BLIN 35 line is higher than voltage VRSTRH(L) on VROUT 55 line then COMLATQ 40 remains at logic low and COMLATQB 41 at logic high. Otherwise, COMLAT 40 is at logic high and COMLATQB 41 at logic low. At this time, if ALGOCNTRL 164 latches a logic low in the RESTORE HIGH latch in INPUT LOGIC 160 block by looking at the status of the COMPOR line 32, then a restore high flag condition is reached.

At this time, 4 bits from every cell with the page being read are latched into the respective data latches within each YDRVS 110S, SYDRVS 114S and RYDRVS 112S. Next under the control of the READ CLOCK data is sequentially read on IO[0:7]. If after READ CLOCK the RED_ADD_TRUE=Y condition is true then the data is read from the addressed RYDRVS 112S otherwise data is read from the addressed YDRVS 110S or SYDRVS 114S.

Figure 19B:
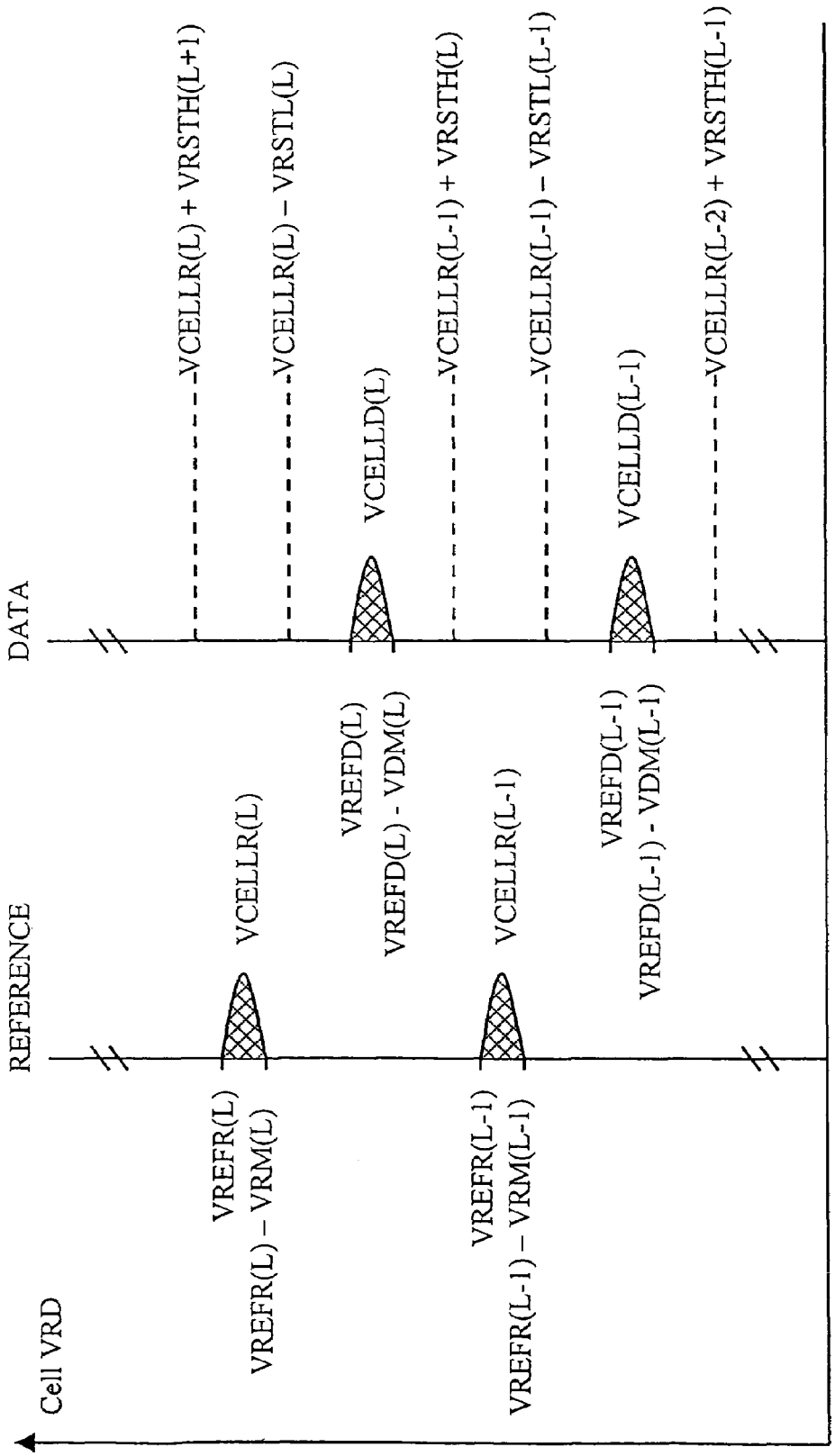
FIG. 19B shows voltage levels for program verify, margin, read, and restore for an alternative embodiment of the current invention.

FIG. 19B shows various voltages generated and used in another embodiment of the current invention for program verifying, program margin verifying, read sensing and restore high or low margin verifying. In this embodiment the program margin verify voltage VREFR(L)–VRM(L) and VREFD(L)–VDM(L) for a level L of a reference cell and a data cell respectively, are generated by the block V&IREF 172 independent of the voltages VCELLR(L) and VCELLD(L) programmed into the reference cell and data cell respectively. The voltage VRM(L) for a level L of the reference cells can be unique for each level or the same for all levels. The voltage VDM(L) for a level L of the data cells can be unique for each level or the same for all levels.

Figure 22B:
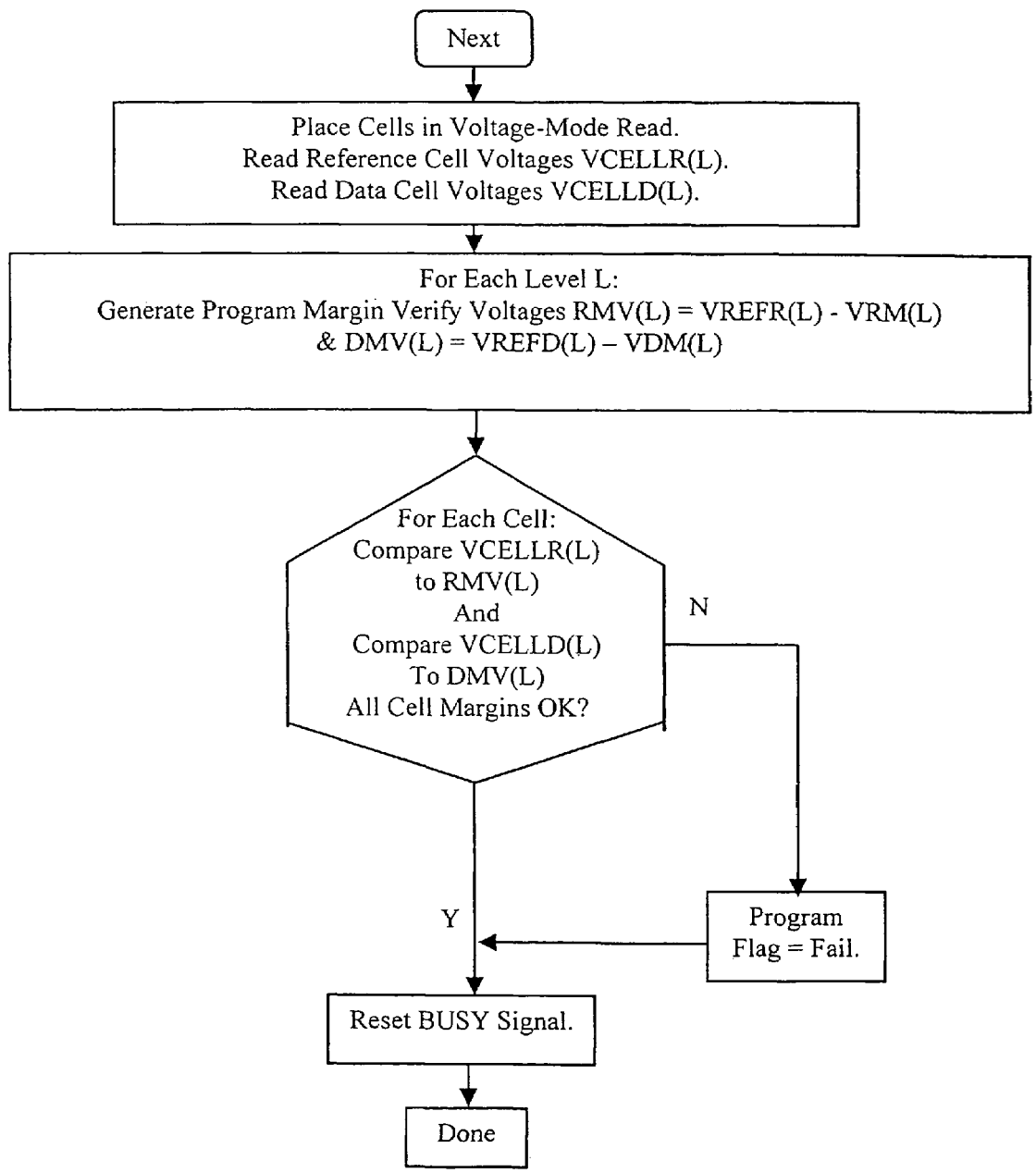
FIG. 22B shows an alternative embodiment of continuation of flow diagram after page programming begins shown in FIG. 22A.

FIG. 22B shows the portion of the flow for the page programming cycle that uses the voltages as shown in FIG. 19B. In the flow shown in FIG. 22B, only one program margin verify comparison is made instead of two as shown in FIG. 22A. This has the advantage of reducing the total time for completion of a page programming cycle.

The embodiment shown in FIG. 19B and 22B can be used in combination with the embodiment shown in FIG. 19A and 22A. As discussed in the multilevel reference system section above, the embodiment shown in FIG. 19B and 22B can be used when a selected page programs for the first time after block erase. For subsequent page programming cycles on the same page, the embodiment shown in FIG. 19A and 22A is advantageous since the VCELLR(L) values may shift between initial page programming and subsequent page programming.

In the foregoing description of various method and apparatus, it was referring to various specific embodiments. However it should be obvious to the one conversant in the art, various alternatives, modifications, and changes may be possible without departing from the spirit and the scope of the invention which is defined by the metes and bounds of the appended claims.

What is claimed is:
1. A data storage comprising:
  a plurality of regular memory arrays, each regular memory array including a plurality of regular memory cells;
  at least one regular memory decoder coupled to the regular memory arrays, each regular memory decoder configured to provide bias signals to selected ones of the plurality of regular memory cells;
  a spare memory array, each spare memory array including a plurality of spare memory cells for storing overhead data; and
  a spare memory decoder coupled to the spare memory array and configured to provide bias signals to selected ones of the plurality of spare memory cells of said spare memory array.

2. A data storage system comprising:
  a plurality of regular memory arrays, each regular memory array including a plurality of regular memory cells;
  at least one regular memory decoder coupled to the regular memory arrays, each regular memory decoder configured to provide bias signals to selected ones of the plurality of regular memory cells;
  a spare memory array, each spare memory array including a plurality of spare memory cell; and a spare memory decoder coupled to the spare memory array and configured to provide bias signals to selected ones of the plurality of spare memory cells of said spare memory array, wherein the regular memory cells are configurable to store one of $2^N$ values, where N is 2 or greater and the spare memory cells are configurable to store one of $2^N$ values.

3. A data storage system comprising:
a plurality of regular memory arrays, each regular memory array including a plurality of regular memory cells;
at least one regular memory decoder coupled to the regular memory arrays, each regular memory decoder configured to provide bias signals to selected ones of the plurality of regular memory cells;
a spare memory array, each spare memory array including a plurality of spare memory cells; and
a spare memory decoder coupled to the spare memory array and configured to provide bias signals to selected ones of the plurality of spare memory cells of said spare memory array,
wherein the regular memory cells are configurable to store one of $2^N$ values, where N is 2 or greater, and the spare memory cells are configurable to store one of two values.

4. A data storage system comprising:
a plurality of regular memory arrays, each regular memory array including a plurality of regular memory cells;
at least one regular memory decoder coupled to the regular memory arrays, each regular memory decoder configured to provide bias signals to selected ones of the plurality of regular memory cells;
a spare memory array, each spare memory array including a plurality of spare memory cells; and
a spare memory decoder coupled to the spare memory array and configured to provide bias signals to selected ones of the plurality of spare memory cells of said spare memory array,
wherein the spare memory array stores overhead data.

5. A data storage system comprising:
a plurality of regular memory arrays, each regular memory array including a plurality of memory cells;
a plurality of regular y-drivers, each regular y-driver being coupled to a corresponding one of the plurality of regular memory arrays, each regular y-driver configured to control bitlines of said memory array;
a spare memory array including a plurality of spare memory cells for storing overhead data; and
a spare y-driver coupled to the spare memory array configured to control said bitline of the spare memory array.

6. A data storage system comprising:
a plurality of regular memory arrays, each regular memory array including a plurality of memory cells;
a plurality of regular y-drivers, each regular y-driver being coupled to a corresponding one of the plurality of regular memory arrays, each regular y-driver configured to control bitlines of said memory array;
a spare memory array including a plurality of spare memory cells; and
a spare y-driver coupled to the spare memory array configured to control said bitline of the spare memory array,
wherein the regular memory cells are configurable to store one of $2^N$ values, where N is 2 or greater and the spare memory cells are configurable to store one of $2^N$ values.

7. A data storage system comprising:
a plurality of regular memory arrays, each regular memory array including a plurality of memory cells;
a plurality of regular y-drivers, each regular y-driver being coupled to a corresponding one of the plurality of regular memory arrays, each regular y-driver configured to control bitlines of said memory array;
a spare memory array including a plurality of spare memory cells; and
a spare y-driver coupled to the spare memory array configured to control said bitline of the spare memory array,
wherein the regular memory cells are configurable to store one of $2^N$ values, where N is 2 or greater, and the spare memory cells are configurable to store one of two values.

8. A data storage system comprising:
a plurality of regular memory arrays, each regular memory array including a plurality of memory cells;
a plurality of regular y-drivers, each regular y-driver being coupled to a corresponding one of the plurality of regular memory arrays, each regular y-driver configured to control bitlines of said memory array;
a spare memory array including a plurality of spare memory cells; and
a spare y-driver coupled to the spare memory array configured to control said bitline of the spare memory array,
wherein the spare memory array stores overhead data.

9. A data storage comprising:
a plurality of regular memory arrays, each regular memory array including a plurality of regular memory cells;
at least one regular memory decoder coupled to the regular memory arrays, each regular memory decoder configured to provide bias signals to selected ones of the plurality of regular memory cells;
a regular address predecoder coupled to the at least one regular memory decoder to provide selection signals to the at least one regular memory decoder in response to a first address signal;
a spare memory array, each spare memory array including a plurality of spare memory cells for storing overhead data;
a spare memory decoder coupled to the spare memory array and configured to provide bias signals to selected ones of the plurality of spare memory cells of said spare memory array; and
a spare address predecoder coupled to the spare memory decoder to provide selection signals to the spare memory decoder in response to a spare address signal.

10. A data storage system comprising:
a plurality of regular memory arrays, each regular memory array including a plurality of regular memory cells, wherein each regular memory cell is configurable to store one of $2^N$ values, where N is 2 or greater;
a plurality of spare memory arrays, each spare memory array including a plurality of spare memory cells, wherein each spare memory cells is configurable to store one of 2N values, where N is 2 or greater;
at least one memory decoder coupled to the regular and spare memory arrays, each memory decoder configured to provide bias signals to selected ones of the plurality of regular and spare memory cells; and
a reference array operatively coupled to the regular and spare memory arrays and configurable to provide reference signals used for programming and reading the selected ones of the plurality of memory cells, the spare memory array being configurable to provide at least one of said reference signals.

11. A data storage comprising:
a plurality of regular memory arrays, each regular memory array including a plurality of regular memory cells;
a spare memory array, each spare memory array including a plurality of spare memory cells for storing overhead data; and
a decoder coupled to the regular memory arrays and the spare memory array and configured to select ones of the plurality of regular and spare memory cells in response to input data bits; and
a controller coupled to the regular memory arrays and the spare memory array to apply first programming signals to said selected ones of the regular memory cells and to apply second programming signals to said selected ones of the spare memory cells.

12. A data storage comprising:
a plurality of regular memory arrays, each regular memory array including a plurality of regular memory cells;
a spare memory array, each spare memory array including a plurality of spare memory cells for storing overhead data; and
a decoder coupled to the regular memory arrays and the spare memory array and configured to select ones of the plurality of regular and spare memory cells in response to input data bits; and
a controller coupled to the regular memory arrays and the spare memory array to apply first read signals to said selected ones of the regular memory cells and to apply second read signals to said selected ones of the spare memory cells.

13. A data storage comprising:
a plurality of regular memory arrays, each regular memory array including a plurality of regular memory cells;
a spare memory array, each spare memory array including a plurality of spare memory cells for storing overhead data; and
a decoder coupled to the regular memory arrays and the spare memory array and configured to select ones of the plurality of regular and spare memory cells in response to input data bits; and
a controller coupled to the regular memory arrays and the spare memory array to apply first erase signals to said selected ones of the regular memory cells and to apply second erase signals to said selected ones of the spare memory cells.

14. A data storage comprising:
a plurality of regular memory arrays, each regular memory array including a plurality of regular memory cells;
a spare memory array, each spare memory array including a plurality of spare memory cells; and
a decoder coupled to the regular memory arrays and the spare memory array and configured to select ones of the plurality of regular and spare memory cells in response to input data bits; and
a controller coupled to the regular memory arrays and the spare memory array to apply first verify signals to said selected ones of the regular memory cells and to apply second verify signals to said selected ones of the spare memory cells.

15. A data storage system comprising:
a plurality of multidimensional segmented regular memory arrays, each regular memory array including a plurality of regular memory cells, a plurality of bit lines, a plurality of control gate lines, and at least one common line, wherein each regular memory cell is configurable to store one of 2N values, where N is 2 or greater;
a plurality of multidimensional segmented spare memory arrays, each spare memory array including a plurality of spare memory cells, a plurality of bitlines, a plurality of control gate lines, and at least one common line, wherein each spare memory cells is configurable to store one of 2N values, where N is 2 or greater;
at least one memory decoder coupled to the regular and spare memory arrays, each memory decoder configured to provide bias signals to selected ones of the plurality of regular and spare memory cells; and
a reference array operatively coupled to the regular and spare memory arrays and configurable to provide reference signals used for programming and reading the selected ones of the plurality of memory cells.

16. An integrated circuit data storage system comprising:
a plurality of regular memory cells, each regular memory cell being configurable to store one of a plurality of signal levels;
a first decoding circuit coupled to the plurality of regular memory cells and configured to generate first and second control signals based on a first set of input data bits; and
a first supply source operatively coupled to selected ones of the plurality of regular memory cells based on the first control signal from the decoding circuit, the first supply source configured to provide first programming signals based on the second control signal,
a plurality of spare memory cells, each spare memory cell being configurable to store one of a plurality of signal levels;
a second decoding circuit coupled to the plurality of spare memory cells and configured to generate third and fourth control signals based on a second set of input data bits;
a second supply source operatively coupled to selected ones of the plurality of spare memory cells based on the third control signal from the second decoding circuit, the second supply source configured to provide second programming signals based on the fourth control signal,
wherein the selected regular and spare memory cells are programmed in accordance with the programming signals from the first and second supply sources, respectively.

17. A multilevel memory system comprising:
a multilevel integrated circuit memory unit that includes:
a plurality of regular memory cells, each regular memory cell being programmable to one of a plurality of levels in response to a first set of programming signals,
a first decoding circuit coupled to the plurality of regular memory cells and configured to generate first and second control signals based on a first address,
a first supply source coupled to selected ones of the plurality of regular memory cells based on the first control signal, the first supply source configured to provide the first set of programming signals based on the second control signal, a plurality of spare memory cells, each spare memory cell being programmable to one of a plurality of levels in response to a second set of programming signals, a second decoding circuit coupled to the plurality of spare memory cells and configured to generate third and fourth control signals based on a second address, and a second supply source coupled to selected ones of the plurality of spare memory cells based on the third control signal, the second supply configured to provide the second set of programming signals based on the fourth control signal; and a microcontroller coupled to the memory unit and operative to control operation of the memory unit.

18. A data storage system comprising:

a plurality of segmented regular memory arrays, each regular memory array including a plurality of regular memory cells, a plurality of bit lines, a plurality of control gate lines, and at least one common line, wherein each regular memory cell is configurable to store one of $2^N$ values where N is 2 or greater;

a plurality of segmented spare memory arrays, each spare memory array including a plurality of spare memory cells, a plurality of bitlines, a plurality of control gate lines, at least one common line, wherein each spare memory cell is configurable to store one of $2^M$ power values, where M is 2 or greater;

at least one memory decoder coupled to the regular and spare memory arrays, each memory decoder configured to provide bias signals to selected ones of the pluralities of regular and spare memory cells; and a reference array operatively coupled to the regular and spare memory arrays and configurable to provide reference signals used for programming and reading the selected ones of the pluralities of regular and spare memory cells.

* * * * *